(12) United States Patent
Oohashi

(10) Patent No.: US 9,707,749 B2
(45) Date of Patent: Jul. 18, 2017

(54) LITHOGRAPHIC PRINTING PLATE PRECURSOR AND PLATE MAKING METHOD THEREOF

(75) Inventor: Hidekazu Oohashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 1501 days.

(21) Appl. No.: 13/406,286

(22) Filed: Feb. 27, 2012

(65) Prior Publication Data
US 2012/0216693 A1 Aug. 30, 2012

(30) Foreign Application Priority Data

Feb. 28, 2011 (JP) ................................. 2011-043394

(51) Int. Cl.
*B41C 1/10* (2006.01)
*G03F 7/09* (2006.01)
(Continued)

(52) U.S. Cl.
CPC ............ *B41C 1/1016* (2013.01); *G03F 7/027* (2013.01); *G03F 7/0388* (2013.01); *G03F 7/092* (2013.01); *G03F 7/322* (2013.01); *B41C 2201/02* (2013.01); *B41C 2201/06* (2013.01); *B41C 2201/10* (2013.01); *B41C 2201/14* (2013.01);
(Continued)

(58) Field of Classification Search
CPC .............. B41C 1/1016; B41C 2201/02; B41C 2210/04; B41C 2201/14; B41C 2210/24; B41C 2201/10; B41C 2210/06; B41C 2201/06; B41C 2210/10; B41C 2210/22; B41C 1/1008; B41C 2201/04; B41C 2210/26
USPC ... 430/66, 56, 58.7, 58.05, 59.5, 60, 123.42, 430/64, 133, 132, 124.1, 58.75, 65, 78, 430/123.41, 131, 134, 58.2, 59.6, 67, 430/108.1, 123.4, 125.3, 302, 57.3, 58.65, 430/59.1, 59.4, 69, 96, 110.3, 111.4, 48, 430/57.2, 58.35, 58.85, 59.2, 100, 119.71, 430/123.43, 123.51, 126.1
See application file for complete search history.

(56) References Cited

U.S. PATENT DOCUMENTS

2001/0018159 A1 8/2001 Maemoto
2003/0064318 A1 4/2003 Huang et al.
(Continued)

FOREIGN PATENT DOCUMENTS

JP 2001-277740 A 10/2001
JP 2001-277742 A 10/2001
(Continued)

OTHER PUBLICATIONS

Fujifilm; Jun. 30, 2009; Material Safety Data Sheet, FN-6 Plate Finisher Gum; p. 3.*
European Search Report issued in European Patent Application No. 12157291.1 on May 8, 2012.
XP002674589 Database WPI Week 200503 Thomson Scientific, London, GB; AN 2005-022969.

*Primary Examiner* — Blake A Tankersley
*Assistant Examiner* — Michael Robinson
(74) *Attorney, Agent, or Firm* — Birch, Stewart, Kolasch & Birch, LLP

(57) ABSTRACT

The invention is directed to a lithographic printing plate precursor including, in the following order: a support; an image-recording layer containing a radical polymerizable compound and a radical polymerization initiator; and a protective layer containing a star polymer, and the star polymer is preferably a polymer in which from 3 to 10 polymer chains are branched from a central skeleton.

7 Claims, 3 Drawing Sheets

(51) Int. Cl.
  *G03F 7/027*    (2006.01)
  *G03F 7/038*    (2006.01)
  *G03F 7/32*     (2006.01)

(52) U.S. Cl.
  CPC ...... *B41C 2210/04* (2013.01); *B41C 2210/06* (2013.01); *B41C 2210/10* (2013.01); *B41C 2210/22* (2013.01); *B41C 2210/24* (2013.01); *Y10T 428/31938* (2015.04)

(56) References Cited

U.S. PATENT DOCUMENTS

| | | | |
|---|---|---|---|
| 2004/0089726 A1* | 5/2004 | Yamazaki | G06K 19/06196 235/493 |
| 2005/0069811 A1 | 3/2005 | Mitsumoto et al. | |
| 2010/0137180 A1* | 6/2010 | Maessen et al. | 510/171 |

FOREIGN PATENT DOCUMENTS

| | | | |
|---|---|---|---|
| JP | 2004-317543 A | | 11/2004 |
| JP | 2004317543 A | * | 11/2004 |
| JP | 2005-119273 A | | 5/2005 |
| JP | 2006-53316 A | | 2/2006 |
| JP | 2006-259137 A | | 9/2006 |
| JP | 2007249036 A | * | 9/2007 |
| JP | 2007-298645 A | | 11/2007 |

* cited by examiner

LITHOGRAPHIC PRINTING PLATE PRECURSOR AND PLATE MAKING METHOD THEREOF

FIELD OF THE INVENTION

The present invention relates to a lithographic printing plate precursor and a plate making method using the same. More particularly, it relates to a lithographic printing plate precursor capable of undergoing a direct plate making by image exposure with laser and a plate making method comprising exposing and developing the lithographic printing plate precursor.

BACKGROUND OF THE INVENTION

In general, a lithographic printing plate is composed of an oleophilic image area accepting ink and a hydrophilic non-image area accepting dampening water in the process of printing. Lithographic printing is a printing method utilizing the nature of water and oily ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area and then transferring the ink to a printing material, for example, paper.

In order to produce the lithographic printing plate, a lithographic printing plate precursor (PS plate) comprising a hydrophilic support having provided thereon an oleophilic photosensitive resin layer (image-recording layer) is used. Specifically, the PS plate is exposed through a mask, for example, a lith film, and then subjected to development processing, for example, with an alkaline developer to remove the unnecessary image-recording layer corresponding to the non-image area by dissolving while leaving the image-recording layer corresponding to the image area, thereby obtaining the lithographic printing plate.

Due to the recent progress in the technical field, nowadays the lithographic printing plate can be obtained by a CTP (computer-to-plate) technology. Specifically, a lithographic printing plate precursor is directly subjected to scanning exposure using laser or laser diode without using a lith film and developed to obtain a lithographic printing plate.

With the progress described above, the issue on the lithographic printing plate precursor has transferred to improvements, for example, in image-forming property corresponding to the CTP technology, printing property or physical property. Also, with the increasing concern about global environment, as another issue on the lithographic printing plate precursor, an environmental problem on waste liquid discharged accompanying the wet treatment, for example, development processing comes to the front.

As the development method, a method of developing with a highly alkaline developer is known. However, in response to the environmental problem, simplification of development or plate making or non-processing has been pursued. As one method of simple plate making, a method referred to as an "on-press development" is practiced. Specifically, according to the method after exposure of a lithographic printing plate precursor, the exposed lithographic printing plate precursor is mounted as it is on a printing machine without conducting conventional development and removal of the unnecessary area of image-recording layer is performed at an early stage of printing step.

Also, as a method of simple development, a method referred to as a "gum development" is practiced wherein the removal of the unnecessary area of image-recording layer is performed using not a conventional highly alkaline developer but a finisher or gum solution of near-neutral pH.

In the simplification of plate making operation as described above, a system using a lithographic printing plate precursor capable of being handled in a bright room or under a yellow lump and a light source is preferred from the standpoint of workability. Thus, as the light source, a semiconductor laser emitting an infrared ray having a wavelength of 760 to 1,200 or a solid laser, for example, YAG laser, is used. An UV laser can also be used.

Of the lithographic printing plate precursors, a lithographic printing plate precursor using a radical polymerizable image-recording layer is known. In the lithographic printing plate precursor using a radical polymerizable image-recording layer, an overcoat layer or protective layer which is provided with an oxygen blocking property for preventing inhibition of radical polymerization due to oxygen and a protective function for preventing the occurrence of scratches during transportation or handling is used.

As the lithographic printing plate precursor capable of undergoing on-press development, for instance, a lithographic printing plate precursor having provided on a hydrophilic support, an image-recording layer (heat-sensitive layer) containing microcapsules having a polymerizable compound encapsulated therein and an overcoat layer containing a hydrophilic resin, for example, polyvinyl alcohol is described in JP-A-2001-277740 (the term "JP-A" as used herein means an "unexamined published Japanese patent application") and JP-A-2001-277742. A lithographic printing plate precursor capable of undergoing on-press development having provided on a support, an image-recording layer containing a polymerizable compound and a graft polymer having a polyethylene oxide chain in its side chain or a block polymer having a polyethylene oxide block and a protective layer containing polyvinyl alcohol is described in U.S. Patent Publication No. 2003/0064318. Further, a lithographic printing plate precursor having provided on a hydrophilic support, an image-recording layer (heat-sensitive layer) containing microcapsules having a polymerizable compound encapsulated therein and an overcoat layer containing a hydrophilic resin, for example, polyvinyl alcohol and an inorganic stratiform compound is described in JP-A-2005-119273. However, the presence of the overcoat layer or protective layer causes decrease in on-press development speed. Also, the hydrophilic resin may deposit on a printing machine in some cases depending on the kind of hydrophilic resin.

On the other hand, as for the lithographic printing plate precursor capable of undergoing development with a developer, for example, a protective layer containing polyvinyl alcohol and a cation-modified polyvinyl alcohol is described in JP-A-2007-298645. A protective layer containing a modified polyvinyl alcohol having an acid group or a salt thereof in its molecule is described in JP-A-2006-53316 and JP-A-2006-259137. Polyvinyl alcohol is ordinarily used in the protective layer, however, when polyvinyl alcohol having high saponification degree is used in order to improve the oxygen blocking property, the occurrence of deposit (development scum) in the developer becomes marked.

SUMMARY OF THE INVENTION

An object of the present invention is to provide a lithographic printing plate precursor which exhibits high development property, does not generate development scum and provides good printing durability and a plate making method of a lithographic printing plate using the lithographic printing plate precursor.

As a result of the intensive investigations for achieving the object described above, the inventors have found that it is effective to use a star polymer in a protective layer to complete the invention. The present invention includes the following items.

1. A lithographic printing plate precursor comprising a support, an image-recording layer containing a radical polymerizable compound and a radical polymerization initiator, and a protective layer containing a star polymer in this order.

2. The lithographic printing plate precursor as recited in the item 1, wherein the star polymer is a polymer in which from 3 to 10 polymer chains are branched from a central skeleton.

3. The lithographic printing plate precursor as recited in the item 1 or 2, wherein the star polymer is a polymer in which from 3 to 10 polymer chains are branched from a central skeleton via sulfide bonds respectively.

4. The lithographic printing plate precursor as recited in the item 3, wherein the star polymer is a polymer in which from 3 to 10 polymer chains are branched from a central skeleton via sulfide bonds respectively and which is obtained by polymerization of an ethylenically unsaturated monomer in the presence of a multifunctional thiol.

5. The lithographic printing plate precursor as recited in any one of the items 2 to 4, wherein the star polymer has a hydrophilic group in the polymer chain thereof.

6. The lithographic printing plate precursor as recited in any one of the items 1 to 5, wherein the protective layer contains an inorganic stratiform compound.

7. The lithographic printing plate precursor as recited in any one of the items 1 to 6, which is capable of printing after image exposure with laser, by supplying at least any of printing ink and dampening water on a printing machine to remove an unexposed area of the image-recording layer.

8. The lithographic printing plate precursor as recited in any one of the items 1 to 6, which is capable of removing after image exposure with laser, an unexposed area of the image-recording layer with a developer having pH from 2 to 14.

9. The lithographic printing plate precursor as recited in the item 8, which is capable of removing after image exposure with laser, the protective layer and an unexposed area of the image-recording layer with one bath of a developer having pH from 2 to 14.

10. A plate making method of a lithographic printing plate precursor comprising exposing imagewise the lithographic printing plate precursor as recited in the item 7 with laser, and then supplying at least any of printing ink and dampening water on a printing machine to remove an unexposed area of the image-recording layer.

11. A plate making method of a lithographic printing plate precursor comprising exposing imagewise the lithographic printing plate precursor as recited in the item 8 with laser, and then removing an unexposed area of the image-recording layer with a developer having pH from 2 to 14.

12. A plate making method of a lithographic printing plate precursor comprising exposing imagewise the lithographic printing plate precursor as recited in the item 9 with laser, and then removing the protective layer and an unexposed area of the image-recording layer with one bath of a developer having pH from 2 to 14.

According to the present invention, a lithographic printing plate precursor which exhibits high development property, does not generate development scum and provides good printing durability and a plate making method using the lithographic printing plate precursor can be provided.

DESCRIPTION OF REFERENCE NUMERALS AND SIGNS

Figure 1:
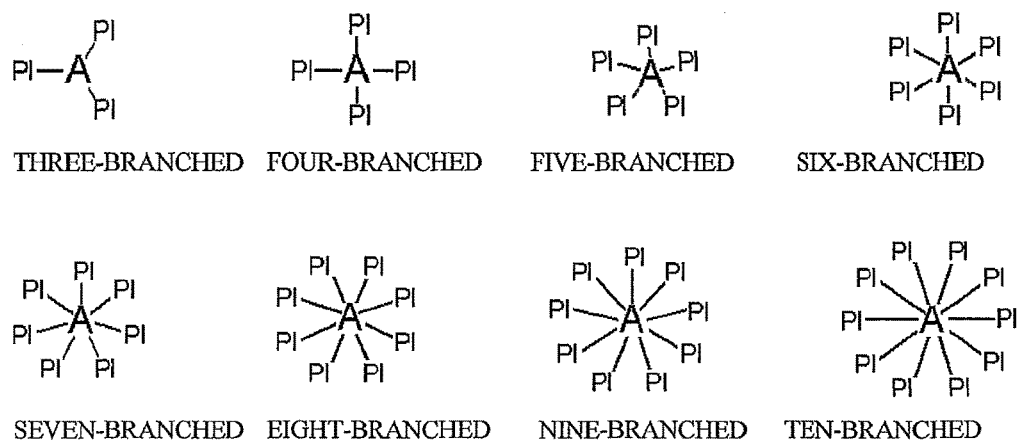
FIG. 1 is a view schematically showing a star polymer according to the invention.

61: Rotating brush roller
62: Backing roller
63: Transport roller
64: Transport guide plate
65: Spray pipe
66: Pipe line
67: Filter
68: Plate supply table
69: Plate discharge table
70: Developer tank
71: Circulating pump
72: Lithographic printing plate precursor
11: Transporting path
100: Automatic development processor
200: Pre-heating unit
300: Developing unit
400: Drying unit
202: Machine casing
204: Heating unit
208: Heating chamber
210: Skewer roller
212: Transporting inlet
214: Heater
216: Circulation fan
218: Transporting outlet
304: Insertion roller pair
306: Processing tank
306a: Processing tank margin
308: Developing tank (filled with a developer)
310: Outer panel
312: Slit type insertion slot
316: Submerged roller pair
318: Carrying-out roller pair
322: Brush roller pair
324: Shielding cover
326: Brush roller pair
330: Spray pipe
(*which is constructed to supply a developer in the developing tank 308 sucked by a pump (not shown) and the developer is ejected from the spray pipe 330 in the developing tank 308)
334: Slit type path-through slot
336: Liquid temperature sensor
338: Liquid level meter
332: Partition board
342: Guide member
344: Guide roller
402: Support roller
404: Discharge slot 406: Transport roller pair
408: Transport roller pair
410, 412: Duct
414: Slit hole
50: External tank (developer storage)
52: Upper limit liquid level meter
53: Lower limit liquid level meter
54: Filter unit
55: Developer supply pump
C1: First circulation pipeline
C2: Second circulation pipeline
71: Water tank for replenishment (water storage)
72: Water-replenishing pump
C3: Circulation pipeline for water replenishment

DETAILED DESCRIPTION OF THE INVENTION

[Lithographic Printing Plate Precursor]

The lithographic printing plate precursor according to the invention is a lithographic printing plate precursor comprising a support, an image-recording layer containing a radical polymerizable compound and a radical polymerization initiator and a protective layer containing a star polymer in this order. The term "in this order" means that the image-recording layer is provided between the support and the protective layer, but does not exclude the possibility that any other layer(s) is provided between the support and the image-recording layer and/or between the image-recording layer and the protective layer. The invention will be described in detail below.

[Protective Layer]

The protective layer for use in the lithographic printing plate precursor according to the invention contains (A) a star polymer and may contain (B) other optional components.

(A) Star Polymer

The star polymer for use in the invention is a polymer having a main chain structure as shown in the schematic view of FIG. 1. Specifically, it has a structure in which one terminal of polymer chain P1 is connected to central skeleton A.

The star polymer for use in the invention may be any star polymer as far as it has the structure described above. The star polymer includes a star polymer obtained by a coupling method or an anion growing method described in *Shin Jikken Kagaku Koza, Kobunshi Kagaku I* (*New Experimental Chemistry Course, Polymer Chemistry I*), pages 208 to 210, edited by The Chemical Society of Japan, a star polymer obtained by a synthesis method wherein a polymerization is conducted under light irradiation using a compound having a dithiocarbamate group and/or a compound having xanthate group as an initiator described in JP-A-10-279867, and a star polymer obtained by a conventional radical polymerization using a multifunctional thiol as a chain transfer agent.

The star polymer according to the invention is a polymer in which polymer chains are branched from a central skeleton via sulfide bonds and which is obtained by polymerization of an ethylenically unsaturated monomer in the presence of a multifunctional thiol from the standpoint of ease in synthesis and performances of the polymer obtained. Specifically, a polymer having a hub portion which is a residue of a three or higher functional thiol as a central skeleton is preferred. In the idealized structure, a main chain of an addition polymer extends from each thio part of the hub portion and thus, three or more main chains extend from the thio parts. Specifically, the central skeleton A has preferably a structure represented by formula (1) shown below.

$$A_1\!-\!(\!S\!-\!)_n \qquad (1)$$

In formula (1), $A_1$ represents a trivalent or higher valent organic group, and n represents an integer of 3 or more. Specific examples of $A_1$ include trivalent or higher valent organic groups having structures shown below and trivalent or higher valent organic groups made by the combination of two or more of the structures shown below. n is preferably an integer from 3 to 10, more preferably an integer from 3 to 8, and particularly preferably an integer from 3 to 6.

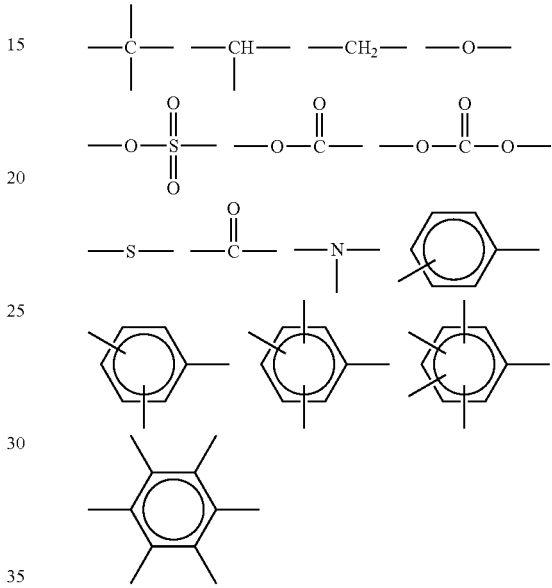

Polyvalent naphthalene, Polyvalent anthracene

As the multifunctional thiol for use in the preparation of the star polymer according to the invention, any compound having a plural number of thiol groups in its molecule is suitably used. A multifunctional thiol having from 3 to 10 functional groups is preferred, a multifunctional thiol having from 3 to 8 functional groups is preferred, and multifunctional thiol having from 3 to 6 functional groups is particularly preferred. The multifunctional thiol includes Compound A to Compound F described below.

(Compound A)

Compound A is a compound obtained by a method of reacting a sulfuration agent, for example, thiourea, potassium thiocyanate or thioacetic acid with an electrophilic agent, for example, a halide or a sulfonic acid ester of an alcohol, followed by various treatments. Specific examples of Compound A include compounds set forth below, but the invention should not be construed as being limited thereto.

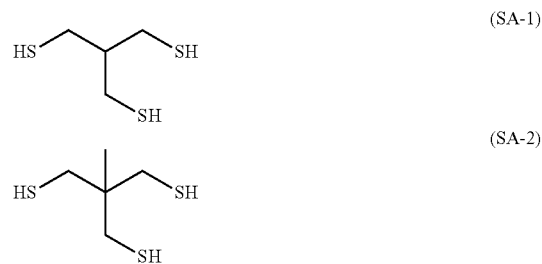

-continued (SA-3)
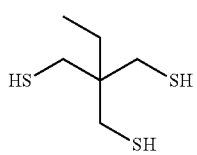

(SA-4)
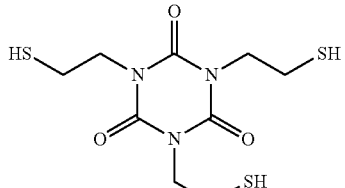

(SA-5)
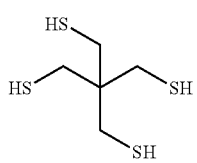

(SA-6)
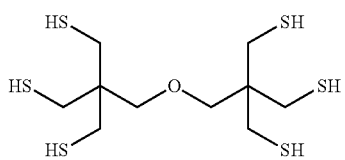

(SA-7)
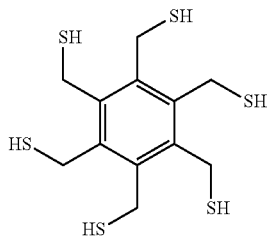

(SA-8)
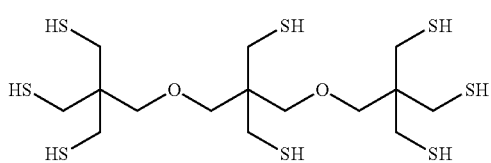

(Compound B)

Compound B is a compound obtained by a dehydration condensation reaction between a multifunctional alcohol and a carboxylic acid having a thiol group. Among them, a compound obtained by a dehydration condensation reaction between a multifunctional alcohol having from 3 to 10 functional groups and a mono-carboxylic acid having one thiol group is preferred.

Specific examples of the multifunctional alcohol include cyclohexanetriol (3), glycerol (3), 2-hydroxymethyl-1,3-propanediol (3), 1,1,1-tris(hydroxymethyl)ethane (3), 1,2,4-butanetriol (3), trimethylolpropane (3), 1,2,3-trihydroxyhexane (3), 1,2,6-trihydroxyhexane (3), 1,2,3-heptanetriol (3), pyrogallol (3), 1,2,4-benzenetriol (3), phloroglucinol (3), 1,1,1-tris(4-hydroxyphenyl)ethane (3), 1,3,5-tris(2-hydroxyethyl)isocyanurate (3), pentaerythritol (4), threitol (4), erythritol (4), xylulose (4), ribulose (4), quebrachitol (5), adonitol (5), arabitol (5), xylitol (5), catechin (5), epicatechin (5), inositol (6), sorbitol (6), mannitol (6), iditol (6), dulcitol (6), dipentaerythritol (6) and tripentaerythritol (8). The number shown in parentheses above denotes a number of the functional groups.

Of the multifunctional alcohols, cyclohexanetriol (3), glycerol (3), 2-hydroxymethyl-1,3-propanediol (3), 1,1,1-tris(hydroxymethyl)ethane (3), trimethylolpropane (3), phloroglucinol (3), 1,1,1-tris(4-hydroxyphenyl)ethane (3), 1,3,5-tris(2-hydroxyethyl)isocyanurate (3), pentaerythritol (4), catechin (5), epicatechin (5), inositol (6), dipentaerythritol (6) and tripentaerythritol (8) are preferred, cyclohexanetriol (3), 2-hydroxymethyl-1,3-propanediol (3), 1,1,1-tris(hydroxymethyl)ethane (3), trimethylolpropane (3), phloroglucinol (3), 1,1,1-tris(4-hydroxyphenyl)ethane (3), 1,3,5-tris(2-hydroxyethyl)isocyanurate (3), pentaerythritol (4), catechin (5), epicatechin (5), inositol (6), dipentaerythritol (6) and tripentaerythritol (8) are more preferred, and 1,3,5-tris(2-hydroxyethyl)isocyanurate (3), pentaerythritol (4), catechin (5), epicatechin (5), inositol (6), dipentaerythritol (6) and tripentaerythritol (8) are particularly preferred.

Specific examples of the mono-carboxylic acid having one thiol group include mercaptoacetic acid, 3-mercaptopropionic acid, 2-mercaptopropionic acid, 3-mercaptoisobutyric acid, N-acetylcysteine, N-(2-mercaptopropionyl)glycine and thiosalicylic acid.

Of the compounds, mercaptoacetic acid, 3-mercaptopropionic acid, 2-mercaptopropionic acid, 3-mercaptoisobutyric acid, N-acetylcysteine and N-(2-mercaptopropionyl)glycine are preferred, 3-mercaptopropionic acid, 2-mercaptopropionic acid, 3-mercaptoisobutyric acid, N-acetylcysteine and N-(2-mercaptopropionyl)glycine are more preferred, and 3-mercaptopropionic acid, 3-mercaptoisobutyric acid, N-acetylcysteine and N-(2-mercaptopropionyl)glycine are particularly preferred.

Specific examples of Compound B include compounds set forth below, but the invention should not be construed as being limited thereto.

TABLE 1

| | Carboxylic Acid Having Thiol Group | | | |
| --- | --- | --- | --- | --- |
| Multifunctional Alcohol | Mercaptoacetic Acid | 3-Mercaptopropionic Acid | 2-Mercaptopropionic Acid | 3-Mercaptoisobutyric Acid |
| Cyclohexanetriol (3) | SB-1 | SB-2 | SB-3 | SB-4 |
| Glycerol (3) | SB-8 | SB-9 | SB-10 | SB-11 |
| 2-Hydroxymethyl-1,3-propanediol (3) | SB-15 | SB-16 | SB-17 | SB-18 |
| 1,1,1-Tris(hydroxymethyl)ethane (3) | SB-22 | SB-23 | SB-24 | SB-25 |
| 1,2,4-Butanetriol (3) | SB-29 | SB-30 | SB-31 | SB-32 |
| Trimethylolpropane (3) | SB-36 | SB-37 | SB-38 | SB-39 |
| 1,2,3-Trihydroxyhexane (3) | SB-43 | SB-44 | SB-45 | SB-46 |

TABLE 1-continued

| | | | | |
|---|---|---|---|---|
| 1,2,6-Trihydroxyhexane (3) | SB-50 | SB-51 | SB-52 | SB-53 |
| 1,2,3-Heptanetriol (3) | SB-57 | SB-58 | SB-59 | SB-60 |
| Pyrogallol (3) | SB-64 | SB-65 | SB-66 | SB-67 |
| 1,2,4-Benzenetriol (3) | SB-71 | SB-72 | SB-73 | SB-74 |
| Phloroglucinol (3) | SB-78 | SB-79 | SB-80 | SB-81 |
| 1,1,1-Tris(4-hydroxyphenyl)ethane (3) | SB-85 | SB-86 | SB-87 | SB-88 |
| 1,3,5-Tris(2-hydroxyethyl)isocyanurate (3) | SB-92 | SB-93 | SB-94 | SB-95 |
| Pentaerythritol (4) | SB-99 | SB-100 | SB-101 | SB-102 |
| Threitol (4) | SB-106 | SB-107 | SB-108 | SB-109 |
| Erythritol (4) | SB-113 | SB-114 | SB-115 | SB-116 |
| Xylulose (4) | SB-120 | SB-121 | SB-122 | SB-123 |
| Quebrachitol (5) | SB-127 | SB-128 | SB-129 | SB-130 |
| Adonitol (5) | SB-134 | SB-135 | SB-136 | SB-137 |
| Arabitol (5) | SB-141 | SB-142 | SB-143 | SB-144 |
| Xylitol (5) | SB-148 | SB-149 | SB-150 | SB-151 |
| Catechin (5) | SB-155 | SB-156 | SB-157 | SB-158 |
| Epicatechine (5) | SB-162 | SB-163 | SB-164 | SB-165 |
| Inositol (6) | SB-169 | SB-170 | SB-171 | SB-172 |
| Sorbitol (6) | SB-176 | SB-177 | SB-178 | SB-179 |
| Mannitol (6) | SB-183 | SB-184 | SB-185 | SB-186 |
| Iditol (6) | SB-190 | SB-191 | SB-192 | SB-193 |
| Dulcitol (6) | SB-197 | SB-198 | SB-199 | SB-200 |
| Dipentaerythritol (6) | SB-204 | SB-205 | SB-206 | SB-207 |
| Tripentaerythritol (8) | SB-211 | SB-212 | SB-213 | SB-214 |

| | Carboxylic Acid Having Thiol Group | | |
|---|---|---|---|
| Multifunctional Alcohol | N-Acetylcysteine | N-(2-Mercaptopropionyl)glycine | Thiosalicylic Acid |
| Cyclohexanetriol (3) | SB-5 | SB-6 | SB-7 |
| Glycerol (3) | SB-12 | SB-13 | SB-14 |
| 2-Hydroxymethyl-1,3-propanediol (3) | SB-19 | SB-20 | SB-21 |
| 1,1,1-Tris(hydroxymethyl)ethane (3) | SB-26 | SB-27 | SB-28 |
| 1,2,4-Butanetriol (3) | SB-33 | SB-34 | SB-35 |
| Trimethylolpropane (3) | SB-40 | SB-41 | SB-42 |
| 1,2,3-Trihydroxyhexane (3) | SB-47 | SB-48 | SB-49 |
| 1,2,6-Trihydroxyhexane (3) | SB-54 | SB-55 | SB-56 |
| 1,2,3-Heptanetriol (3) | SB-61 | SB-62 | SB-63 |
| Pyrogallol (3) | SB-68 | SB-69 | SB-70 |
| 1,2,4-Benzenetriol (3) | SB-75 | SB-76 | SB-77 |
| Phloroglucinol (3) | SB-82 | SB-83 | SB-84 |
| 1,1,1-Tris(4-hydroxyphenyl)ethane (3) | SB-89 | SB-90 | SB-91 |
| 1,3,5-Tris(2-hydroxyethyl)isocyanurate (3) | SB-96 | SB-97 | SB-98 |
| Pentaerythritol (4) | SB-103 | SB-104 | SB-105 |
| Threitol (4) | SB-110 | SB-111 | SB-112 |
| Erythritol (4) | SB-117 | SB-118 | SB-119 |
| Xylulose (4) | SB-124 | SB-125 | SB-126 |
| Quebrachitol (5) | SB-131 | SB-132 | SB-133 |
| Adonitol (5) | SB-138 | SB-139 | SB-140 |
| Arabitol (5) | SB-145 | SB-146 | SB-147 |
| Xylitol (5) | SB-152 | SB-153 | SB-154 |
| Catechin (5) | SB-159 | SB-160 | SB-161 |
| Epicatechine (5) | SB-166 | SB-167 | SB-168 |
| Inositol (6) | SB-173 | SB-174 | SB-175 |
| Sorbitol (6) | SB-180 | SB-181 | SB-182 |
| Mannitol (6) | SB-187 | SB-188 | SB-189 |
| Iditol (6) | SB-194 | SB-195 | SB-196 |
| Dulcitol (6) | SB-201 | SB-202 | SB-203 |
| Dipentaerythritol (6) | SB-208 | SB-209 | SB-210 |
| Tripentaerythritol (8) | SB-215 | SB-216 | SB-217 |

Of the specific examples shown in Table 1, SB-1 to SB-34, SB-36 to SB-48, SB-50 to SB-55, SB-57 to SB-62, SB-64 to SB-69, SB-71 to SB-76, SB-78 to SB-111, SB-113 to SB-118, SB-120 to SB-125, SB-127 to SB-132, SB-134 to SB-139, SB-141 to SB-146, SB-148 to SB-153, SB-155 to SB-181, SB-183 to SB-188, SB-190 to SB-195, SB-197 to SB-202 and SB-204 to SB-217 are preferred, SB-1 to SB-6, SB-9 to SB-13, SB-15 to SB-20, SB-22 to SB-27, SB-36 to SB-41, SB-78 to SB-83, SB-85 to SB-90, SB-92 to SB-97, SB-99 to SB-104, SB-155 to SB-160, SB-162 to SB-167, SB-169 to SB-174, SB-204 to SB-209 and SB-211 to SB-216 are more preferred, and SB-2 to SB-6, SB-16 to SB-20, SB-23 to SB-27, SB-37 to SB-41, SB-79 to SB-83, SB-86 to SB-90, SB-93 to SB-97, SB-100 to SB-104, SB-156 to SB-160, SB-163 to SB-167, SB-170 to SB-174, SB-205 to SB-209 and SB-212 to SB-216 are particularly preferred.

Since the multifunctional thiols synthesized by these compounds have a long distance between the thiol groups and a small steric hindrance, the desired star structure can be formed.

(Compound C)

Compound C is a compound obtained by a dehydration condensation reaction between a multifunctional amine and a carboxylic acid having a thiol group. Among them, a compound obtained by a condensation reaction between a multifunctional amine having from 3 to 10 functional groups and a mono-carboxylic acid having one thiol group is preferred.

Specific examples of the multifunctional amine include diethylenetriamine (3), N-(2-aminoethyl)-1,3-propanediamine (3), N-(3-aminopropyl)-1,3-propanediamine (3), spermidine (3), bis(hexamethylene)triamine (3), 4-(aminomethyl)-1,8-octanediamine (3), triethylenetetramine (4), 1,4,7,11-tetraazaundecane (4), N,N'-bis(3-aminopropyl)ethylenediamine (4), N,N'-bis(2-aminoethyl)-1,3-propanediamine (4), N,N'-bis(3-aminopropyl)-1,3-propanediamine (4), spermine (4), tris(2-aminoethyl)amine (3), tetraethylenepentamine (5), pentaethylenehexamine (6), 1,4,7-triazacyclononane (3), 1,5,9-triazacyclododecane (3), cyclene (4), 1,4,8,11-tetraazacyclotetradecane (4), 1,4,8,12-tetraazacyclopentadecane (4), hexacyclene (6), 3,3'-diaminobenzidine (4) and 1,2,4,5-benzenetetramine (4).

Of the multifunctional amines, 4-(aminomethyl)-1,8-octanediamine (3), triethylenetetramine (4), 1,4,7,11-tetraazaundecane (4), N,N'-bis(3-aminopropyl)ethylenediamine (4), N,N'-bis(2-aminoethyl)-1,3-propanediamine (4), N,N'-bis(3-aminopropyl)-1,3-propanediamine (4), spermine (4), tris(2-aminoethyl)amine (3), tetraethylenepentamine (5), pentaethylenehexamine (6), cyclene (4) and hexacyclene (6) are preferred, 4-(aminomethyl)-1,8-octanediamine (3), tris(2-aminoethyl)amine (3), tetraethylenepentamine (5), pentaethylenehexamine (6), cyclene (4) and hexacyclene (6) are more preferred, and tetraethylenepentamine (5), pentaethylenehexamine (6), cyclene (4) and hexacyclene (6) are particularly preferred.

Specific examples of the carboxylic acid having a thiol group include the carboxylic acids described for Compound B above. Specific examples of Compound C include compounds set forth below, but the invention should not be construed as being limited thereto.

TABLE 2

| Multifunctional Amine | Carboxylic Acid Having Thiol Group | | | |
| --- | --- | --- | --- | --- |
| | Mercaptoacetic Acid | 3-Mercaptopropionic Acid | 2-Mercaptopropionic Acid | 3-Mercaptoisobutyric Acid |
| Diethylenetriamine (3) | SC-1 | SC-2 | SC-3 | SC-4 |
| N-(2-Aminoethyl)-1,3-propanediamine (3) | SC-8 | SC-9 | SC-10 | SC-11 |
| N-(3-Aminopropyl)-1,3-propanediamine (3) | SC-15 | SC-16 | SC-17 | SC-18 |
| Spermidine (3) | SC-22 | SC-23 | SC-24 | SC-25 |
| Bis(hexamethylene)triamine (3) | SC-29 | SC-30 | SC-31 | SC-32 |
| 4-(Aminomethyl)-1,8-octanediamine (3) | SC-36 | SC-37 | SC-38 | SC-39 |
| Triethylenetetramine (4) | SC-43 | SC-44 | SC-45 | SC-46 |
| 1,4,7,11-Tetraazaundecane (4) | SC-50 | SC-51 | SC-52 | SC-53 |
| N,N'-Bis(3-aminopropyl)ethylenediamine (4) | SC-57 | SC-58 | SC-59 | SC-60 |
| N,N'-Bis(2-aminoethyl)-1,3-propanediamine (4) | SC-64 | SC-65 | SC-66 | SC-67 |
| N,N'-Bis(3-aminopropyl)-1,3-propanediamine (4) | SC-71 | SC-72 | SC-73 | SC-74 |
| Spermine (4) | SC-78 | SC-79 | SC-80 | SC-81 |
| Tris(2-aminoethyl)amine (3) | SC-85 | SC-86 | SC-87 | SC-88 |
| Tetraethylenepentamine (5) | SC-92 | SC-93 | SC-94 | SC-95 |
| Pentaethylenehexamine (6) | SC-99 | SC-100 | SC-101 | SC-102 |
| 1,4,7-Triazacyclononane (3) | SC-106 | SC-107 | SC-108 | SC-109 |
| 1,5,9-Triazacyclododecane (3) | SC-113 | SC-114 | SC-115 | SC-116 |
| Cyclene (4) | SC-120 | SC-121 | SC-122 | SC-123 |
| 1,4,8,11-Tetraazacyclotetradecane (4) | SC-127 | SC-128 | SC-129 | SC-130 |
| 1,4,8,12-Tetraazacyclopentadecane (4) | SC-134 | SC-135 | SC-136 | SC-137 |
| Hexacyclene (6) | SC-141 | SC-142 | SC-143 | SC-144 |

| Multifunctional Amine | Carboxylic Acid Having Thiol Group | | |
| --- | --- | --- | --- |
| | N-Acetylcysteine | N-(2-Mercaptopropionyl)glycine | Thiosalicylic Acid |
| Diethylenetriamine (3) | SC-5 | SC-6 | SC-7 |
| N-(2-Aminoethyl)-1,3-propanediamine (3) | SC-12 | SC-13 | SC-14 |
| N-(3-Aminopropyl)-1,3-propanediamine (3) | SC-19 | SC-20 | SC-21 |
| Spermidine (3) | SC-26 | SC-27 | SC-28 |
| Bis(hexamethylene)triamine (3) | SC-33 | SC-34 | SC-35 |
| 4-(Aminomethyl)-1,8-octanediamine (3) | SC-40 | SC-41 | SC-42 |

TABLE 2-continued

| | | | |
|---|---|---|---|
| Triethylenetetramine (4) | SC-47 | SC-48 | SC-49 |
| 1,4,7,11-Tetraazaundecane (4) | SC-54 | SC-55 | SC-56 |
| N,N'-Bis(3-aminopropyl)ethylenediamine (4) | SC-61 | SC-62 | SC-63 |
| N,N'-Bis(2-aminoethyl)-1,3-propanediamine (4) | SC-68 | SC-69 | SC-70 |
| N,N'-Bis(3-aminopropyl)-1,3-propanediamine (4) | SC-75 | SC-76 | SC-77 |
| Spermine (4) | SC-82 | SC-83 | SC-84 |
| Tris(2-aminoethyl)amine (3) | SC-89 | SC-90 | SC-91 |
| Tetraethylenepentamine (5) | SC-96 | SC-97 | SC-98 |
| Pentaethylenehexamine (6) | SC-103 | SC-104 | SC-105 |
| 1,4,7-Triazacyclononane (3) | SC-110 | SC-111 | SC-112 |
| 1,5,9-Triazacyclododecane (3) | SC-117 | SC-118 | SC-119 |
| Cyclene (4) | SC-124 | SC-125 | SC-126 |
| 1,4,8,11-Tetraazacyclotetradecane (4) | SC-131 | SC-132 | SC-133 |
| 1,4,8,12-Tetraazacyclopentadecane (4) | SC-138 | SC-139 | SC-140 |
| Hexacyclene (6) | SC-145 | SC-146 | SC-147 |

Of the compounds shown in Table 2, SC-1 to SC-6, SC-8 to SC-13, SC-15 to SC-20, SC-22 to SC-27, SC-29 to SC-34, SC-36 to SC-111, SC-113 to SC-118, SC-120 to SC-132, SC-134 to SC-139 and SC-141 to SC-147 are preferred, SC-37 to SC-41, SC-44 to SC-48, SC-51 to SC-55, SC-58 to SC-62, SC-65 to SC-69, SC-72 to SC-76, SC-79 to SC-83, SC-86 to SC-90, SC-93 to SC-97, SC-100 to SC-104, SC-121 to SC-125 and SC-142 to SC-146 are more preferred, and SC-37 to SC-41, SC-86 to SC-90, SC-93 to SC-97, SC-100 to SC-104, SC-121 to SC-125 and SC-142 to SC-146 are particularly preferred.

Since the multifunctional thiols synthesized by these compounds have a long distance between the thiol groups and a small steric hindrance, the desired star structure can be formed.

(Compound D)

Compound D is a compound obtained by a dehydration condensation reaction between a compound having a hydroxy group and an amino group and a carboxylic acid having a thiol group, and preferably a compound obtained by a dehydration condensation reaction between a multifunctional alcoholamine having from 3 to 10 functional groups of hydroxy group and amino group and a monocarboxylic acid having one thiol group is preferred.

Specific examples of the multifunctional alcoholamine include diethanolamine (3), serinol (3), diisopropanolamine (3), 2-amino-2-ethyl-1,3-propanediol (3), 2-amino-2-methyl-1,3-propanediol (3), tris(hydroxymethyl)aminomethane (4), bishomotris (4), 1,3-diamino-2-hydroxypropane (3), 2-(2-aminoethylamino)ethanol (3), N,N'-bis(2-hydroxyethyl)ethylenediamine (4), 1,3-bis[tris(hydroxymethyl)methylamino]propane (8), 1-amino-1-deoxy-D-sorbitol (6), N-methyl-D-glucamine (6), 2,3-diaminophenol (3), 4-aminoresorcinol (3), norphenylephrine (3), octopamine (3), synephrine (3), 3,4-dihydroxybenzylamine (3), 3-hydroxytyramine (3), norepinephrine (4), 5-hydroxydopamine (4) and 6-hydroxydopamine (4).

Of the multifunctional alcoholamines, serinol (3), 2-amino-2-methyl-1,3-propanediol (3), tris(hydroxymethyl)aminomethane (4), bishomotris (4), 1,3-diamino-2-hydroxypropane (3), N,N'-bis(2-hydroxyethyl)ethylenediamine (4), 1,3-bis[tris(hydroxymethyl)methylamino]propane (8), 1-amino-1-deoxy-D-sorbitol (6), N-methyl-D-glucamine (6), norepinephrine (4), 5-hydroxydopamine (4) and 6-hydroxydopamine (4) are preferred, and tris(hydroxymethyl)aminomethane (4), bishomotris (4), N,N'-bis(2-hydroxyethyl)ethylenediamine (4), 1,3-bis[bis(hydroxymethyl)methylamino]propane (8), 1-amino-1-deoxy-D-sorbitol (6), N-methyl-D-glucamine (6), norepinephrine (4), 5-hydroxydopamine (4) and 6-hydroxydopamine (4) are particularly preferred.

Specific examples of the carboxylic acid having a thiol group include the carboxylic acids described for Compound B above. Specific examples of Compound D include compounds set forth below, but the invention should not be construed as being limited thereto.

TABLE 3

| | Carboxylic Acid Having Thiol Group | | | |
|---|---|---|---|---|
| Multifunctional Alcoholamine | Mercaptoacetic Acid | 3-Mercaptopropionic Acid | 2-Mercaptopropionic Acid | 3-Mercaptoisobutyric Acid |
| Diethanolamine (3) | SD-1 | SD-2 | SD-3 | SD-4 |
| Serinol (3) | SD-8 | SD-9 | SD-10 | SD-11 |
| Diisopropanolamine (3) | SD-15 | SD-16 | SD-17 | SD-18 |
| 2-Amino-2-ethyl-1,3-propanediol (3) | SD-22 | SD-23 | SD-24 | SD-25 |
| 2-Amino-2-methyl-1,3-propanediol (3) | SD-29 | SD-30 | SD-31 | SD-32 |
| Tris(hydroxymethyl)aminomethane (4) | SD-36 | SD-37 | SD-38 | SD-39 |
| Bishomotris (4) | SD-43 | SD-44 | SD-45 | SD-46 |
| 1,3-Diamino-2-hydroxypropane (3) | SD-50 | SD-51 | SD-52 | SD-53 |
| 2-(2-Aminoethylamino)ethanol (3) | SD-57 | SD-58 | SD-59 | SD-60 |
| N,N'-Bis(2-hydroxyethyl)ethylenediamine (4) | SD-64 | SD-65 | SD-66 | SD-67 |
| 1,3-Bis[tris(hydroxymethyl)methylamino]propane (8) | SD-71 | SD-72 | SD-73 | SD-74 |

TABLE 3-continued

| | | | | |
|---|---|---|---|---|
| 1-Amino-1-deoxy-D-sorbitol (6) | SD-78 | SD-79 | SD-80 | SD-81 |
| N-Methyl-D-glucamine (6) | SD-85 | SD-86 | SD-87 | SD-88 |
| 2,3-Diaminophenol (3) | SD-92 | SD-93 | SD-94 | SD-95 |
| 4-Aminoresorcinol (3) | SD-99 | SD-100 | SD-101 | SD-102 |
| Norphenylephrine (3) | SD-106 | SD-107 | SD-108 | SD-109 |
| Octopamine (3) | SD-113 | SD-114 | SD-115 | SD-116 |
| Synephrine (3) | SD-120 | SD-121 | SD-122 | SD-123 |
| 3,4-Dihydroxybenzylamine (3) | SD-127 | SD-128 | SD-129 | SD-130 |
| 3-Hydroxytyramine (3) | SD-134 | SD-135 | SD-136 | SD-137 |
| Norepinephrine (4) | SD-141 | SD-142 | SD-143 | SD-144 |
| 5-Hydroxydopamine (4) | SD-148 | SD-149 | SD-150 | SD-151 |
| 6-Hydroxydopamine (4) | SD-155 | SD-156 | SD-157 | SD-158 |

| | Carboxylic Acid Having Thiol Group | | |
|---|---|---|---|
| Multifunctional Alcoholamine | N-Acetylcysteine | N-(2-Mercaptopropionyl)glycine | Thiosalicylic Acid |
| Diethanolamine (3) | SD-5 | SD-6 | SD-7 |
| Serinol (3) | SD-12 | SD-13 | SD-14 |
| Diisopropanolamine (3) | SD-19 | SD-20 | SD-21 |
| 2-Amino-2-ethyl-1,3-propanediol (3) | SD-26 | SD-27 | SD-28 |
| 2-Amino-2-methyl-1,3-propanediol (3) | SD-33 | SD-34 | SD-35 |
| Tris(hydroxymethyl)aminomethane (4) | SD-40 | SD-41 | SD-42 |
| Bishomotris (4) | SD-47 | SD-48 | SD-49 |
| 1,3-Diamino-2-hydroxypropane (3) | SD-54 | SD-55 | SD-56 |
| 2-(2-Aminoethylamino)ethanol (3) | SD-61 | SD-62 | SD-63 |
| N,N'-Bis(2-hydroxyethyl)ethylenediamine (4) | SD-68 | SD-69 | SD-70 |
| 1,3-Bis[tris(hydroxymethyl)methylamino]propane (8) | SD-75 | SD-76 | SD-77 |
| 1-Amino-1-deoxy-D-sorbitol (6) | SD-82 | SD-83 | SD-84 |
| N-Methyl-D-glucamine (6) | SD-89 | SD-90 | SD-91 |
| 2,3-Diaminophenol (3) | SD-96 | SD-97 | SD-98 |
| 4-Aminoresorcinol (3) | SD-103 | SD-104 | SD-105 |
| Norphenylephrine (3) | SD-110 | SD-111 | SD-112 |
| Octopamine (3) | SD-117 | SD-118 | SD-119 |
| Synephrine (3) | SD-124 | SD-125 | SD-126 |
| 3,4-Dihydroxybenzylamine (3) | SD-131 | SD-132 | SD-133 |
| 3-Hydroxytyramine (3) | SD-138 | SD-139 | SD-140 |
| Norepinephrine (4) | SD-145 | SD-146 | SD-147 |
| 5-Hydroxydopamine (4) | SD-152 | SD-153 | SD-154 |
| 6-Hydroxydopamine (4) | SD-159 | SD-160 | SD-161 |

Of the compounds shown in Table 3, SD-1 to SD-6, SD-8 to SD-20, SD-22 to SD-27, SD-29 to SD-62, SD-64 to SD-97, SD-99 to SD-104, SD-106 to SD-111, SD-113 to SD-118, SD-120 to SD-125, SD-127 to SCD-132, SD-134 to SD-139 and SD-141 to SD-161 are preferred, SD-9 to SD-13, SD-30 to SD-34, SD-37 to SD-41, SD-44 to SD-48, SD-51 to SD-55, SD-65 to SD-69, SD-72 to SD-76, SD-79 to SD-83, SD-86 to SD-90, SD-142 to SD-146, SD-149 to SD-153 and SD-156 to SD-160 are more preferred, and SD-37 to SD-41, SD-44 to SD-48, SD-65 to SD-69, SD-72 to SD-76, SD-79 to SD-83, SD-86 to SD-90, SD-142 to SD-146, SD-149 to SD-153 and SD-156 to SD-160 are particularly preferred.

Since the multifunctional thiols synthesized by these compounds have a long distance between the thiol groups and a small steric hindrance, the desired star structure can be formed.

(Compound E)

Compound E is a compound obtained by a dehydration condensation reaction between a multifunctional carboxylic acid and an alcohol having a thiol group. Among them, a compound obtained by a dehydration condensation reaction between a multifunctional carboxylic acid having from 2 to 10 functional groups and an alcohol having one or more thiol groups is preferred.

Specific examples of the multifunctional carboxylic acid include oxalic acid (2), malonic acid (2), methylmalonic acid (2), succinic acid (2), methylsuccinic acid (2), glutaric acid (2), adipic acid (2), pimelic acid (2), suberic acid (2), azelaic acid (2), sebacic acid (2), tricarballylic acid (3), 1,2,3,4-butanetetracarboxylic acid (4), aconitic acid (3), hexafluoroglutaric acid (2), malic acid (2), tartaric acid (2), citric acid (3), diglycolic acid (2), 3,6-dioxaoctanedicarboxylic acid (2), tetrahydrofuran-2,3,4,5-tetracarboxylic acid (4), mercaptosuccinic acid (2), thioglycolic acid (2), 2,2',2'',2'''-[1,2-ethanediylidenetetrakis(thio)]tetrakisacetic acid (4), 1,3,5-cyclohexanetricarboxylic acid (3), 1,2,3,4-cyclobutanetetracarboxylic acid (4), 1,2,3,4,5,6-cyclohexanehexacarboxylic acid (6), 1,2-phenylenediacetic acid (2), 1,2-phenylenedioxydiacetic acid (2), homophthalic acid (2), 1,3-phenylenediacetic acid (2), 4-carboxyphenoxyacetic acid (2), 1,4-phenylenediacetic acid (2), 1,4-phenylenedipropionic acid (2), phthalic acid (2), isophthalic acid (2), terephthalic acid (2), 1,2,3-benzenetricarboxylic acid (3), 1,2,4-benzenetricarboxylic acid (3), 1,3,5-benzenetricarboxylic acid (3), 1,2,4,5-benzenetetracarboxylic acid (4), mellitic acid (6) and 1,4,5,8-naphthalenetetracarboxylic acid (4).

Of the multifunctional carboxylic acids, tricarballylic acid (3), 1,2,3,4-butanetetracarboxylic acid (4), aconitic acid (3), citric acid (3), tetrahydrofuran-2,3,4,5-tetracarboxylic acid (4), mercaptosuccinic acid (2), 2,2',2'',2'''-[1,2-ethanediylidenetetrakis(thio)]tetrakisacetic acid (4), 1,3,5-cyclohexanetricarboxylic acid (3), 1,2,3,4-cyclobutanetetracarboxylic acid (4), 1,2,3,4,5,6-cyclohexanehexacarboxylic acid (6), 1,2-phenylenediacetic acid (2), 1,2-phenylenedioxydiacetic acid (2), 1,3-phenylenediacetic acid (2), 1,4-phenylenediacetic acid (2), 1,4-phenylenedipropionic acid (2), phthalic acid (2), isophthalic acid (2), terephthalic acid (2), 1,3,5-benzenetricarboxylic acid (3), 1,2,4,5-benzenetetracarboxylic acid (4), mellitic acid (6) and 1,4,5,8-naphthalenetetracarboxylic acid (4) are preferred, and tricarballylic acid (3), 1,2,3,4-butanetetracarboxylic acid (4), tetrahydrofuran-2,3,4,5-tetracarboxylic acid (4), mercaptosuccinic acid (2), 2,2',2'',2'''-[1,2-ethanediylidenetetrakis(thio)]tetrakisacetic acid (4), 1,3,5-cyclohexanetricarboxylic acid (3), 1,2,3,4-cyclobutanetetracarboxylic acid (4), 1,2,3,4,5,6-cyclohexanehexacarboxylic acid (6), 1,3,5-benzenetricarboxylic acid (3), 1,2,4,5-benzenetetracarboxylic acid (4), mellitic acid (6) and 1,4,5,8-naphthalenetetracarboxylic acid (4) are particularly preferred.

Specific examples of the alcohol having a thiol group include 2-mercaptoethanol (1), 1-mercapto-2-propanol (1), 3-mercapto-1-propanol (1), 3-mercapto-2-butanol (1), 2,3-dimercapto-1-propanol (2) and 4-hydroxythiophenol (1). Of the alcohols having a thiol group, 2-mercaptoethanol (1), 3-mercapto-1-propanol (1) and 2,3-dimercapto-1-propanol (2) are preferred, 2-mercaptoethanol (1) and 3-mercapto-1-propanol (1) are more preferred, and 3-mercapto-1-propanol (1) is particularly preferred.

Specific examples of Compound E include compounds shown in Tables 4 and 5 below, but the invention should not be construed as being limited thereto.

TABLE 4

| Multifunctional Carboxylic Acid | Alcohol Having Thiol Group | | | | | |
|---|---|---|---|---|---|---|
| | 2-Mercaptoethanol | 1-Mercapto-2-propanol | 3-Mercapto-1-propanol | 3-Mercapto-2-butanol | 2,3-Dimercapto-1-propanol | 4-Hydroxythiophenol |
| Oxalic acid (2) | — | — | — | — | SE-1 | — |
| Malonic acid (2) | — | — | — | — | SE-2 | — |
| Methylmalonic acid (2) | — | — | — | — | SE-3 | — |
| Succinic acid (2) | — | — | — | — | SE-4 | — |
| Methylsuccinic acid (2) | — | — | — | — | SE-5 | — |
| Glutaric acid (2) | — | — | — | — | SE-6 | — |
| Adipic acid (2) | — | — | — | — | SE-7 | — |
| Pimelic acid (2) | — | — | — | — | SE-8 | — |
| Suberic acid (2) | — | — | — | — | SE-9 | — |
| Azelaic acid (2) | — | — | — | — | SE-10 | — |
| Sebacic acid (2) | — | — | — | — | SE-11 | — |
| Tricarballylic acid (3) | SE-12 | SE-13 | SE-14 | SE-15 | SE-16 | SE-17 |
| 1,2,3,4-Butanetetracarboxylic acid (4) | SE-18 | SE-19 | SE-20 | SE-21 | SE-22 | SE-23 |
| Aconitic acid (3) | SE-24 | SE-25 | SE-26 | SE-27 | SE-28 | SE-29 |
| Hexafluoroglutaric acid (2) | — | — | — | — | SE-30 | — |
| Malic acid (2) | — | — | — | — | SE-31 | — |
| Tartaric acid (2) | — | — | — | — | SE-32 | — |
| Citric acid (3) | SE-33 | SE-34 | SE-35 | SE-36 | SE-37 | SE-38 |
| Diglycolic acid (2) | — | — | — | — | SE-39 | — |
| 3,6-Dioxaoctanedicarboxylic acid (2) | — | — | — | — | SE-40 | — |
| Tetrahydrofuran-2,3,4,5-tetracarboxylic acid (4) | SE-41 | SE-42 | SE-43 | SE-44 | SE-45 | SE-46 |
| Mercaptosuccinic acid (2) | SE-119 | SE-120 | SE-121 | SE-122 | SE-47 | SE-123 |
| Thioglycolic acid (2) | — | — | — | — | SE-48 | — |
| 2,2',2'',2'''-[1,2-Ethanediylidenetetrakis(thio)]tetrakisacetic acid (4) | SE-49 | SE-50 | SE-51 | SE-52 | SE-53 | SE-54 |

TABLE 5

| Multifunctional Carboxylic Acid | Alcohol Having Thiol Group | | | | | |
|---|---|---|---|---|---|---|
| | 2-Mercaptoethanol | 1-Mercapto-2-propanol | 3-Mercapto-1-propanol | 3-Mercapto-2-butanol | 2,3-Dimercapto-1-propanol | 4-Hydroxythiophenol |
| 1,3,5-Cyclohexanetricarboxylic acid (3) | SE-55 | SE-56 | SE-57 | SE-58 | SE-59 | SE-60 |
| 1,2,3,4-Cyclobutanetetracarboxylic acid (4) | SE-61 | SE-62 | SE-63 | SE-64 | SE-65 | SE-66 |
| 1,2,3,4,5,6-Cyclohexanehexacarboxylic acid (6) | SE-67 | SE-68 | SE-69 | SE-70 | SE-71 | SE-72 |
| 1,2-Phenylenediacetic acid (2) | — | — | — | — | SE-73 | — |
| 1,2-Phenylenedioxydiacetic acid (2) | — | — | — | — | SE-74 | — |
| Homophthalic acid (2) | — | — | — | — | SE-75 | — |
| 1,3-Phenylenediacetic acid (2) | — | — | — | — | SE-76 | — |
| 4-Carboxyphenoxyacetic acid (2) | — | — | — | — | SE-77 | — |
| 1,4-Phenylenediacetic acid (2) | — | — | — | — | SE-78 | — |
| 1,4-Phenylenedipropionic acid (2) | — | — | — | — | SE-79 | — |
| Phthalic acid (2) | — | — | — | — | SE-80 | — |
| Isophthalic acid (2) | — | — | — | — | SE-81 | — |
| Terephthalic acid (2) | — | — | — | — | SE-82 | — |
| 1,2,3-Benzenetricarboxylic acid (3) | SE-83 | SE-84 | SE-85 | SE-86 | SE-87 | SE-88 |
| 1,2,4-Benzenetricarboxylic acid (3) | SE-89 | SE-90 | SE-91 | SE-92 | SE-93 | SE-94 |

TABLE 5-continued

| | Alcohol Having Thiol Group | | | | | |
|---|---|---|---|---|---|---|
| Multifunctional Carboxylic Acid | 2-Mercaptoethanol | 1-Mercapto-2-propanol | 3-Mercapto-1-propanol | 3-Mercapto-2-butanol | 2,3-Dimercapto-1-propanol | 4-Hydroxythiophenol |
| 1,3,5-Benzenetricarboxylic acid (3) | SE-95 | SE-96 | SE-97 | SE-98 | SE-99 | SE-100 |
| 1,2,4,5-benzenetetracarboxylic acid (4) | SE-101 | SE-102 | SE-103 | SE-104 | SE-105 | SE-106 |
| Mellitic acid (6) | SE-107 | SE-108 | SE-109 | SE-110 | SE-111 | SE-112 |
| 1,4,5,8-Naphthalenetetracarboxylic acid (4) | SE-113 | SE-114 | SE-115 | SE-116 | SE-117 | SE-118 |

Of the compounds shown in Tables 4 and 5, SE-12, SE-14, SE-16, SE-18, SE-20, SE-22, SE-24, SE-26, SE-33, SE-35, SE-41, SE-43, SE-45, SE-119, SE-121, SE-47, SE-49, SE-51, SE-53, SE-55, SE-57, SE-59, SE-61, SE-63, SE-65, SE-67, SE-69, SE-71, SE-83, SE-85, SE-89, SE-91, SE-95, SE-97, SE-99, SE-101, SE-103, SE-105, SE-107, SE-109, SE-111, SE-113, SE-115 and SE-117 are preferred, and SE-12, SE-14, SE-18, SE-20, SE-41, SE-43, SE-119, SE-121, SE-49, SE-51, SE-55, SE-57, SE-61, SE-63, SE-67, SE-69, SE-95, SE-97, SE-101, SE-103, SE-107, SE-109, SE-113 and SE-115 are more preferred.

Since the multifunctional thiols synthesized by these compounds have a long distance between the thiol groups and a small steric hindrance, the desired star structure can be formed.

(Compound F)

Compound F is a compound obtained by a dehydration condensation reaction between a multifunctional carboxylic acid and an amine having a thiol group. Among them, a compound obtained by a dehydration condensation reaction between a multifunctional carboxylic acid having from 2 to 10 functional groups and an amine having one or more thiol groups is preferred.

Specific examples of the multifunctional carboxylic acid include the multifunctional carboxylic acids described above. Specific examples of the amine having one or more thiol groups include 2-aminoethanethiol, 2-aminothiophenol, 3-aminothiophenol and 4-aminothiophenol, and 2-aminoethanethiol and 4-aminothiophenol are preferred, and 2-aminoethanethiol is more preferred.

Specific examples of Compound F include compounds set forth below, but the invention should not be construed as being limited thereto.

Of the compounds shown in Table 6, SF-1, SF-4, SF-5, SF-8, SF-9, SF-13, SF-17, SF-20, SF-21, SF-24, SF-25, SF-28, SF-29, SF-32, SF-33, SF-36, SF-37, SF-40, SF-41, SF-45, SF-49, SF-52, SF-53, SF-56, SF-57, SF-60, SF-61 and SF-64 are preferred, and SF-1, SF-5, SF-17, SF-21, SF-25, SF-29, SF-33, SF-37, SF-49, SF-53, SF-57 and SF-61 are more preferred.

Since the multifunctional thiols synthesized from these compounds described above have a long distance between the thiol groups and a small steric hindrance, the desired star structure can be formed.

From the standpoint of synthesis of the star polymer, of the multifunctional thiols described above, Compounds A, B and E are preferred in the case where a polymer reaction or the like, for example, hydrolysis is not conducted after the synthesis of a polymer and Compounds A, C and F are preferred in the case where the polymer reaction is conducted after the synthesis of a polymer.

The polymer chain of the star polymer according to the invention includes a polymer chain of a known vinyl-based polymer, (meth)acrylic acid-based polymer or styrene-based polymer, which can be produced by radical polymerization, and a polymer chain of a vinyl-based polymer or (meth)acrylic acid-based polymer is particularly preferred.

As one preferred example of the polymer chain for use in the invention, a water-dispersible or water-soluble polymer containing a repeating unit having a hydrophilic group is exemplified.

Examples of the hydrophilic group include a carboxylic acid (salt) group, a sulfonic acid (salt) group, a hydroxy group, a carbonamido group, a sulfuric acid (salt) group, a carbobetaine group, a sulfobetaine group, a phosphobetaine group, an N-oxide group, an ammonium group, $-(CH_2CH_2O)_nR$, $-(C_3H_6O)_mR$ (wherein R represents a

TABLE 6

| | Amine Having Thiol Group | | | |
|---|---|---|---|---|
| Multifunctional Carboxylic Acid | 2-Aminoetyhanetiol | 2-Aminothiophenol | 3-Aminothiophenol | 4-Aminothiophenol |
| Tricarballylic acid (3) | SF-1 | SF-2 | SF-3 | SF-4 |
| 1,2,3,4-Butanetetracarboxylic acid (4) | SF-5 | SF-6 | SF-7 | SF-8 |
| Aconitic acid (3) | SF-9 | SF-10 | SF-11 | SF-12 |
| Citric acid (3) | SF-13 | SF-14 | SF-15 | SF-16 |
| Tetrahydrofuran-2,3,4,5-tetracarboxylic acid (4) | SF-17 | SF-18 | SF-19 | SF-20 |
| Mercaptosuccinic acid (2) | SF-21 | SF-22 | SF-23 | SF-24 |
| 2,2',2'',2'''-[1,2-Ethanediylidenetetrakis(thio)]tetrakisacetic acid (4) | SF-25 | SF-26 | SF-27 | SF-28 |
| 1,3,5-Cyclohexanetricarboxylic acid (3) | SF-29 | SF-30 | SF-31 | SF-32 |
| 1,2,3,4-Cyclobutanetetracarboxylic acid (4) | SF-33 | SF-34 | SF-35 | SF-36 |
| 1,2,3,4,5,6-Cyclohexanehexacarboxylic acid (6) | SF-37 | SF-38 | SF-39 | SF-40 |
| 1,2,3-Benzenetricarboxylic acid (3) | SF-41 | SF-42 | SF-43 | SF-44 |
| 1,2,4-Benzenetricarboxylic acid (3) | SF-45 | SF-46 | SF-47 | SF-48 |
| 1,3,5-Benzenetricarboxylic acid (3) | SF-49 | SF-50 | SF-51 | SF-52 |
| 1,2,4,5-benzenetetracarboxylic acid (4) | SF-53 | SF-54 | SF-55 | SF-56 |
| Mellitic acid (6) | SF-57 | SF-58 | SF-59 | SF-60 |
| 1,4,5,8-Naphthalenetetracarboxylic acid (4) | SF-61 | SF-62 | SF-53 | SF-64 | hydrogen atom, an alkyl group having from 1 to 12 carbon atoms, an aryl group, an alkenyl group or an alkynyl group, and n and m each represents an integer from 1 to 100), and a combination of these groups.

Of the hydrophilic groups, a carboxylic acid (salt) group, a sulfonic acid (salt) group, a hydroxy group, a carbonamido group, a carbobetaine group, a sulfobetaine group, a phosphobetaine group or —(CH$_2$CH$_2$O)$_n$R is more preferred.

The repeating unit having a hydrophilic group includes, for example, repeating units shown below.

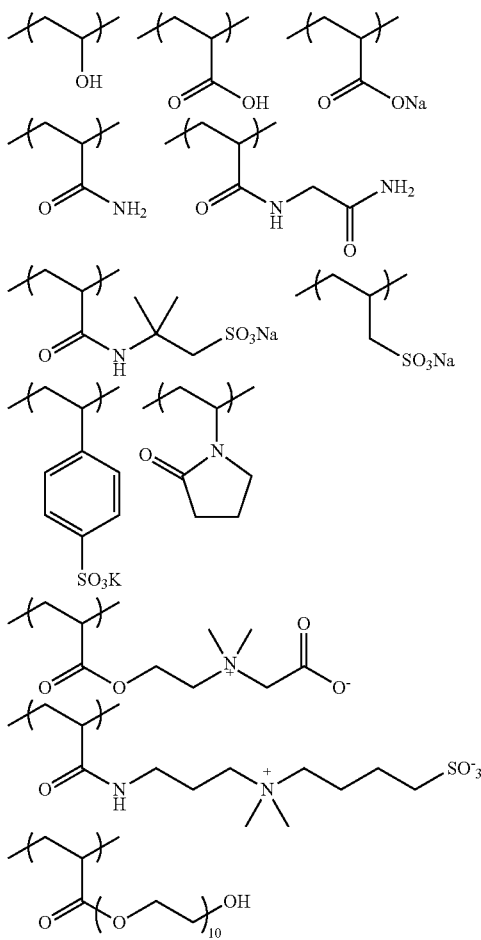

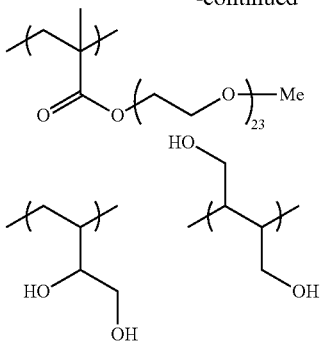

The hydrophilic group is included in the star polymer preferably from 0.1 to 50 mmol, more preferably from 0.5 to 45 mmol, particularly preferably from 1.0 to 40 mmol, per g of the star polymer. By controlling the content of the hydrophilic group to the range described above, the development property of protective layer is improved and deposition in a developer is prevented.

The polymer chain for use in the invention may contain a polymerization unit of an alkyl or aryl ester of (meth)acrylic acid, a polymerization unit of a (meth)acrylamide or a derivative thereof, a polymerization unit of an α-hydroxymethylacrylate or a polymerization unit of a styrene derivative in addition to the polymerization unit having a hydrophilic group described above.

The alkyl group of the alkyl ester of (meth)acrylic acid is preferably an alkyl group having from 1 to 5 carbon atoms or an alkyl group having from 2 to 8 carbon atoms and the substituent described above, and more preferably a methyl group. The aralkyl ester of (meth)acrylic acid includes, for example, benzyl (meth)acrylate.

The (meth)acrylamide derivative includes, for example, N-isopropylacrylamide, N-phenylmethacrylamide, N-(4-methoxycarbonylphenyl)methacrylamide, N,N-dimethylacrylamide and morpholinoacrylamide.

The α-hydroxymethylacrylate includes, for example, ethyl α-hydroxymethylacrylate and cyclohexyl α-hydroxymethylacrylate. The styrene derivative includes, for example, styrene and 4-tert-butylstyrene.

Specific examples of the star polymer for use in the invention are set forth below, but the invention should not be construed as being limited thereto.

TABLE 7

| | | | PVA-based Polymer (1) | | | | |
|---|---|---|---|---|---|---|---|
| | | | Polymer Chain | | | | |
| | Central skeleton | | Repeating unit Having Hydrophilic | | Repeating unit Having Hydrophilic Group or Other Repeating | | Repeating unit Having Hydrophilic Group or Other Repeating | |
| Polymer No. | No. | % by Mole[*1] | Group | % by Mole | Unit | % by Mole | Unit | % by Mole (x $10^4$) |
| P-1 | SA-3 | 0.5 | ⫨OH | 98 | ⫨OC(=O)CH$_3$ | 2 | | 4.0 |

TABLE 7-continued

| | | | PVA-based Polymer (1) | | | | | |
|---|---|---|---|---|---|---|---|---|
| | | | | Polymer Chain | | | | |
| | Central skeleton | | Repeating unit Having Hydrophilic Group | | Repeating unit Having Hydrophilic Group or Other Repeating Unit | | Repeating unit Having Hydrophilic Group or Other Repeating Unit | Mw |
| Polymer No. | No. | % by Mole[*1] | Group | % by Mole | Unit | % by Mole | Unit | % by Mole (× $10^4$) |
| P-2 | SA-4 | 0.5 | —CH$_2$—CH(OH)— | 98 | —CH$_2$—CH(OC(=O)CH$_3$)— | 2 | | 4.2 |
| P-3 | SA-5 | 0.5 | —CH$_2$—CH(OH)— | 98 | —CH$_2$—CH(OC(=O)CH$_3$)— | 2 | | 5.3 |
| P-4 | SA-6 | 0.5 | —CH$_2$—CH(OH)— | 98 | —CH$_2$—CH(OC(=O)CH$_3$)— | 2 | | 8.1 |
| P-5 | SA-7 | 0.5 | —CH$_2$—CH(OH)— | 98 | —CH$_2$—CH(OC(=O)CH$_3$)— | 2 | | 8.3 |
| P-6 | SA-8 | 0.5 | —CH$_2$—CH(OH)— | 98 | —CH$_2$—CH(OC(=O)CH$_3$)— | 2 | | 9.8 |
| P-7 | SA-6 | 0.5 | —CH$_2$—CH(OH)— | 90 | —CH$_2$—CH(OC(=O)CH$_3$)— | 10 | | 8.2 |

[*1]: A ratio of mole number (%) of SH group to the total mole number of the monomers.

TABLE 8

PVA-based Polymer (2)

| | Central Skeleton | | Polymer Chain | | | | | | |
|---|---|---|---|---|---|---|---|---|---|
| Polymer No. | No. | % by Mole*1 | Repeating unit Having Hydrophilic Group | % by Mole | Repeating unit Having Hydrophilic Group or Other Repeating Unit | % by Mole | Repeating unit Having Hydrophilic Group or Other Repeating Unit | % by Mole | Mw (× 10⁴) |
| P-8 | SA-6 | 0.5 | —[CH₂CH(OH)]— | 88 | —[CH₂CH(OC(O)CH₃)]— | 12 | | | 8.2 |
| P-9 | SA-6 | 0.5 | —[CH₂CH(OH)]— | 80 | —[CH₂CH(OC(O)CH₃)]— | 20 | | | 8.3 |
| P-10 | SA-6 | 0.5 | —[CH₂CH(OH)]— | 75 | —[CH₂CH(OC(O)CH₃)]— | 25 | | | 8.3 |
| P-11 | SC-2 | 0.5 | —[CH₂CH(OH)]— | 95 | —[CH₂CH(CH₂SO₃Na)]— | 2 | —[CH₂CH(OC(O)CH₃)]— | 3 | 3.5 |
| P-12 | SC-37 | 0.5 | —[CH₂CH(OH)]— | 80 | —[CH₂CH(C(O)ONa)]— | 10 | —[CH₂CH(OC(O)CH₃)]— | 10 | 4.6 |
| P-13 | SC-44 | 0.5 | —[CH₂CH(OH)]— | 94 | —[CH₂CH(CH₂(OCH₂CH₂)₁₀OH)]— | 4 | —[CH₂CH(OC(O)CH₃)]— | 2 | 4.7 |
| P-14 | SC-86 | 0.5 | —[CH₂CH(OH)]— | 80 | —[CH₂CH(C(O)NH₂)]— | 10 | —[CH₂CH(OC(O)CH₃)]— | 10 | 4.5 |
| P-15 | SC-93 | 0.5 | —[CH₂CH(OH)]— | 94 | —[CH₂CH(N-2-pyrrolidonyl)]— | 4 | —[CH₂CH(OC(O)CH₃)]— | 2 | 7.5 |

TABLE 8-continued

PVA-based Polymer (2)

| | Central Skeleton | | Polymer Chain | | | | | | |
|---|---|---|---|---|---|---|---|---|---|
| Polymer No. | No. | % by Mole*1 | Repeating unit Having Hydrophilic Group | % by Mole | Repeating unit Having Hydrophilic Group or Other Repeating Unit | % by Mole | Repeating unit Having Hydrophilic Group or Other Repeating Unit | % by Mole | Mw (× 10⁴) |
| P-16 | SC-100 | 0.5 | —CH₂—CH(OH)— | 96 | HOCH₂—CH(CH₂OH)— | 2 | —CH₂—CH(OAc)— | 2 | 8.0 |
| P-17 | SF-25 | 0.5 | —CH₂—CH(OH)— | 92 | —CH₂—CH(CH(OH)CH₂OH)— | 6 | —CH₂—CH(OAc)— | 2 | 4.7 |
| P-18 | SF-33 | 0.5 | —CH₂—CH(OH)— | 85 | —CH₂—C(CH₃)(CONHC(CH₃)₂CH₂SO₃Na)— | 5 | —CH₂—CH(OAc)— | 10 | 5.9 |
| P-19 | SF-37 | 0.5 | —CH₂—CH(OH)— | 80 | —CH₂—CH(CONHCH₂CONH₂)— | 10 | —CH₂—CH(OAc)— | 10 | 8.1 |
| P-20 | SF-49 | 0.5 | —CH₂—CH(OH)— | 94 | —CH₂—CH(NHCOCH₃)— | 4 | —CH₂—CH(OAc)— | 2 | 4.0 |
| P-21 | SF-53 | 0.5 | —CH₂—CH(OH)— | 80 | —CH₂—CH(CN)— | 10 | —CH₂—CH(OAc)— | 10 | 6.1 |
| P-22 | SF-57 | 0.5 | —CH₂—CH(OH)— | 80 | —CH₂—CH(COO-tBu)— | 10 | —CH₂—CH(OAc)— | 10 | 8.5 |
| P-23 | SF-61 | 0.5 | —CH₂—CH(OH)— | 80 | —CH₂—CH(C₆H₅)— | 10 | —CH₂—CH(OAc)— | 10 | 6.1 |

TABLE 9

(Meth)acrylic Acid-based Polymer (1)

| Polymer No. | Central Skeleton No. | % by Mole*1 | Polymer Chain Repeating unit Having Hydrophilic Group | % by Mole | Repeating unit Having Hydrophilic Group or Other Repeating Unit | % by Mole | Repeating unit Having Hydrophilic Group or Other Repeating Unit | % by Mole | Mw (×10⁴) |
|---|---|---|---|---|---|---|---|---|---|
| P-24 | SB-204 | 0.5 | -[CH₂-C(CH₃)]- C(=O)OH | 100 | | | | | 10.0 |
| P-25 | SB-205 | 0.5 | -[CH₂-C(CH₃)]- C(=O)OH | 100 | | | | | 10.6 |
| P-26 | SB-206 | 0.5 | -[CH₂-C(CH₃)]- C(=O)OH | 100 | | | | | 10.2 |
| P-27 | SB-207 | 0.5 | -[CH₂-C(CH₃)]- C(=O)OH | 100 | | | | | 10.5 |
| P-28 | SB-208 | 0.5 | -[CH₂-C(CH₃)]- C(=O)OH | 100 | | | | | 10.4 |
| P-29 | SB-209 | 0.5 | -[CH₂-C(CH₃)]- C(=O)OH | 100 | | | | | 10.5 |
| P-30 | SB-210 | 0.5 | -[CH₂-C(CH₃)]- C(=O)OH | 100 | | | | | 10.0 |
| P-31 | SB-205 | 2 | -[CH₂-C(CH₃)]- C(=O)NH₂ | 80 | -[CH₂-C(CH₃)]- C(=O)O-tBu | 20 | | | 4.2 |
| P-32 | SB-2 | 2 | -[CH₂-C(CH₃)]- C(=O)NH₂ | 80 | -[CH₂-C(CH₃)]- C(=O)O-tBu | 20 | | | 2.2 |
| P-33 | SB-9 | 2 | -[CH₂-C(CH₃)]- C(=O)NH₂ | 80 | -[CH₂-C(CH₃)]- C(=O)O-tBu | 20 | | | 2.5 |
| P-34 | SB-30 | 2 | -[CH₂-C(CH₃)]- C(=O)NH₂ | 80 | -[CH₂-C(CH₃)]- C(=O)O-tBu | 20 | | | 2.6 |

TABLE 9-continued (Meth)acrylic Acid-based Polymer (1)

| | Central Skeleton | | Polymer Chain | | | | | | |
|---|---|---|---|---|---|---|---|---|---|
| Polymer No. | No. | % by Mole*1 | Repeating unit Having Hydrophilic Group | % by Mole | Repeating unit Having Hydrophilic Group or Other Repeating Unit | % by Mole | Repeating unit Having Hydrophilic Group or Other Repeating Unit | % by Mole | Mw (×10⁴) |
| P-35 | SB-37 | 2 | acrylamide (−CONH₂) | 80 | t-butyl acrylate | 20 | | | 2.2 |
| P-36 | SB-65 | 2 | acrylamide (−CONH₂) | 80 | t-butyl acrylate | 20 | | | 23 |
| P-37 | SB-79 | 2 | acrylamide (−CONH₂) | 80 | t-butyl acrylate | 20 | | | 2.1 |

TABLE 10

(Meth)acrylic Acid-based Polymer (2)

| | Central Skeleton | | Polymer Chain | | | | | | |
|---|---|---|---|---|---|---|---|---|---|
| Polymer No. | No. | % by Mole*1 | Repeating unit Having Hydrophilic Group | % by Mole | Repeating unit Having Hydrophilic Group or Other Repeating Unit | % by Mole | Repeating Unit Having Hydrophilic Group or Other | % by Mole | Mw (×10⁴) |
| P-38 | SB-93 | 2 | acrylamide (−CONH₂) | 80 | t-butyl acrylate | 20 | | | 2.1 |
| P-39 | SB-100 | 2 | acrylamide (−CONH₂) | 80 | t-butyl acrylate | 20 | | | 2.8 |
| P-40 | SB-156 | 2 | acrylamide (−CONH₂) | 80 | t-butyl acrylate | 20 | | | 3.5 |
| P-41 | SB-170 | 2 | acrylamide (−CONH₂) | 80 | t-butyl acrylate | 20 | | | 4.4 |

TABLE 10-continued (Meth)acrylic Acid-based Polymer (2)

| | Polymer Chain | | | | | | | |
|---|---|---|---|---|---|---|---|---|
| Polymer No. | Central Skeleton No. | % by Mole*1 | Repeating unit Having Hydrophilic Group | % by Mole | Repeating unit Having Hydrophilic Group or Other Repeating Unit | % by Mole | Repeating Unit Having Hydrophilic Group or Other Repeating Unit | % by Mole | Mw (× 10^4) |

| Polymer No. | Central Skeleton No. | % by Mole*1 | Hydrophilic Unit | % Mole | Other Unit | % Mole | Mw (×10^4) |
|---|---|---|---|---|---|---|---|
| P-42 | SB-212 | 2 | -[CH2-CH(C(O)NH2)]- | 80 | -[CH2-C(CH3)(C(O)O-tBu)]- | 20 | 5.6 |
| P-43 | SD-37 | 0.5 | -[CH2-CH(C(O)NH2)]- | 100 | | | 6.7 |
| P-44 | SD-44 | 0.5 | -[CH2-CH(C(O)NH-CH2-C(O)NH2)]- | 70 | -[CH2-C(CH3)(C(O)O-tBu)]- | 30 | 6.5 |
| P-45 | SD-65 | 0.5 | -[CH2-CH(C(O)NH2)]- | 50 | -[CH2-CH(CN)]- | 50 | 6.6 |
| P-46 | SD-72 | 0.5 | -[CH2-C(CH3)(C(O)O-CH2CH2-N+(CH3)2-CH2-COO−)]- | 100 | | | 11.9 |
| P-47 | SD-79 | 0.5 | -[CH2-CH(C(O)NH-(CH2)3-N+(CH3)2-(CH2)4-SO3−)]- | 50 | -[CH2-C(CH3)(C(O)O-tBu)]- | 50 | 9.2 |
| P-48 | SD-86 | 0.5 | -[CH2-C(CH3)(C(O)O-CH2CH2-N+(CH3)2-CH2-COO−)]- | 40 | -[CH2-C(CH3)(C(O)O-Me)]- | 60 | 9.1 |
| P-49 | SD-142 | 0.5 | -[CH2-CH(C(O)NH2)]- | 80 | -[CH2-C(CH3)(C(O)O-(CH2CH2O)23-Me)]- | 20 | 6.1 |
| P-50 | SD-149 | 0.5 | -[CH2-C(CH3)(C(O)NH-C(CH3)2-CH2-SO3Na)]- | 100 | | | 6.2 |
| P-51 | SD-156 | 0.5 | -[CH2-C(CH3)(C(O)NH-C(CH3)2-CH2-SO3Na)]- | 10 | -[CH2-CH(C(O)O-Me)]- | 90 | 6.1 |

TABLE 10-continued (Meth)acrylic Acid-based Polymer (2)

| Polymer No. | Central Skeleton No. | % by Mole[*1] | Repeating unit Having Hydrophilic Group | % by Mole | Repeating unit Having Hydrophilic Group or Other Repeating Unit | % by Mole | Repeating Unit Having Hydrophilic Group or Other Repeating Unit | % by Mole | Mw (× 10⁴) |
|---|---|---|---|---|---|---|---|---|---|
| P-52 | SB-205 | 0.5 | (N-vinylpyrrolidone unit) | 100 | | | | | 8.5 |

TABLE 11

(Meth)acrylic Acid-based Polymer (3)

| Polymer No. | Central Skeleton No. | % by Mole[*1] | Repeating unit Having Hydrophilic Group | % by Mole | Repeating unit Having Hydrophilic Group or Other Repeating Unit | % by Mole | Repeating unit Having Hydrophilic Group or Other Repeating Unit | % by Mole | Mw (× 10⁴) |
|---|---|---|---|---|---|---|---|---|---|
| P-53 | SB-205 | 0.5 | —C(—)(C(=O)NH$_2$)— | 50 | —C(—)(C(=O)N(CH$_3$)$_2$)— | 30 | —C(—)(C(=O)O-tBu)— | 20 | 9.1 |
| P-54 | SB-205 | 0.5 | —C(—)(C(=O)OH)— | 50 | —C(—)(C(=O)NH$_2$)— | 50 | | | 8.8 |
| P-55 | SB-205 | 0.5 | —C(—)(C(=O)NH$_2$)— | 50 | —C(—)(C(=O)OCH$_3$)— | 50 | | | 9.3 |
| P-56 | SB-205 | 0.5 | —CH(—)(C$_6$H$_4$-SO$_3$K)— | 30 | —CH(—)(C$_6$H$_4$-SO$_3$K)— | 70 | | | 7.8 |

The weight average molecular weight (Mw) of the star polymer according to the invention is preferably from 5,000 to 500,000, more preferably from 10,000 to 250,000, and particularly preferably from 20,000 to 150,000. In the range described above, the development property and printing durability are improved.

The star polymers according to the invention may be used only one kind or two or more kinds in combination. Also, it can be used together with a conventional straight-chain type polymer.

The content of the star polymer according to the invention in the protective layer is preferably 5% by weight or more, more preferably from 5 to 95% by weight, still more preferably from 10 to 90% by weight, particularly preferably from 15 to 85% by weight, based on the total solid content of the protective layer.

(B) Other components

The protective layer according to the invention may contain, for example, an inorganic stratiform compound, a water-soluble polymer having no star-like structure or a light-absorbing agent in addition to the star polymer described above.

(Inorganic Stratiform Compound)

The protective layer may contain an inorganic substratum compound. The inorganic stratiform compound is a particle having a thin tabular shape and includes, for instance, mica, for example, natural mica or synthetic mica, talc represented by the following formula: $3MgO.4SiO.H_2O$, teniolite, montmorillonite, saponite, hectorite and zirconium phosphate.

The inorganic stratiform compound preferably used in the invention is a mica compound. As the mica compound, mica, for example, natural mica represented by the following formula: $A(B, C)_{2-5} D_4O_{10} (OH, F, O)_2$, (wherein. A represents any one of K, Na and Ca, B and C each represents any one of Fe(II), Fe(III), Mn, Al, Mg and V, and D represents Si or Al) or synthetic mica is exemplified.

Of the micas, examples of the natural mica include muscovite, paragonite, phlogopite, biotite and lepidolite. Examples of the synthetic mica include non-swellable mica, for example, fluorphlogopite $KMg_3(AlSi_3O_{10})F_2$ or potassium tetrasilic mica $KMg_{2.5}(Si_4O_{10})F_2$, and swellable mica, for example, Na tetrasilic mica $NaMg_{2.5}(Si_4O_{10})F_2$, Na or Li teniolite $(Na, Li)Mg_2Li(Si_4O_{10})F_2$, or montmorillonite based Na or Li hectorite $(Na, Li)_{1/8}Mg_{2/5}Li_{1/8}(Si_4O_{10})F_2$. Synthetic smectite is also useful.

Of the mica compounds, fluorine based swellable mica is particularly useful in the invention. Specifically, the swellable synthetic mica has a stratiform structure comprising a unit crystal lattice layer having thickness of approximately from 10 to 15 angstroms, and metallic atom substitution in the lattices thereof is remarkably large in comparison with other clay minerals. As a result, the lattice layer results in lack of positive charge and in order to compensate it, a cation, for example, $Na^+$, $Ca^{2+}$ or $Mg^{2+}$, is adsorbed between the lattice layers. The cation existing between the lattice layers is referred to as an exchangeable cation and is exchangeable with various cations. In particular, in the case where the cation between the lattice layers is $Li^+$ or $Na^+$, because of a small ionic radius, a bond between the stratiform crystal lattices is week, and the inorganic stratiform compound greatly swells upon contact with water. When share is applied under such a condition, the stratiform crystal lattices are easily cleaved to form a stable sol in water. The swellable synthetic mica has strongly such tendency and is particularly preferably used in the invention.

With respect to the shape of the mica compound, the thinner the thickness or the larger the plane size, as long as smoothness of coated surface and transmission of actinic radiation are not damaged, the better from the standpoint of control of diffusion. Therefore, an aspect ratio of the mica compound is ordinarily 20 or more, preferably 100 or more, particularly preferably 200 or more. The aspect ratio is a ratio of major axis to thickness of particle and can be determined, for example, from a projection drawing of particle by a microphotography. The larger the aspect ratio, the greater the effect obtained.

As for the particle size of the mica compound, an average major axis is ordinarily from 0.3 to 20 μm, preferably from 0.5 to 10 μm, particularly preferably from 1 to 5 μm. An average thickness of the particle is preferably 0.1 μm or less, more preferably 0.05 μm or less, particularly preferably 0.01 μm or less. Specifically, for example, in the swellable synthetic mica that is the representative compound, the thickness is approximately from 1 to 50 nm and the plane size (major axis) is approximately from 1 to 20 μm.

The content of the mica compound is preferably from 3 to 50% by weight, more preferably from 5 to 40% by weight, based on the total solid content of the protective layer. When the amount is 3% by weight or more, the effect of preventing adhesion between the lithographic printing plate precursors when they are superimposed and the effect of preventing the occurrence of scratch are large. The amount of 50% by weight or less is preferred because the oxygen permeability does not become excessively small and the lithographic printing plate precursor does not tend to be fogged by safelight and the film property does not tend to decrease. When a plural kind of the mica compounds is used together, it is preferred that the total amount of the mica compounds is in the range described above.

The composition (selection of the star polymer and mica compound and use of additives) and coating amount of the protective layer are determined in consideration, for example, of the antifogging property, adhesion property and scratch resistance in addition to the oxygen-blocking property and development removability.

The protective layer according to the invention preferably has oxygen permeability at 25° C. under one atmosphere of 0.5 to 100 ml/m² day. In order to achieve the oxygen permeability, it is preferred to use means for adjusting the coating amount.

(Water-Soluble Polymer Having No Star-Like Structure)

As to the protective layer, the adhesion property to the image-recording layer and uniformity of the layer are also extremely important in view of handling of the lithographic printing plate precursor. Specifically, when a hydrophilic layer comprising a water-soluble polymer is laminated on the oleophilic image-recording layer, layer peeling due to lack of the adhesion property is liable to occur, and the peeled portion causes such a defect as failure in curing of the photosensitive layer due to polymerization inhibition by oxygen. Various proposals have been made for improving the adhesion property between the image-recording layer and the protective layer. For example, it is described in JP-B-54-12215 (the term "JP-B" as used herein means an "examined Japanese patent publication") and BP-A-1,303,578 that a sufficient adhesion property can be obtained by mixing from 20 to 60% by weight of an acryl-based emulsion or a water-insoluble vinyl pyrrolidone/vinyl acetate copolymer with a hydrophilic polymer mainly comprising polyvinyl alcohol and laminating the resulting mixture on the image-recording layer.

Any of these known techniques can be applied to the protective layer according to the invention as long as the effects of the invention are not damaged. For instance, in the protective layer, the star polymer described above may be used together with polyvinyl pyrrolidone as the binder component from the standpoint of the adhesion property to the image-recording layer, sensitivity and prevention of undesirable fog. The weight ratio of the star polymer/polyvinyl pyrrolidone is preferably 3/1 or less.

Other than the polyvinyl pyrrolidone, a polymer relatively excellent in crystallizability, for example, acidic cellulose, gelatin, gum arabic, polyacrylic acid or copolymer of acrylic acid or polyvinyl alcohol (for example, polyvinyl alcohol, low saponified polyvinyl alcohol, acid-modified polyvinyl alcohol or cation-modified polyvinyl alcohol) may also be used together with the star polymer.

(Light-Absorbing Agent)

To the protective layer according to the invention may be added a light-absorbing agent (for example, a water-soluble dye), which is excellent in transmission of light used for exposure of the image-recording layer and capable of efficiently absorbing light having a wavelength which does not concern the exposure. This allows increase in the safe light adaptability without accompanying decrease in the sensitivity.

(Formation of Protective Layer)

The protective layer according to the invention can be formed by preparing, if desired, a dispersion of the mica compound or the like and mixing the dispersion with a binder component including the star polymer (or an aqueous solution containing a binder component including the star polymer dissolved therein) to prepare a coating solution for protective layer and coating the coating solution on the image-recording layer.

An example of common dispersing method for the mica compound used in the protective layer is described below. Specifically, from 5 to 10 parts by weight of a swellable mica compound that is preferably exemplified as the mica compound is added to 100 parts by weight of water to adapt the compound to water and to be swollen, followed by dispersing using a dispersing machine. The dispersing machine used includes, for example, a variety of mills conducting dispersion by directly applying mechanical power, a high-speed agitation type dispersing machine providing a large shear force and a dispersion machine providing ultrasonic energy of high intensity. Specific examples of the dispersing machine include a ball mill, a sand grinder mill, a visco mill, a colloid mill, a homogenizer, a dissolver, a polytron, a homomixer, a homoblender, a keddy mill, a jet agitor, a capillary type emulsifying device, a liquid siren, an electromagnetic strain type ultrasonic generator and an emulsifying device having a Polman whistle. The dispersion containing from 2 to 15% by weight of the mica compound thus prepared is highly viscous or gelled and exhibits extremely good preservation stability.

In the preparation of a coating solution for protective layer using the dispersion of mica compound, it is preferred that the dispersion is diluted with water, sufficiently stirred and then mixed with the binder component including the star polymer (or an aqueous solution containing the binder component including the star polymer dissolved therein).

To the coating solution for protective layer can be added known additives, for example, a surfactant for improving coating property or a water-soluble plasticizer for improving physical property of coated layer. Examples of the surfactant include an anionic surfactant, for example, sodium alkylsulfate or sodium alkylsulfonate, an amphoteric surfactant, for example, alkylaminocarboxylate or alkylaminodicarboxylate and a nonionic surfactant, for example, polyoxyethylene alkyl phenyl ether. Examples of the water-soluble plasticizer include propionamide, cyclohexanediol, glycerin and sorbitol. Also, a water-soluble (meth)acrylic polymer may be added. Further, to the coating solution may be added known additives for increasing adhesion property to the image-recording layer or for improving preservation stability of the coating solution.

A coating method of the protective layer according to the invention is not particularly limited, and methods described, for example, in U.S. Pat. No. 3,458,311 and JP-B-55-49729 can be utilized.

The coating amount of the protective layer according to the invention is preferably from 0.1 to 2.0 $g/m^2$, more preferably from 0.12 to 1.5 $g/m^2$. In the range described above, the film strength and the scratch resistance of the protective layer are good, the removability of the protective layer upon the development is excellent, and the safe light aptitude does not deteriorate due to excessive decrease in the oxygen permeability.

[Image-Recording Layer]

The image-recording layer for use in the lithographic printing plate precursor according to the invention contains (C) a radical polymerization initiator and (D) a radical polymerizable compound, and may contain (E) other optional components.

(C) Radical Polymerization Initiator

The image-recording layer of the invention contains a radical polymerization initiator. As the radical polymerization initiator in the invention, initiator compounds known to those skilled in the art can be used without limitation. Specifically, the initiator compound includes, for example, a trihalomethyl compound, a carbonyl compound, an organic peroxide, an azo compound, an azide compound, a metallocene compound, a hexaarylbiimidazole compound, an organic boron compound, a disulfone compound, an oxime ester compound, an onium salt compound and a iron arene complex. Among them, at least one compound selected from the hexaarylbiimidazole compound, onium salt compound, trihalomethyl compound and metallocene compound is preferred, and the hexaarylbiimidazole compound or the onium salt compound is particularly preferred. Two or more kinds of the polymerization initiators may be appropriately used in combination.

The hexaarylbiimidazole compound includes, for example, lophine dimers described in European Patents 24,629 and 107,792 and U.S. Pat. No. 4,410,621, specifically, 2,2'-bis(o-chlorophenyl)-4,4',5,5'-tetraphenylbiimidazole,
2,2'-bis(o-bromophenyl)-4,4',5,5'-tetraphenylbiimidazole,
2,2'-bis(o,p-dichlorophenyl)-4,4',5,5'-tetraphenylbiimidazole,
2,2'-bis(o-chlorophenyl)-4,4',5,5'-tetra(m-methoxyphenyl) biimidazole,
2,2'-bis(o,o'-dichlorophenyl)-4,4',5,5'-tetraphenylbiimidazole,
2,2'-bis(o-nitrophenyl)-4,4',5,5'-tetraphenylbiimidazole,
2,2'-bis(o-methylphenyl)-4,4',5,5'-tetraphenylbiimidazole and
2,2'-bis(o-trifluoromethylphenyl)-4,4',5,5'-tetraphenylbiimidazole.

The hexaarylbiimidazole compound is particularly preferably used together with a sensitizing dye having an absorption maximum in a wavelength range from 300 to 450 nm.

The onium salt compound preferably used in the invention includes a sulfonium salt, an iodonium salt and a diazonium salt. Particularly, a diaryliodonium salt or a triarylsulfonium salt is preferably used. The onium salt compound is particularly preferably used together with an infrared absorbing agent having an absorption maximum in a wavelength range from 750 to 1,400 nm.

In addition, polymerization initiators described in [0071] to [0129] of JP-A-2007-206217 are preferably used.

The polymerization initiators are preferably used individually or in combination of two or more thereof according to the invention.

The amount of the polymerization initiator used in the image-recording layer according to the invention is preferably from 0.01 to 20% by weight, more preferably from 0.1 to 15% by weight, still more preferably from 1.0 to 10% by weight, based on the total solid content of the image-recording layer.

(D) Radical Polymerizable Compound

The radical polymerizable compound for use in the image-recording layer according to the invention is an addition-polymerizable compound having at least one ethylenically unsaturated double bond and it is selected from compounds having at least one, preferably two or more, terminal ethylenically unsaturated double bonds. The polymerizable compound has a chemical form, for example, a monomer, a prepolymer, specifically, a dimer, a timer or an oligomer, or a mixture thereof. Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with a polyhydric alcohol compound and amides of an unsaturated carboxylic acid with a polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group, with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used. These compounds are described in references including JP-T-2006-508380 (the term "JP-T" as used herein means a published Japanese translation of a PCT patent application), JP-A-2002-287344, JP-A-2008-256850, JP-A-2001-342222, JP-A-9-179296, JP-A-9-179297, JP-A-9-179298, JP-A-2004-294935, JP-A-2006-243493, JP-A-2002-275129, JP-A-2003-64130, JP-A-2003-280187 and JP-A-10-333321.

Specific examples of the monomer, which is an ester of a polyhydric alcohol compound with an unsaturated carboxylic acid, include, as an acrylic acid ester, for example, ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (BO) modified triacrylate and polyester acrylate oligomer. As a methacrylic acid ester, for example, tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane and bis[p-(methacryloxyethoxy)phenyl]dimethylmethane are exemplified. Specific examples of the monomer, which is an amide of a polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Urethane type addition-polymerizable compounds produced using an addition reaction between an isocyanate and a hydroxy group are also preferably used and specific examples thereof include vinylurethane compounds having two or more polymerizable vinyl groups per molecule obtained by adding a vinyl monomer containing a hydroxy group represented by formula (2) shown below to a polyisocyanate compound having two or more isocyanate groups per molecule, described in JP-B-48-41708 (the term "JP-B" as used herein means an "examined Japanese patent publication").

$$CH_2=C(R^4)COOCH_2CH(R^5)OH \qquad (2)$$

wherein $R^4$ and $R^5$ each independently represents H or $CH_3$.

Also, urethane acrylates as described in JP-A-51-37193, JP-B-2-32293, JP-B-2-16765, JP-A-2003-344997 and JP-A-2006-65210, urethane compounds having an ethylene oxide skeleton described in JP-B-58-49860, JP-B-56-17654, JP-B-62-39417, JP-B-62-39418, JP-A-2000-250211 and JP-A-2007-94138, and urethane compounds having a hydrophilic group described in U.S. Pat. No. 7,153,632, JP-T-8-505958, JP-A-2007-293221 and JP-A-2007-293223 are preferably used.

Details of the method of using the polymerizable compound, for example, selection of the structure, individual or combination use or an amount added, can be appropriately determined in accordance with the characteristic design of the final lithographic printing plate precursor. The polymerizable compound is used preferably in a range from 5 to 75% by weight, more preferably in a range from 25 to 70% by weight, particularly preferably in a range from 30 to 60% by weight, based on the total solid content of the image-recording layer.

(E) Other Components

The image-recording layer for use in the invention may contain a binder, a sensitizing dye, a light-absorbing agent or the like in addition to the radical polymerization initiator and radical polymerizable compound described above.

(Binder)

As the binder, a polymer capable of holding the components of image-recording layer on a support and capable of being removed by a developer or capable of being removed on a printing machine is used. The binder used includes, for example, a (meth)acrylic polymer, a polyurethane resin, a polyvinyl alcohol resin, a polyvinyl butyral resin, a polyvinyl formal resin, a polyamide resin, a polyester resin and an epoxy resin. Particularly, a (meth)acrylic polymer or a polyurethane resin is preferably used. The resin may have any of a straight-chain, graft or star-like form. Also, the constituting component of the resin may be a random or block form.

The term "(meth)acrylic polymer" as used herein means a copolymer containing as a polymerization component, (meth)acrylic acid or a (meth)acrylic acid derivative, for example, a (meth)acrylate (including, for example, an alkyl ester, an aryl ester and an allyl ester), (meth)acrylamide or a (meth)acrylamide derivative. The term "polyurethane resin" as used herein means a polymer formed by a condensation reaction of a compound having two or more isocyanate groups and a compound having two or more hydroxy groups. The term "polyvinyl butyral resin" as used herein means a polymer synthesized by a reaction (acetalization reaction) of polyvinyl alcohol obtained by partial or full saponification of polyvinyl acetate with butylaldehyde under an acidic condition and includes a polymer wherein an acid group or the like is introduced by a method of reacting the remaining hydroxy group of polymer with a compound having the acid group or the like.

One preferred example of the binder capable of being removed with a developer having pH from 2 to 14 according to the invention is a copolymer containing a repeating unit having an acid group. Examples of the acid group include a carboxylic acid group, a sulfonic acid group, a phosphonic acid group, a phosphoric acid group, a phenolic hydroxy group and a sulfonamido group. Particularly, a carboxylic acid group is preferred. As the repeating unit having an acid group, a repeating unit derived from (meth)acrylic acid or a repeating unit represented by formula (3) shown below is preferably used.

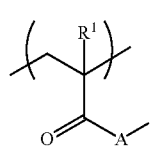

(3)

In formula (3), $R^1$ represents a hydrogen atom or a methyl group, $R^2$ represents a single bond or an n+1 valent connecting group, A represents an oxygen atom or $-NR^3-$, wherein $R^3$ represents a hydrogen atom or a monovalent hydrocarbon group having from 1 to 10 carbon atoms, and n represents an integer of 1 to 5.

The connecting group represented by $R^2$ in formula (3) is constructed from a carbon atom, a hydrogen atom, an oxygen atom, a nitrogen atom, a sulfur atom and a halogen atom and preferably contains from 1 to 80 atoms. Specific examples of the connecting group include an alkylene group, a substituted alkylene group, an arylene group and a substituted arylene group. The connecting group may have a structure wherein a plurality of such divalent groups is connected to each other via an amido bond or an ester bond. $R^2$ is preferably a single bond, an alkylene group or a substituted alkylene group, particularly preferably a single bond, an alkylene group having from 1 to 5 carbon atoms or a substituted alkylene group having from 1 to 5 carbon atoms, and most preferably a single bond, an alkylene group having from 1 to 3 carbon atoms or a substituted alkylene group having from 1 to 3 carbon atoms.

Examples of the substituent include a monovalent nonmetallic atomic group exclusive of a hydrogen atom, for example, a halogen atom (e.g., —F, —Br, —Cl or —I), a hydroxy group, an alkoxy group, an aryloxy group, a mercapto group, an acyl group, a carboxyl group and a conjugate base group thereof, an alkoxycarbonyl group, an aryloxycarbonyl group, a carbamoyl group, an aryl group, an alkenyl group and an alkynyl group.

$R^3$ is preferably a hydrogen atom or a hydrocarbon group having from 1 to 5 carbon atoms, particularly preferably a hydrogen atom or a hydrocarbon group having from 1 to 3 carbon atoms, and most preferably a hydrogen atom or a methyl group. n is preferably from 1 to 3, particularly preferably 1 or 2, and most preferably 1.

A ratio of the copolymerization component having a carboxylic acid group in the total copolymerization component of the binder is preferably from 1 to 70% by mole in view of development property. Considering good compatibility between the development property and printing durability, it is more preferably from 1 to 50% by mole, and particularly preferably from 1 to 30% by mole.

One preferred example of the binder capable of being removed with dampening water and/or printing ink on a printing machine according to the invention is a copolymer containing a repeating unit having a hydrophilic group. Examples of the hydrophilic group include a carboxylic acid (salt) group, a sulfonic acid (salt) group, a hydroxy group, a carbonamido group, a sulfuric acid (salt) group, a carbobetaine group, a sulfobetaine group, a phosphobetaine group, an N-oxide group, an ammonium group, $-(CH_2CH_2O)_nR$, $-(C_3H_6O)_mR$ (wherein R represents a hydrogen atom, an alkyl group having from 1 to 12 carbon atoms, an aryl group, an alkenyl group or an alkynyl group, and n and m each represents an integer from 1 to 100), and a combination of these groups. Of the hydrophilic groups, a sulfonic acid (salt) group, a hydroxy group, a carbonamido group, a carbobetaine group, a sulfobetaine group, a phosphobetaine group or $-(CH_2CH_2O)_nR$ is more preferred, and a carbonamido group or $-(CH_2CH_2O)_nR$ is particularly preferred.

A ratio of the copolymerization component having a hydrophilic group in the total copolymerization component of the binder is preferably from 1 to 70% by mole in view of development property. Considering good compatibility between the development property and printing durability, it is more preferably from 1 to 60% by mole, and particularly preferably from 1 to 50% by mole.

It is preferred that the binder for use in the invention further contains a crosslinkable group. The term "crosslinkable group" as used herein means a group capable of crosslinking the binder in the process of a radical polymerization reaction which is caused in the image-recording layer, when the lithographic printing plate precursor is exposed to light. The crosslinkable group is not particularly restricted as long as it has such a function and includes, for example, an ethylenically unsaturated bond group, an amino group or an epoxy group as a functional group capable of undergoing an addition polymerization reaction. Also, a functional group capable of forming a radical upon irradiation with light may be used and such a crosslinkable group includes, for example, a thiol group and a halogen atom. Among them, the ethylenically unsaturated bond group is preferred. The ethylenically unsaturated bond group preferably includes a styryl group, a (meth)acryloyl group and an allyl group.

In the binder, for example, a free radical (a polymerization initiating radical or a propagating radical in the process of polymerization of the polymerizable compound) is added to the crosslinkable functional group to cause an addition-polymerization between the polymers directly or through a polymerization chain of the polymerizable compound, as a result, crosslinking is formed between the polymer molecules to effect curing. Alternatively, an atom (for example, a hydrogen atom on the carbon atom adjacent to the functional crosslinkable group) in the polymer is withdrawn by a free radical to produce a polymer radical and the polymer radicals combine with each other to form crosslinking between the polymer molecules to effect curing.

The content of the crosslinkable group (content of radical-polymerizable unsaturated double bond determined by iodine titration) in the binder is preferably from 0.01 to 10.0 mmol, more preferably from 0.05 to 5.0 mmol, and most preferably from 0.1 to 2.0 mmol, per g of the binder.

The binder for use in the invention may contain a polymerization unit of alkyl (meth)acrylate or aralkyl (meth)acrylate besides the polymerization unit having an acid group and the polymerization unit having a crosslinkable group. The alkyl group in the alkyl (meth)acrylate is preferably an alkyl group having from 1 to 5 carbon atoms and more preferably a methyl group. The aralkyl (meth)acrylate includes, for example, benzyl (meth)acrylate.

The binder preferably has a weight average molecular weight (Mw) of 5,000 or more, more preferably from 10,000 to 300,000, and a number average molecular weight (Mn) of 1,000 or more, more preferably from 2,000 to 250,000. The polydispersity (Mw/Mn) is preferably from 1.1 to 10.

The binders may be used individually or in combination of two or more thereof. The content of the binder is preferably from 5 to 75% by weight, more preferably from 10 to 70% by weight, still more preferably from 10 to 60% by weight, based on the total solid content of the image-recording layer, from the standpoint of good strength of the image area and good image-forming property.

The total content of the polymerizable compound and the binder is preferably 80% by weight or less based on the total solid content of the image-recording layer. The total content of 80% by weight or less is preferred because decrease in the sensitivity and deterioration in the development property may be prevented. The total content is more preferably from 35 to 75% by weight.

(Sensitizing Dye)

The image-recording layer according to the invention preferably contains a sensitizing dye. The sensitizing dye can be used without particular limitation as far as it absorbs light at the image exposure to form the excited state and provides energy to the polymerization initiator described above with electron transfer, energy transfer or heat generation thereby improving the polymerization initiation function. Particularly, a sensitizing dye having an absorption maximum in a wavelength range from 300 to 450 nm or from 750 to 1,400 nm is preferably used.

Examples of the sensitizing dye having an absorption maximum in a wavelength range from 300 to 450 nm include merocyanine dyes, benzopyranes, coumarins, aromatic ketones, anthracenes, styryls and oxazoles.

Of the sensitizing dyes having an absorption maximum in a wavelength range from 300 to 450 nm, a dye represented by formula (4) shown below is more preferable in view of high sensitivity.

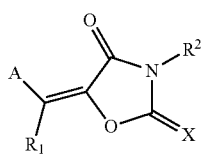

(4)

In formula (4), A represents an aryl group which may have a substituent or a heteroaryl group which may have a substituent, X represents an oxygen atom, a sulfur atom or =N($R_3$), and $R_1$, $R_2$ and $R_3$ each independently represents a monovalent non-metallic atomic group, or A and $R_1$ or $R_2$ and $R_3$ may be combined with each other to form an aliphatic or aromatic ring.

The formula (4) will be described in more detail below. $R_1$, $R_2$ and $R_3$ each independently represents a monovalent non-metallic atomic group, preferably a hydrogen atom, a substituted or unsubstituted alkyl group, a substituted or unsubstituted alkenyl group, a substituted or unsubstituted aryl group, a substituted or unsubstituted heteroaryl group, a substituted or unsubstituted alkoxy group, a substituted or unsubstituted alkylthio group, a hydroxy group or a halogen atom.

Specific examples of such a sensitizing dye preferably used include compounds described in Paragraph Nos. [0047] to [0053] of JP-A-2007-58170, Paragraph Nos. [0036] to [0037] of JP-A-2007-93866 and Paragraph Nos. [0042] to [0047] of JP-A-2007-72816, Further, sensitizing dyes described in JP-A-2006-189604, JP-A-2007-171406, JP-A-2007-206216, JP-A-2007-206217, JP-A-2007-225701, JP-A-2007-225702, JP-A-2007-316582 and JP-A-2007-328243 are also preferably used.

The sensitizing dyes may be used only one kind or in combination of two or more kinds thereof.

Next, the sensitizing dye having an absorption maximum in a wavelength range from 750 to 1,400 (hereinafter, also referred to as an "infrared absorbing agent") preferably used in the invention is described in detail below. The infrared absorbing agent used is preferably a dye or a pigment.

As the dye, commercially available dyes and known dyes described in literatures, for example, Senryo Binran (Dye Handbook) compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Of the dyes, cyanine dyes, squarylium dyes, pyrylium dyes, nickel thiolate complexes and indolenine cyanine dyes are particularly preferred. Further, cyanine dyes and indolenine cyanine dyes are more preferred. As particularly preferable examples of the dye, cyanine dyes represented by formula (a) shown below are exemplified.

Formula (a):

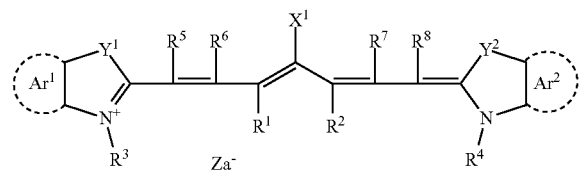

In formula (a), $X^1$ represents a hydrogen atom, a halogen atom, —N($R^9$)($R^{10}$), —$X^2$-$L^1$ or a group shown below. $R^9$ and $R^{10}$, which may be the same or different, each represents an aromatic hydrocarbon group having from 6 to 10 carbon atoms, which may have a substituent, an alkyl group having from 1 to 8 carbon atoms or a hydrogen atom or $R^9$ and $R^{10}$ may be combined with each other to from a ring, and preferably represents a phenyl group. $X^2$ represents an oxygen atom or a sulfur atom, $L^1$ represents a hydrocarbon group having from 1 to 12 carbon atoms, an aromatic cyclic group containing a hetero atom or a hydrocarbon group having from 1 to 12 carbon atoms and containing a hetero atom. The hetero atom as used herein means a nitrogen atom, a sulfur atom, an oxygen atom, a halogen atom or a selenium atom. In the group shown below, $Xa^-$ has the same meaning as $Za^-$ defined hereinafter. $R^a$ represents a hydrogen atom or a substituent selected from an alkyl group, an aryl group, a substituted or unsubstituted amino group and a halogen atom.

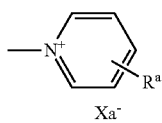

$R^1$ and $R^2$ each independently represents a hydrocarbon group having from 1 to 12 carbon atoms. In view of the preservation stability of a coating solution for image-recording layer, it is preferred that $R^1$ and $R^2$ each represents a hydrocarbon group having two or more carbon atoms. Also, $R^1$ and $R^2$ may be combined with each other to form a ring and in case of forming the ring, to form a 5-membered or 6-membered ring is particularly preferred.

$Ar^1$ and $Ar^2$, which may be the same or different, each represents an aryl group which may have a substituent. Preferable examples of the aryl group include a benzene ring group and a naphthalene ring group. Preferable examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. From the standpoint of the availability of raw materials, a hydrogen atom is preferred. $Za^-$ represents a counter anion. However, $Za^-$ is not necessary when the cyanine dye represented by formula (a) has an anionic substituent in the structure thereof and the neutralization of charge is not needed. Preferable examples of the counter ion for $Za^-$ include a halide ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion in view of the preservation stability of a coating solution for image-recording layer.

Specific examples of the cyanine dye represented by formula (a) preferably used in the invention include compounds described in Paragraph Nos. [0017] to [0019] of JP-A-2001-133969, Paragraph Nos. [0012] to [0021] of JP-A-2002-23360 and Paragraph Nos. [0012] to [0037] of JP-A-2002-40638, preferably compounds described in Paragraph Nos. [0034] to [0041] of JP-A-2002-278057 and Paragraph Nos. [0080] to [0086] of JP-A-2008-195018, and particularly preferably compounds described in Paragraph Nos. [0035] to [0043] of JP-A-2007-90850, Further, compounds described in Paragraph Nos. [0008] to [0009] of JP-A-5-5005 and Paragraph Nos. [0022] to [0025] of JP-A-2001-222101 are also preferably used.

The infrared absorbing dyes may be used only one kind or in combination of two or more kinds thereof and may be used together with an infrared absorbing agent other than the infrared absorbing dye, for example, a pigment. As the pigment, compounds described in Paragraph Nos. [0072] to [0076] of JP-A-2008-195018 are preferred.

The amount of the sensitizing dye added is preferably from 0.05 to 30% by weight, more preferably from 0.1 to 20% by weight, most preferably from 0.2 to 10% by weight, based on the total solid content of the image-recording layer.

(Other Components of Image-Recording Layer)

Into the image-recording layer according to the invention, various additives can be further incorporated, if desired. Examples of the additive include a surfactant for progressing the development property and improving the surface state of coated layer, a microcapsule for providing good compatibility between the development property and printing durability, a hydrophilic polymer for improving the development property and dispersion stability of microcapsule, a coloring agent or print-out agent for visually distinguishing the image area from the non-image area, a polymerization inhibitor for preventing undesirable thermal polymerization of the radical polymerizable compound during the production or preservation of the image-recording layer, a hydrophobic low molecular weight compound, for example, a higher fatty acid derivative for avoiding polymerization inhibition due to oxygen, a fine inorganic particle for increasing strength of the cured layer in the image area, a fine organic particle, a hydrophilic low molecular weight compound for improving the development property, a co-sensitizer or chain transfer agent for increasing sensitivity, and a plasticizer for improving plasticity. As the additives, known compounds are used and, for example, compounds described in Paragraph Nos. [0161] to [0215] of JP-A-2007-206217, Paragraph No. [0067] of JP-T-2005-509192, Paragraph Nos. [0023] to [0026] and [0059] to [0066] of JP-A-2004-310000 are used. With respect to the surfactant, surfactants which may be added to a developer described hereinafter may be used.

The image-recording layer preferably contains a chain transfer agent. The chain transfer agent is defined, for example, in *Kobunshi Jiten (Polymer Dictionary)*, Third Edition, pages 683 to 684, edited by The Society of Polymer Science, Japan (2005). As the chain transfer agent, for example, compounds having SH, PH, SiH or GeH in their molecules are used. The compound donates a hydrogen to a low active radical species to generate a radical or is oxidized and then deprotonized to generate a radical.

In the image-recording layer according to the invention, a thiol compound (for example, a 2-mercaptobenzimidazole, a 2-mercaptobenzothiazole, a 2-mercaptobenzoxazole, a 3-mercaptotriazole or a 5-mercaptotetrazole) is preferably used.

The content of the chain transfer agent is preferably from 0.01 to 20 parts by weight, more preferably from 1 to 10 parts by weight, most preferably from 1 to 5 parts by weight, per 100 parts by weight of the total solid content of the image-recording layer.

The image-recording layer according to the invention may contain a hydrophilic low molecular weight compound in order to improve the on-press development property. As the hydrophilic low molecular weight compound, a polyol compound, an organic sulfate compound, an organic sulfonate compound and a betaine compound are preferred.

Specific examples of the organic sulfonate compound include an alkylsulfonate, for example, sodium n-butylsulfonate, sodium n-hexylsulfonate, sodium 2-ethylliexylsulfonate, sodium cyclohexylsulfonate or sodium n-octylsulfonate; an alkylsulfonate containing an ethylene oxide chain, for example, sodium 5,8,11-trioxapentadecane-1-sulfonate, sodium 5,8,11-trioxaheptadecane-1-sulfonate, sodium 13-ethyl-5,8,11-trioxaheptadecane-1-sulfonate or sodium 5,8,11,14-tetraoxatetracosane-1-sulfonate; an arylsulfonate, for example, sodium benzenesulfonate, sodium p-toluenesulfonate, sodium p-hydroxybenzenesulfonate, sodium p-styrenesulfonate, sodium isophthalic acid dimethyl-5-sulfonate, sodium 1-naphtylsulfonate, sodium 4-hydroxynaphtylsulfonate, disodium 1,5-naphthalenedisulfonate or trisodium 1,3,6-naphthalenetrisulfonate. The salt may also be a potassium salt or a lithium salt.

The organic sulfate compound includes a sulfate of alkyl, alkenyl, alkynyl, aryl or heterocyclic monoether of polyethylene oxide. The number of ethylene oxide unit is preferably from 1 to 4. The salt is preferably a sodium salt, a potassium salt or a lithium salt.

As the betaine compound, a compound wherein a number of carbon atoms included in a hydrocarbon substituent on the nitrogen atom is from 1 to 5 is preferred. Specific examples thereof include trimethylammonium acetate, dimethylpropylammonium acetate, 3-hydroxy-4-trimethylammoniobutyrate, 4-(1-pyridinio)butyrate, 1-hydroxyethyl-1-imidazolioacetate, trimethylammonium methanesulfonate, dimethylpropylammonium methanesulfonate, 3-trimethylammonio-1-porpanesulfonate and 3-(1-pyridinio)-1-porpanesulfonate.

The amount of the hydrophilic low molecular weight compound added to the image-recording layer is preferably from 0.5 to 20% by weight, more preferably from 1 to 10% by weight, based on the total solid content of the image-recording layer.

In order to improve the ink receptivity, an oil-sensitizing agent, for example, a phosphonium compound, a nitrogen-containing low molecular weight compound or an ammonium group-containing polymer can be used in the image-recording layer according to the invention. The oil-sensitizing agent is effective in case of the image-recording layer capable of undergoing on-press development.

In particular, in the case where an inorganic stratiform compound is incorporated into a protective layer, the oil-sensitizing agent functions as a surface covering agent of the inorganic stratiform compound and prevents deterioration of the ink receptivity during printing due to the inorganic stratiform compound.

As preferred examples of the phosphonium compound, phosphonium compounds described in JP-A-2006-297907 and JP-A-2007-50660 are exemplified. Specific examples of the phosphonium compound include tetraphenylphosphonium bromide and 1,9-bis(triphenylphosphonio)nonane naphthalene-2,7-disulfonate.

As the nitrogen-containing low molecular weight compound, an amine salt and a quaternary ammonium salt are exemplified. Also, an imidazolinium salt, a benzimidazolinium salt, a pyridinium salt and a quinolinium salt are exemplified. Of the nitrogen-containing low molecular weight compounds, the quaternary ammonium salt and pyridinium salt are preferably used. Specific examples the nitrogen-containing low molecular weight compound include tetrabutylammonium hexafluorophosphate, dodecyltrimethylammonium p-toluenesulfonate, benzyltriethylammonium hexafluorophosphate, benzyldimethyloctylammonium hexafluorophosphate and benzyldimethyldodecylammonium hexafluorophosphate.

As the ammonium group-containing polymer, polymers described in JP-A-2009-208458, for example, 2-(trimethylammonio)ethyl methacrylate p-toluenesulfonate/3,6-dioxaheptyl methacrylate copolymer, 2-(trimethylammonio)ethyl methacrylate hexafluorophosphate/2-ethylhexyl methacrylate copolymer or 2-(butyldimethylammonio)ethyl methacrylate hexafluorophosphate/3,6-dioxaheptyl methacrylate copolymer are exemplified.

The content of the oil-sensitizing agent is preferably from 0.01 to 30.0% by weight, more preferably from 0.1 to 15.0% by weight, still more preferably from 1 to 10% by weight, based on the total solid content of the image-recording layer.

(Formation of Image-Recording Layer)

The image-recording layer according to the invention is formed by dispersing or dissolving each of the necessary components described above in a solvent to prepare a coating solution and coating the solution. The solvent used include, for example, methyl ethyl ketone, ethylene glycol monomethyl ether, 1-methoxy-2-propanol, 2-methoxyethyl acetate, 1-methoxy-2-propyl acetate and γ-butyrolactone, but the invention should not be construed as being limited thereto. The solvents may be used individually or as a mixture. The solid content concentration of the coating solution is preferably from 1 to 50% by weight.

The coating amount (solid content) of the image-recording layer on the support after the coating and drying is preferably from 0.3 to 3.0 g/m$^2$. Various methods can be used for the coating. Examples of the method include bar coater coating, spin coating, spray coating, curtain coating, dip coating, air knife coating, blade coating and roll coating.

[Support]

The support for use in the lithographic printing plate precursor according to the invention is not particularly restricted as long as it is a dimensionally stable plate-like hydrophilic support. Particularly, an aluminum plate is preferred. In advance of the use of an aluminum plate, the aluminum plate is preferably subjected to a surface treatment, for example, roughening treatment or anodizing treatment. The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively). With respect to the treatments, methods described in Paragraph Nos. [0241] to [0245] of JP-2007-206217 can be preferably used.

The support preferably has center line average roughness from 0.10 to 1.2 μm. In the range described above, good adhesion property to the image-recording layer, good printing durability and good resistance to stain are achieved.

Also, the color density of the support is preferably from 0.15 to 0.65 in terms of the reflection density value. In the range described above, good image-forming property by prevention of halation at the image exposure and good aptitude for plate inspection after development are achieved.

The thickness of the support is preferably from 0.1 to 0.6 mm, more preferably from 0.15 to 0.4 mm, and still more preferably from 0.2 to 0.3 mm.

[Hydrophilizing Treatment of Support and Undercoat Layer]

As for the lithographic printing plate precursor according to the invention, in order to increase hydrophilicity of the non-image area and to prevent printing stain, it is preferred to conduct hydrophilizing treatment for the surface of support or to provide an undercoat layer between the support and the image-recording layer.

The hydrophilizing treatment for the surface of support includes an alkali metal silicate treatment method wherein the support is subjected to an immersion treatment or an electrolytic treatment in an aqueous solution, for example, of sodium silicate, a method of treating with potassium fluorozirconate, a method of treating with polyvinylphosphonic acid and a method of treating with polyacrylic acid. An immersion treatment in an aqueous solution, for example, of sodium silicate or a method of immersion treatment in an aqueous polyvinylphosphonic acid solution is preferably used.

As the undercoat layer, an undercoat layer containing a compound having an acid group, for example, a phosphonic acid group, a phosphoric acid group or a sulfonic acid group is preferably used. The compound preferably further has a polymerizable group in order to increase the adhesion property to the image-recording layer. As the polymerizable group, an ethylenically unsaturated bond group is preferred. Further, a compound having a hydrophilicity-imparting group, for example, an ethylene oxide group is exemplified as a preferred compound.

These compounds may be low molecular weight compounds or polymer compounds. Also, these compounds may be used as a mixture of two or more thereof, if desired.

For example, a silane coupling agent having an addition-polymerizable ethylenically unsaturated bond group described in JP-A-10-282679 and a phosphorus compound having an ethylenically unsaturated bond group described in JP-A-2-304441 are preferably exemplified. Low molecular weight compounds or polymer compounds having a cross-linkable group (preferably an ethylenically unsaturated bond group), a functional group capable of interacting with the surface of support and a hydrophilic group described in JP-A-2005-238816, JP-A-2005-125749, JP-A-2006-239867 and JP-A-2006-215263 are also preferably used.

The undercoat layer can be coated by a known method. The coating amount (solid content) of the undercoat layer is preferably from 0.1 to 100 mg/m$^2$, and more preferably from 1 to 30 mg/m$^2$.

[Backcoat Layer]

A backcoat layer can be provided on the back surface of the support after conducting the surface treatment to the surface of support or forming the undercoat layer on the surface of support, if desired.

The backcoat layer preferably includes, for example, a coating layer comprising an organic polymer compound described in JP-A-5-45885 and a coating layer comprising a metal oxide obtained by hydrolysis and polycondensation of an organic metal compound or an inorganic metal compound described in JP-A-6-35174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting materials are inexpensive and easily available.

[Plate Making Method]

The plate making method of the lithographic printing plate precursor according to the invention is preferably a method including at least a step of imagewise exposing the lithographic printing plate precursor (hereinafter, also referred to as a "exposure step") and a step of development processing of the lithographic printing plate precursor with a processing solution (hereinafter, also referred to as a "development step").

<Exposure Step>

Although the lithographic printing plate precursor for use in the invention can be subjected to image recording by a method of scanning exposure of digital data by laser, for example, visible laser or infrared laser or a method of exposing through a transparent original having an image recorded using a light source, for example, a halogen lamp or a high pressure mercury lamp, the method of scanning exposure of digital data by laser, for example, visible laser or infrared laser is preferred.

The wavelength of the exposure light source is preferably from 300 to 450 nm or from 750 to 1,400 nm. In case of exposing with light of 300 to 450 nm, the lithographic printing plate precursor having an image-recording layer containing a sensitizing dye having an absorption maximum in such a wavelength range is used. In case of exposing with light of 750 to 1,400 nm, the lithographic printing plate precursor containing an infrared absorbing agent which is a sensitizing dye having an absorption maximum in such a wavelength range is used. As the light source of 300 to 450 nm, a semiconductor laser is preferably used. As the light source of 750 to 1,400 nm, a solid laser or semiconductor laser emitting an infrared ray is preferably used. The exposure mechanism may be any of an internal drum system, an external drum system and a flat bed system.

<Development Step>

After the exposure, the lithographic printing plate precursor for use in the invention is developed with water or an aqueous solution having pH from 2 to 14 (processing with developer) or developed with dampening water and ink on a printing machine (on-press development).

The processing with developer is ordinarily practiced according to the following steps: (1) removing the non-image area with a developer, (2) conducting gumming solution treatment and (3) drying in a drying step. Although the lithographic printing plate precursor for use in the invention can be developed according to the conventional steps described above (conventional development), it is preferred to conduct steps (1) and (2) simultaneously (simple development). In any of the development methods, a water washing step for removing a protective layer may be provided before step (1). The development of step (1) is conducted according to a conventional manner at temperature approximately from 0 to 60° C., preferably from 15 to 40° C., using, for example, a method wherein the imagewise exposed lithographic printing plate precursor is immersed in a developer and rubbed with a brush or a method wherein a developer is sprayed to the imagewise exposed lithographic printing plate precursor by a spray and the lithographic printing plate precursor is rubbed with a brush.

In case of the conventional development, a water washing step for removing an excess developer may be provided between step (1) and step (2). The developer used in step (1) is preferably a known alkali developer.

In case of the simple development, it is preferred that after the development and gumming treatment, an excess developer is removed using a squeeze roller and then drying is conducted.

The developer for use in the simple development is an aqueous solution having pH from 2 to 11. An aqueous solution containing water as the main component (containing 60% by weight or more of water) is preferred. In particular, an aqueous solution containing a surfactant (for example, an anionic, nonionic, cationic or amphoteric surfactant) or an aqueous solution containing a water-soluble polymer compound is preferred. An aqueous solution containing both the surfactant and the water-soluble polymer compound is also preferred. The pH of the developer is preferably from 5 to 10.7, more preferably from 6 to 10.5, and most preferably from 7.5 to 10.3.

The anionic surfactant for use in the developer for the simple development is not particularly limited and includes, for example, fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkyldiphenylether (di)sulfonic acid salts, alkylphenoxy polyoxyethylene propylalkylsulfonic acid salts, polyoxyethylene alkylsulfophenyl ether salts, N-methylalkyl-N-oleyltaurine sodium salt, N-alkylsulfosuccinic acid monoamide disodium salts, petroleum sulfonic acid salts, sulfated castor oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, alkylbenzenesulfonic acid salts, alkylnaphthalenesulfonic acid salts and alkyldiphenylether (di) sulfonic acid salts are particularly preferably used.

The cationic surfactant for use in the developer for the simple development is not particularly limited and conventionally known cationic surfactants can be used. Examples of the cationic surfactant include alkylamine salts, quaternary ammonium salts, alkylimidazolinium salts, polyoxyethylene alkyl amine salts and polyethylene polyamine derivatives.

The nonionic surfactant for use in the developer for the simple development is not particularly limited and includes, for example, polyethylene glycol type higher alcohol ethylene oxide adducts, alkylphenol ethylene oxide adducts, alkylnaphthol ethylene oxide adducts, phenol ethylene oxide adducts, naphthol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide addacts of fat, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines. Of the compounds, those having an aromatic ring and an ethylene oxide chain are preferred and alkyl-substituted or unsubstituted phenol ethylene oxide adducts and alkyl-substituted or unsubstituted naphthol ethylene oxide adducts are more preferred.

The amphoteric surfactant for use in the developer for the simple development is not particularly limited and includes, for example, amine oxide type, for example, alkyldimethylamine oxide, betaine type, for example, alkyl betaine, and amino acid type, for example, sodium salt of alkylamino fatty acid. In particular, alkyldimethylamine oxide which may have a substituent, alkyl carboxy betaine which may have a substituent and alkyl sulfo betaine which may have a substituent are preferably used. Specific examples of the amphoteric surfactant include compounds described in Paragraph Nos. [0255] to [0278] and compounds represented by formula (2) in Paragraph No. [0256] of JP-A-2008-203359, compounds described in Paragraph Nos. [0028] to [0052] and compounds represented by formulae (1), (II) and (VI) in Paragraph No. [0028] of JP-A-2008-276166 and compounds described in Paragraph Nos. [0022] to [0029] of JP-A-2009-47927.

Two or more of the surfactants may be used in combination. The content of the surfactant in the developer is preferably from 0.01 to 20% by weight, and more preferably from 0.1 to 10% by weight.

The water-soluble polymer compound for use in the developer for the simple development includes, for example, soybean polysaccharide, modified starch, gum arabic, dextrin, a cellulose derivative (for example, carboxymethyl cellulose, carboxyethyl cellulose or methyl cellulose) or a modified product thereof, pullulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer, a styrene/maleic anhydride copolymer, polyvinylsulfonic acid or a salt thereof and polystyrenesulfonic acid or a salt thereof.

As the soybean polysaccharide, known soybean polysaccharide can be used. For example, as a commercial product, SOYAFIVE (trade name, produced by Fuji Oil Co., Ltd.) is available and various grade products can be used. The soybean polysaccharide preferably used is that having viscosity in a range from 10 to 100 mPa/sec in the 10% by weight aqueous solution thereof.

As the modified starch, known modified starch can be used. The modified starch can be prepared, for example, by a method wherein starch, for example, of corn, potato, tapioca, rice or wheat is decomposed, for example, with an acid or an enzyme to an extent that the number of glucose residue per molecule is from 5 to 30 and then oxypropylene is added thereto in an alkali.

Two or more of the water-soluble polymer compounds may be used in combination. The content of the water-soluble polymer compound in the developer is preferably from 0.1 to 20% by weight, and more preferably from 0.5 to 10% by weight.

Into the developer for use in the simple development, a pH buffer agent may further be incorporated.

As the pH buffer agent according to the invention, any pH buffer agent exhibiting a pH buffer function at pH from 2 to 11 can be preferably used. In the invention, a weak alkaline buffer agent is preferably used and includes, for example, (a) a carbonate ion and a hydrogen carbonate ion, (b) a borate ion, (c) a water-soluble amine compound and an ion of the water-soluble amine compound, and combinations thereof. Specifically, for example, (a) a combination of a carbonate ion and a hydrogen carbonate ion, (b) a borate ion, or (c) a combination of a water-soluble amine compound and an ion of the water-soluble amine compound exhibits a pH buffer function in the developer to prevent fluctuation of the pH even when the developer is used for a long period of time. As a result, for example, the deterioration of development property resulting from the fluctuation of pH and the occurrence of development scum are restrained. The combination of a carbonate ion and a hydrogen carbonate ion is particularly preferred.

In order for a carbonate ion and a hydrogen carbonate ion to be present in the developer, a carbonate and a hydrogen carbonate may be added to the developer or a carbonate ion and a hydrogen carbonate ion may be generated by adding a carbonate or a hydrogen carbonate to the developer and then adjusting the pH. The carbonate or hydrogen carbonate used is not particularly restricted and it is preferably an alkali metal salt thereof. Examples of the alkali metal include lithium, sodium and potassium and sodium is particularly preferable. The alkali metals may be used individually or in combination of two or more thereof.

When the combination of (a) a carbonate ion and a hydrogen carbonate ion is adopted as the pH buffer agent, the total amount of the carbonate ion and hydrogen carbonate ion is preferably from 0.05 to 5 mole/l, more preferably from 0.1 to 2 mole/l, particularly preferably from 0.2 to 1 mole/l, in the developer.

The developer for use in the simple development may contain an organic solvent. As the organic solvent to be contained, for example, an aliphatic hydrocarbon (e.g., hexane, heptane, Isopar E, Isopar H, Isopar G (produced by Esso Chemical Co., Ltd.), gasoline or kerosene), an aromatic hydrocarbon (e.g., toluene or xylene), a halogenated hydrocarbon (methylene dichloride, ethylene dichloride, trichlene or monochlorobenzene) or a polar solvent is exemplified. Examples of the polar solvent include an alcohol (e.g., methanol, ethanol, propanol, isopropanol, 1-butanol, 1-pentanol, 1-hexanol, 1-heptanol, 1-octanol, 2-octanol, 2-ethyl-1-hexanol, 1-nonanol, 1-decanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, propylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine, N-phenyldiethanolamine, N-methyldiethanolamine, N-ethyldiethanolamine, 4-(2-hydroxyethyl)morpholine, N,N-dimethylacetamide or N-methylpyrrolidone). Two or more organic solvents may be used in combination.

Further, when the organic solvent is insoluble in water, it may be employed by being solubilized in water using a surfactant or the like. In the case where the developer contains an organic solvent, the concentration of the organic solvent is desirably less than 40% by weight in view of safety and inflammability.

The developer may contain a preservative, a chelating agent, a defoaming agent, an organic acid, an inorganic acid, an inorganic salt or the like in addition the components described above. Specifically, compounds described in Paragraph Nos. [0266] to [0270] of JP-A-2007-206217 are preferably used.

The developer described above can be used as a developer and a development replenisher for the exposed lithographic printing plate precursor and it is preferably applied to an automatic processor described hereinafter. In the case of conducting the development processing using an automatic processor, the processing solution becomes fatigued in accordance with the processing amount, and hence the processing ability may be restored using a replenisher or a fresh developer.

The development processing using the developer having pH from 2 to 11 according to the invention is preferably performed by an automatic processor equipped with a supplying means for the developer and a rubbing member. An automatic processor using a rotating brush roll as the rubbing member is particularly preferred. Further, the automatic processor is preferably provided with a means for removing the excess developer, for example, a squeeze roller or a drying means, for example, a hot air apparatus, subsequently to the development processing means.

Further, in the plate making process of preparing a lithographic printing plate from the lithographic printing plate precursor according to the invention, the lithographic printing plate precursor may be heated its entire surface before or during the exposure or between the exposure and the development, if desired. By the heating, the image-forming reaction in the image-recording layer is accelerated and advantages, for example, improvement in the sensitivity and printing durability and stabilization of the sensitivity are achieved. For the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise sometimes in that the unexposed area is also cured. On the other hand, the heating after the development can be performed using very strong conditions. Ordinarily, the heat treatment is carried out in a temperature range from 100 to 500° C. When the temperature is too low, a sufficient effect of strengthening the image may not be obtained, whereas when it is excessively high, problems of deterioration of the support and thermal decomposition of the image area may occur sometimes.

The lithographic printing plate precursor according to the invention can also be subjected to the plate making by an on-press development method. The on-press development method includes a step in which the lithographic printing plate precursor is imagewise exposed and a printing step in which oily ink and an aqueous component are supplied to the exposed lithographic printing plate precursor without undergoing any development processing to perform printing, and it is characterized in that the unexposed area of the lithographic printing plate precursor is removed in the course of the printing step. The imagewise exposure may be performed on a printing machine after the lithographic printing plate precursor is mounted on the printing machine or may be separately performed using a platesetter or the like. In the latter case, the exposed lithographic printing plate precursor is mounted as it is on a printing machine without undergoing a development processing step. Then, the printing operation is initiated using the printing machine with supplying oily ink and an aqueous component and at an early stage of the printing the on-press development is carried out. Specifically, the image-recording layer in the unexposed area is removed and the hydrophilic surface of support is revealed therewith to form the non-image area. As the oily ink and aqueous component, printing ink and dampening water for conventional lithographic printing can be employed, respectively.

While either the dampening water or printing ink may be supplied at first on the surface of lithographic printing plate precursor, it is preferred to supply the printing ink at first in view of preventing the dampening water from contamination with the component of the image-recording layer removed.

Thus, the lithographic printing plate precursor according to the invention is subjected to the on-press development on an offset printing machine and used as it is for printing a large number of sheets.

EXAMPLES

The present invention will be described in more detail with reference to the following examples, but the invention should not be construed as being limited thereto. With respect to the polymer compounds used in the examples, unless otherwise particularly defined, a molecular weight means a weight average molecular weight (Mw) and a ratio of repeating units is indicated in mole percent.

[Synthesis Example of Star Polymer]

Synthesis of Star Polymer (P-1)

To 37.97 g of 1-methoxy-2-propanol heated at 70° C. under nitrogen stream was dropwise added a mixed solution composed of 51.65 g of vinyl acetate, 0.168 g of SA-3, 0.691 g of V-601 (produced by Wako Pure Chemical Industries, Ltd.) and 39.98 g of 1-methoxy-2-propanol over a period of 2 hours and 30 minutes. After the completion of the dropwise addition, the reaction mixture was continued to stir as it was for 2 hours, then a solution prepared by dissolving 0.069 g of V-601 in 0.876 g of 1-methoxy-2-propanol was added thereto, and the temperature was raised to 90° C., followed by continuing the reaction for 2 hours and 30 minutes. After the reaction, the reaction mixture was cooled to room temperature and diluted by adding 77.95 g of methanol. To the diluted solution was dropwise added with stirring 600 g of 0.5 M sodium hydroxide-methanol solution over a period of 3 hours. After the completion of the dropwise addition, the stirring was terminated, and the solution was allowed to stand at room temperature for a couple of nights to complete saponification. The solid deposited was collected by filtration and washed with methanol to obtain Star polymer (P-1) shown in Table 7 hereinbefore. The weight average molecular weight (Mw) of the polymer before the saponification measured by GPC was 40,000.

Synthesis of Star Polymer (P-25)

To 37.97 g of 1-methoxy-2-propanol heated at 70° C. under nitrogen stream was dropwise added a mixed solution composed of 51.65 g of methacrylic acid, 0.392 g of dipentaerythritolhexakis(3-mercaptopropionate), 0.691 g of V-601 (produced by Wako Pure Chemical Industries, Ltd.) and 39.98 g of 1-methoxy-2-propanol over a period of 2 hours and 30 minutes. After the completion of the dropwise addition, the reaction mixture was continued to stir as it was for 2 hours, then a solution prepared by dissolving 0.069 g of V-601 in 0.876 g of 1-methoxy-2-propanol was added thereto, and the temperature was raised to 90° C., followed by continuing the reaction for 2 hours and 30 minutes. After the reaction, the reaction mixture was cooled to 50° C. and diluted by adding 1-methoxy-2-propanol. The weight average molecular weight (Mw) of Star polymer (P-25) shown in Table 9 hereinbefore in the thus-obtained solution measured by GPC was 106,000 and the solid content concentration was 24.5% by weight.

Examples 1 to 6 and Comparative Example 1

I. Preparation of Lithographic Printing Plate Precursors (1) to (7)
(1) Preparation of Support 1

An aluminum plate (material: JIS A 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm$^3$) of pumice having a median size of 25 μm, followed by thorough washing with water. The plate was subjected to etching by immersing in a 25% by weight aqueous sodium hydroxide solution of 45° C. for 9 seconds, washed with water, then immersed in a 20% by weight aqueous nitric acid solution at 60° C. for 20 seconds, and washed with water. The etching amount of the grained surface was about 3 g/m$^2$.

Then, using an alternating current of 60 Hz, an electrochemical roughening treatment was continuously carried out on the plate. The electrolytic solution used was a 1% by weight aqueous nitric acid solution (containing 0.5% by weight of aluminum ion) and the temperature of electrolytic solution was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm$^2$ in terms of the peak value of the electric current and 5% of the electric current flowing from the electric source was divided to the auxiliary anode. The quantity of electricity in the nitric acid electrolysis was 175 C/dm$^2$ in terms of the quantity of electricity when the aluminum plate functioned as an anode. The plate was then washed with water by spraying.

The plate was further subjected to an electrochemical roughening treatment in the same manner as in the nitric acid electrolysis above using as an electrolytic solution, a 0.5% by weight aqueous hydrochloric acid solution (containing 0.5% by weight of aluminum ion) having temperature of 50° C. and under the condition that the quantity of electricity was 50 C/dm$^2$ in terms of the quantity of electricity when the aluminum plate functioned as an anode. The plate was then washed with water by spraying.

The plate was then subjected to an anodizing treatment using as an electrolytic solution, a 15% by weight aqueous sulfuric acid solution (containing 0.5% by weight of aluminum ion) at a current density of 15 A/dm$^2$ to form a direct current anodized film of 2.5 g/m$^2$, washed with water and dried to prepare Support 1.

The center line average roughness (Ra) of the support thus obtained was measured using a stylus having a diameter of 2 μm and found to be 0.51 μm.
(2) Formation of Undercoat Layer Coating solution (1) for undercoat layer shown below was coated on Support 1 by a bar and dried in an oven at 80° C. for 10 seconds to prepare a support having an undercoat layer having a dry coating amount of 10 mg/m$^2$.

| <Coating solution (1) for undercoat layer> | |
|---|---|
| Compound (1) for undercoating shown below | 0.017 g |
| Methanol | 9.00 g |
| Water | 1.00 g |

Compound (1) for undercoating

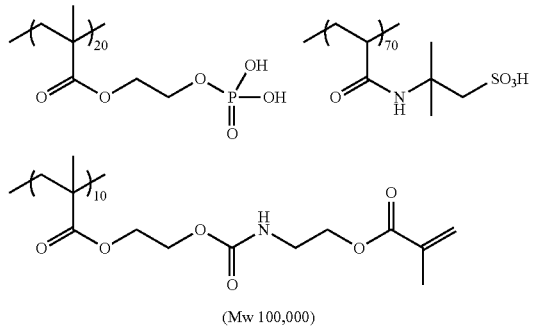

(Mw 100,000)

(3) Formation of Image-Recording Layer and Protective Layer

Coating solution (1) for image-recording layer having the composition shown below was coated on the support having an undercoat layer described above by a bar and dried in an oven at 70° C. for 60 seconds to form an image-recording layer having a dry coating amount of 1.1 g/m². Coating solution (1) for protective layer having the composition shown below was coated on the image-recording layer using a bar so as to have a dry coating amount of 0.75 g/m² and dried at 125° C. for 70 seconds to form Lithographic printing plate precursors (1) to (7), respectively.

| <Coating solution (1) for image-recording layer> | |
|---|---|
| Binder (1) shown below | 0.54 g |
| Polymerizable compound (1) shown below (PLEX 6661-0, produced by Degussa Japan Co., Ltd.) | 0.48 g |
| Sensitizing dye (1) shown below | 0.06 g |
| Polymerization initiator (1) shown below | 0.18 g |
| Co-sensitizer (1) shown below | 0.07 g |
| Dispersion of ε-phthalocyanine pigment (1) [pigment: 15 parts by weight; dispersing agent (allyl methacrylate/methacrylic acid (80/20) copolymer, Mw: 60,000): 10 parts by weight; solvent (cyclohexanone/methoxypropyl acetate/1-methoxy-2-propanol = 15 parts by weight/20 parts by weight/40 parts by weight)] | 0.40 g |
| Thermal polymerization inhibitor N-Nitrosophenylhydroxylamine aluminum salt | 0.01 g |
| Fluorine-based surfactant (1) shown below (Mw: 13,000) | 0.001 g |
| Polyoxyethylene-polyoxypropylene condensate (PLURONIC L44, produced by ADEKA Corp.) | 0.04 g |
| 1-Methoxy-2-propanol | 3.5 g |
| Methyl ethyl ketone | 8.0 g |

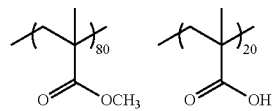

Binder (1)

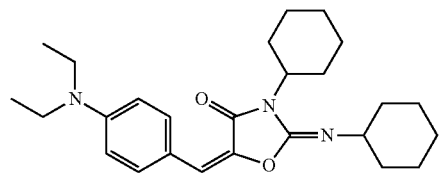

Sensitizing dye (1)

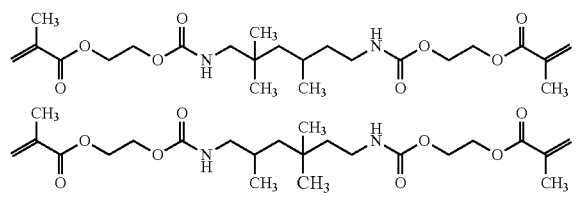

Mixture of the isomers described above

Polymerizable compound (1)

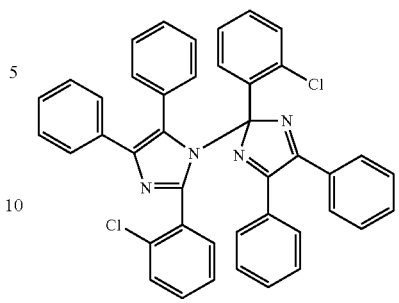

Polymerization indicator (1)

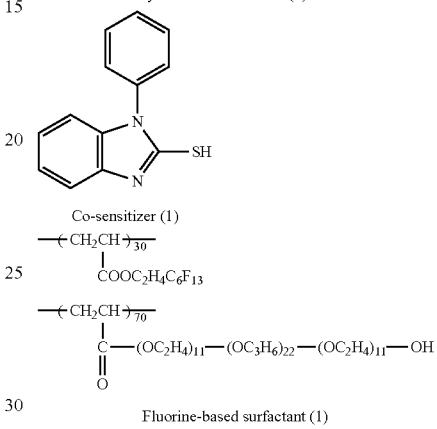

Co-sensitizer (1)

Fluorine-based surfactant (1)

| <Coating solution (1) for protective layer> | |
|---|---|
| Dispersion of mica (1) shown below | 13.0 g |
| Star polymer shown in Table 12 | 1.3 g |
| Sodium 2-ethylhexylsulfosuccinate | 0.2 g |
| Vinyl pyrrolidone/vinyl acetate (1/1) copolymer (Mw: 70,000) | 0.05 g |
| Surfactant (EMALEX 710, produced by Nihon-Emulsion Co., Ltd.) | 0.05 g |
| Water | 133 g |

(Preparation of Dispersion of Mica (1))

To 368 g of water was added 32 g of synthetic mica (SOMASIF ME-100, produced by CO-OP Chemical Co., Ltd., aspect ratio: 1,000 or more) and the mixture was dispersed using a homogenizer until an average particle size (according to a laser scattering method) became 0.5 μm to prepare Dispersion of mica (1).

II. Evaluation of Lithographic Printing Plate Precursor

<Conditions of Exposure and Development>

(1) Condition of Preparing Standard Lithographic Printing Plate

Each of Lithographic printing plate precursors (1) to (7) was subjected to imagewise exposure using a semiconductor laser of 405 nm having output of 100 mW in an exposure amount of 300 μJ/cm².

Figure 2:
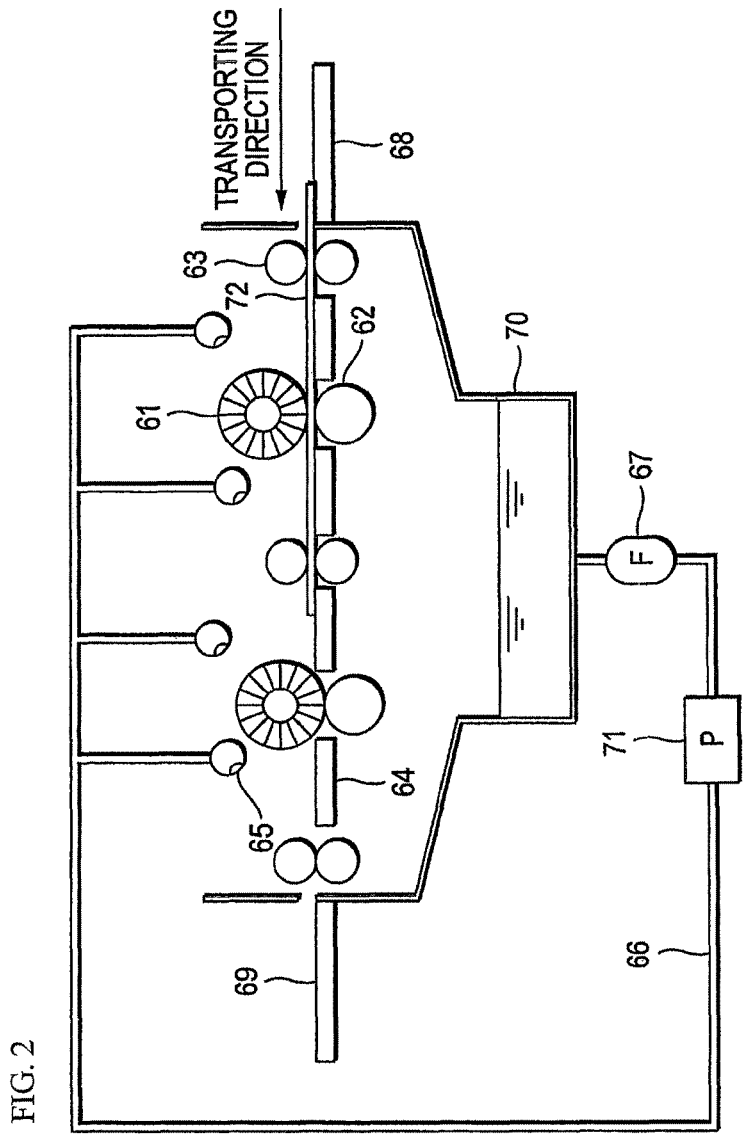
FIG. 2 is a view explaining a structure of an automatic development processor (A).

Then, the exposed lithographic printing plate precursor was subjected to development processing in Automatic development processor (A) having a structure shown in FIG. 2 using Developer (1) having the composition shown below. Automatic development processor (A) was an automatic processor having two rotating brush rollers. The first brush roller was a brush roller having an outer diameter of 90 mm and being implanted with fiber of polybutylene terephthalate (bristle diameter: 200 μm, bristle length: 17 mm), and the brush roller was rotated at 200 rpm (peripheral velocity at the tip of brush: 0.94 m/sec) in the same direction as the transporting direction of the lithographic printing plate precursor. The second brush roller was a brush roller having an outer diameter of 60 mm and being implanted with fiber of polybutylene terephthalate (bristle diameter: 200 μm, bristle length: 17 mm), and the brush roller was rotated at 200 rpm (peripheral velocity at the tip of brush: 0.63 m/sec) in the opposite direction to the transporting direction of the lithographic printing plate precursor. The transportation of the lithographic printing plate precursor was conducted at a transporting speed of 100 cm/min.

The developer was supplied on the surface of the lithographic printing plate precursor by showering from a spray pipe using a circulation pump. The tank volume for the developer was 10 liters. Thus, Standard lithographic printing plates (1) to (7) were prepared.

(2) Condition of Preparing Post-Heated Lithographic Printing Plate

Each of Lithographic printing plate precursors (1) to (7) was subjected to imagewise exposure using a semiconductor laser of 405 nm having output of 100 mW in an exposure amount of 90 μJ/cm$^2$ and within 30 seconds the exposed lithographic printing plate precursor was put in an oven to heat the whole surface thereof by blowing hot air at 110° C. for 15 seconds. Then, within 30 seconds the lithographic printing plate precursor was subjected to the development processing in the same manner as in Condition of preparing standard lithographic printing plate to prepare Post-heated lithographic printing plates (1) to (7), respectively.

(3) Condition of Preparing Lithographic Printing Plate for Evaluating Sensitivity Each of Lithographic printing plate precursors (1) to (7) was subjected to the imagewise exposure using a semiconductor laser of 405 nm having output of 100 mW while changing the exposure amount. Then, the exposed lithographic printing plate precursor was subjected to the development processing in the same manner as in Condition of preparing standard lithographic printing plate to prepare Lithographic printing plates (1) to (7) for evaluating sensitivity, respectively.

(4) Condition of Preparing Lithographic Printing Plate for Evaluating Development Property Each of Lithographic printing plate precursors (1) to (7) was subjected to the imagewise exposure in the same manner as in Condition of preparing standard lithographic printing plate and then subjected to the development processing in the same manner as in Condition of preparing standard lithographic printing plate except for variously changing the transporting speed of the lithographic printing plate precursor to prepare lithographic printing plates (1) to (7) for evaluating development property.

| <Developer (1)> | |
| --- | --- |
| Water | 100.00 g |
| Benzyl alcohol | 1.00 g |
| Polyoxyethylene naphthyl ether (average number of oxyethylene: n = 13) | 1.00 g |
| Sodium salt of dioctylsulfosuccinate | 0.50 g |
| Gum arabic | 1.00 g |
| Ethylene glycol | 0.50 g |
| Ammonium primary phosphate | 0.05 g |
| Citric acid | 0.05 g |
| Sodium carbonate | 1.40 g |
| Sodium hydrogen carbonate | 0.59 g |

(pH of the developer was adjusted to 9.8 using phosphoric acid and sodium hydroxide)

<Condition of Printing>

The lithographic printing plate obtained was mounted on a printing machine (SOR-M, produced by Heidelberg) and printing was conducted at a printing speed of 6,000 sheets per hour using dampening water (EU-3 (etching solution, produced by FUJIFILM Corp.))/water/isopropyl alcohol=1/89/10 (by volume ratio)) and SPACE COLOR FUSION G (N) (produced by DIC Graphics Corp.).

(2) Evaluation

Using the lithographic printing plate precursor prepared, sensitivity, development property, processing property, stain resistance and printing durability were evaluated in the manner described below. The results obtained are shown in Table 12.

<Sensitivity>

Using each of Lithographic printing plates (1) to (7) for evaluating sensitivity, the printing of 100 sheets was conducted under the condition described above to confirm to obtain a printed material having no stain in the non-image area and the printing was continued further 500 sheets. On the 600th sheet of the printed material, the exposure amount (μJ/cm$^2$) in which unevenness was not observed in the ink density of the image area was determined to evaluate the sensitivity.

<Printing Durability>

Using the standard lithographic printing plate and post-heated lithographic printing plate, the printing was conducted under the condition described above and a number of printed materials obtained until the ink density (reflection density) on the printing paper decreased by 0.1 from that at the initiation of printing was determined to evaluate the printing durability.

<Development Property>

With each of Lithographic printing plates (1) to (7) for evaluating development property, cyan density of the non-image area was measured by a Macbeth densitometer. The transporting speed (cm/min) at which the cyan density of the non-image area became equivalent to the cyan density of the aluminum support was determined to evaluate the development property.

<Processing Property>

After the development processing of 2,000 m$^2$ of each lithographic printing plate precursor using the automatic development processor under Condition of preparing standard lithographic printing plate, the generation of scum adhered on the tank wall of the automatic development processor was observed and evaluated according to the criteria described below.

A: The generation of scum was not observed.

B: The generation of scum was observed, but it was in an acceptable level.

C: The generation of scum was severe.

<Stain Resistance>

Using the standard lithographic printing plate and post-heated lithographic printing plate, the printing of 500 sheets was conducted under the condition described above. On the 500th sheet of the printed material, ink satin generated in the non-image area was visually observed to evaluate the stain resistance on a 1 to 10 bases, 1 being a case where due to adhesion of ink the non-image area was almost stained and 10 being a case where the non-image area did not stained at all.

TABLE 12

Examples 1 to 6 and Comparative Example 1

| Lithographic Printing Plate Precursor | Star Polymer | Sensitivity | Printing Durability Standard (×10⁴) | Printing Durability Post-heated (×10⁴) | Development Property | Processing Property | Stain Resistance Standard | Stain Resistance Post-heated |
|---|---|---|---|---|---|---|---|---|
| Example 1 | (1) | P-1 | 290 | 4.0 | 9.0 | 105 | A | 10 | 10 |
| Example 2 | (2) | P-2 | 280 | 5.0 | 10 | 110 | A | 10 | 10 |
| Example 3 | (3) | P-3 | 280 | 5.0 | 10 | 110 | A | 10 | 10 |
| Example 4 | (4) | P-4 | 270 | 5.0 | 10 | 120 | A | 10 | 10 |
| Example 5 | (5) | P-5 | 270 | 5.0 | 10 | 120 | A | 10 | 10 |
| Example 6 | (6) | P-6 | 270 | 5.0 | 10 | 120 | A | 10 | 10 |
| Comparative Example 1 | (7) | Comparative Polymer C-1 | 300 | 3.0 | 7 | 100 | B | 10 | 10 |

Comparative Polymer C-1: PVA-105 (polyvinyl alcohol, produced by Kuraray Co., Ltd.)

Examples 7 to 11 and Comparative Examples 2 to 3

I. Preparation of Lithographic printing plate precursors (8) and (14)

(1) Preparation of Support 2

An aluminum plate of JIS A1050 having a thickness of 0.30 mm and a width of 1,030 mm was continuously subjected to surface treatment according to various processes (a) to (f) shown below. After each process and water washing, removal of liquid was conducted with a nip roller.

(a) Alkali etching treatment of the aluminum plate was conducted by spraying an aqueous solution having sodium hydroxide concentration of 26% by weight, aluminum ion concentration of 6.5% by weight and temperature of 70° C. to dissolve the aluminum plate in an amount of 5 g/m². Subsequently, the plate was washed with water.

(b) Desmut treatment of the aluminum plate was conducted by spraying an aqueous 1% by weight nitric acid solution (containing 0.5% by weight of aluminum ion) having temperature of 30° C. Subsequently, the plate was washed with water.

(c) Electrochemical surface roughening treatment of the aluminum plate was continuously conducted by applying 60 Hz alternating current voltage. The electrolytic solution used was an aqueous 1% by weight nitric acid solution (containing 0.5% by weight of aluminum ion and 0.007% by weight of ammonium ion) and the solution temperature was 30° C. The electrochemical surface roughening treatment was conducted using a trapezoidal rectangular wave alternating current where time (TP) for reaching the current to its peak from zero was 0.8 msec and a duty ratio was 1:1 as an alternating current source, and using a carbon electrode as a counter electrode. A ferrite was used as an auxiliary anode. The current density was 25 A/dm² at the peak current, and the electric quantity was 250 C/dm² in terms of the total electric quantity during the aluminum plate functioning as an anode. To the auxiliary anode, 5% of the current flowing from the electric source was divided. Subsequently, the plate was washed with water.

(d) Alkali etching treatment of the aluminum plate was conducted at 35° C. by spraying an aqueous solution having a sodium hydroxide concentration of 26% by weight and an aluminum ion concentration of 6.5% by weight to dissolve the aluminum plate in an amount of 0.2 g/m². Thus, the smut component mainly comprising aluminum hydroxide formed in the precedent process of electrochemical surface roughening treatment using alternating current was removed and an edge portion of the pit formed was dissolved to smoothen the edge portion. Subsequently, the plate was washed with water.

(e) Desmut treatment of the aluminum plate was conducted by spraying an aqueous 25% by weight sulfuric acid solution (containing 0.5% by weight of aluminum ion) having temperature of 60° C. Subsequently, the plate was washed with water by spraying.

(f) Anodizing treatment of the aluminum plate was conducted in an aqueous solution having sulfuric acid concentration of 170 g/liter (containing 0.5% by weight of aluminum ion) at temperature of 33° C. and an electric density of 5 A/dm² for 50 seconds. Subsequently, the plate was washed with water. The amount of the anodic oxide film was 2.7 g/m².

The surface roughness (Ra) of Support 2 thus-obtained was 0.27 (measuring instrument: SURFCOM having a stylus with a tip diameter of 2 μm, produced by Tokyo Seimitsu Co. Ltd.,).

(2) Formation of Undercoat Layer

Coating solution (2) for undercoat layer shown below was coated on Support 2 by a wire bar and dried at 90° C. for 30 seconds. The coating amount of the undercoat layer was 10 mg/m².

| <Coating solution (2) for undercoat layer> | |
|---|---|
| Polymer compound A having the following structure | 0.05 g |
| Methanol | 27 g |
| Ion-exchanged water | 3 g |

Polymer compound A

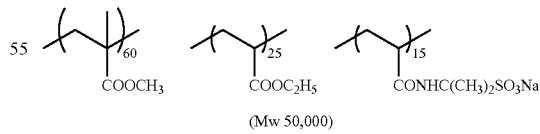

(Mw 50,000)

(3) Formation of Image-Recording Layer

Coating solution (2) for image-recording layer shown below was prepared and coated on the support having an undercoat layer described above by a wire bar. Drying was conducted in a hot air drying apparatus at 115° C. for 34 seconds to form an image-recording layer. The coverage of the image-recording layer after drying was 1.4 g/m².

<Coating solution (2) for image-recording layer>

| | |
|---|---|
| Phosphonium compound (A-6) | 0.077 g |
| Infrared absorbing agent (IR-1) | 0.074 g |
| Polymerization initiator (OS-12) | 0.280 g |
| Additive (PM-1) | 0.151 g |
| Polymerizable compound (AM-1) | 1.00 g |
| Binder (BT-1) (Mw: 80,000) | 1.00 g |
| Ethyl violet (C-1) | 0.04 g |
| Fluorine-based surfactant (MEGAFAC F-780-F, 30% by weight methyl isobutyl ketone (MIBK) solution, produced by DIC Corporation) | 0.015 g |
| Methyl ethyl ketone | 10.4 g |
| Methanol | 4.83 g |
| 1-Methoxy-2-propanol | 10.4 g |

The structure of Phosphonium compound (A-6), Polymerization initiator (OS-12), Infrared absorbing agent (IR-1), Additive (PM-1), Polymerizable compound (AM-1), Binder (BT-1) and Ethyl violet (C-1) are shown below.

[A-6]

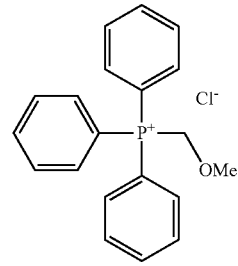

[OS-12]

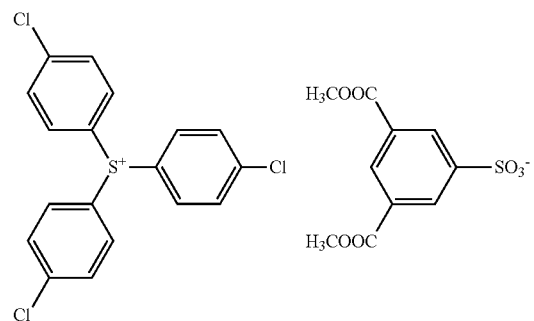 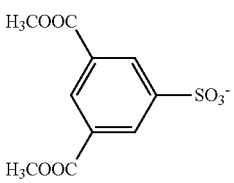

[IR-1]

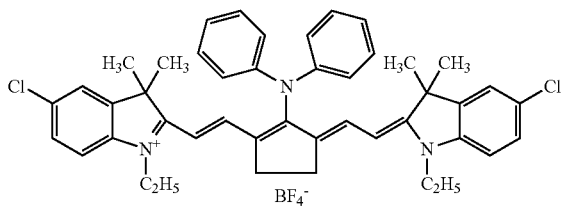

[PM-1]

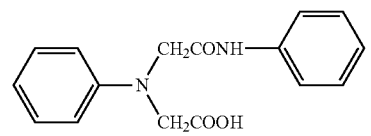

[AM-1]

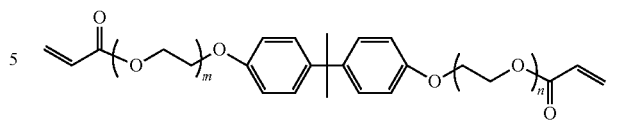

$m + n \approx 4$

[C-1]

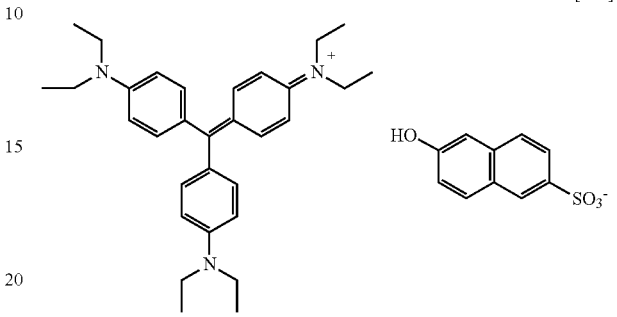 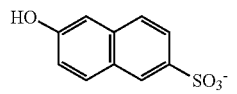

[BT-1]

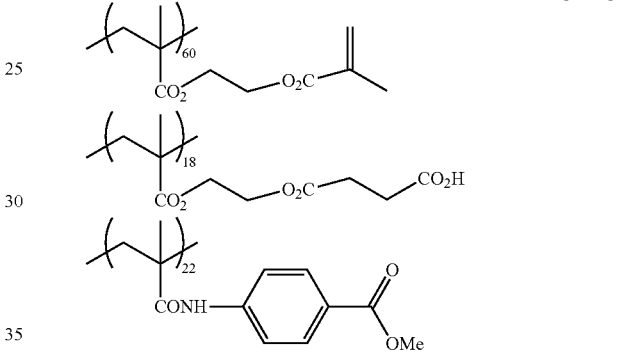

(4) Formation of Protective Layer

An aqueous mixed solution (Coating solution (2) for protective layer) comprising synthetic mica (SOMASIF ME-100, 8% by weight aqueous dispersion, produced by CO-OP Chemical Co., Ltd.), the star polymer or comparative polymer shown in Table 13 and a surfactant (EMALEX 710, produced by Nihon-Emulsion Co., Ltd.) was coated on the surface of image-recording layer described above by a wire bar and dried in a hot air drying apparatus at 125° C. for 75 seconds.

The content ratio of mica (solid content)/star polymer or comparative polymer/surfactant in Coating solution (2) for protective layer was 16/82/2 (% by weight), and the coating amount (coverage after drying) of the protective layer was 1.6 g/m². Thus, Lithographic printing plate precursors (8) and (14) were prepared.

II. Evaluation of Lithographic Printing Plate Precursor

The lithographic printing plate precursor obtained was exposed by TRENDSETTER 800II QUANTUM (produced by Creo Co.) at resolution of 2,400 dpi and a rotational number of an external drum of 200 rpm while changing output in a range from 0 to 8 W at intervals of log E of 0.15. The exposure was conducted under conditions of 25° C. and 50% RH. After the exposure, without conducting heat treatment and water washing treatment, the exposed lithographic printing plate precursor was subjected to development processing using an automatic developing machine (LP-1310HII, produced by FUJIFILM Corp.) at a transporting speed (line speed) of 2 m/min and at development temperature of 30° C. The developer used was a solution prepared by diluting DH-N (produced by FUJIFILM Corp.) with water in a ratio of 1:4. The development replenisher used was a solution prepared by diluting FCT-421 (produced by FUJIFILM Corp.) with water in a ratio of 1:1.4. The finisher used was a solution prepared by diluting GN-2K (produced by FUJiFILM Corp.) with water in a ratio of 1:1.

<Sensitivity>

Using the lithographic printing plate obtained under the plate making condition described above, the printing was conducted in the same manner as in Example 1 and on the 600th sheet of the printed material, the exposure amount (mJ/cm$^2$) in which unevenness was not observed in the ink density of the image area was determined to evaluate the sensitivity.

<Printing Durability>

With the lithographic printing plate obtained by the exposure with the output of 8 W and plate making as described above, the printing durability was evaluated in the same manner as in Example 1.

<Development Property, Processing property and Stain Resistance>

With the lithographic printing plate obtained by the exposure with the output of 8 W and plate making same as in the evaluation of printing durability above, the development property, processing property and stain resistance were evaluated in the same manner as in Example 1.

minum plate was subjected to an anodizing treatment under condition of current density of 10 A/dm$^2$ and voltage of 15 V in an aqueous 15% by weight sulfuric acid solution at 25° C. for one minute and then subjected to a hydrophilizing treatment using an aqueous 1% by weight polyvinylphosphonic acid solution at 75° C. to prepare Support 3. The surface roughness of the support was measured and found to be 0.44 μm (Ra indication according to JIS B 0601).

(2) Formation of Image-Recording Layer

Coating solution (3) for image-recording layer having the composition shown below was coated on Support 3 described above using a bar and dried in an oven at 90° C. for 60 seconds to form an image-recording layer having a dry coating amount of 1.3 g/m$^2$.

| <Coating solution (3) for image-recording layer> | |
|---|---|
| Binder (2) shown below | 0.04 g |
| Binder (3) shown below | 0.30 g |
| Polymerizable compound (1) shown above | 0.17 g |
| Polymerizable compound (2) shown below | 0.51 g |
| Sensitizing dye (2) shown below | 0.03 g |
| Sensitizing dye (3) shown below | 0.015 g |
| Sensitizing dye (4) shown below | 0.015 g |
| Polymerization initiator (1) shown above | 0.13 g |
| Chain transfer agent | 0.01 g |
| Mercaptobenzothiazole | |

TABLE 13

Examples 7 to 11 and Comparative Examples 2 and 3

| | Lithographic Printing Plate Precursor | Star Polymer | Sensitivity | Printing Durability Standard (×10$^4$) | Post-heated (×10$^4$) | Development Property | Processing Property | Stain Resistance Standard | Post-heated |
|---|---|---|---|---|---|---|---|---|---|
| Example 7 | (8) | P-4 | 100 | 2.5 | | 180 | A | 10 | |
| Example 8 | (9) | P-7 | 100 | 2.5 | | 170 | A | 10 | |
| Example 9 | (10) | P-8 | 100 | 2.5 | | 150 | A | 10 | |
| Example 10 | (11) | P-9 | 105 | 2.3 | | 150 | A | 10 | |
| Example 11 | (12) | P-10 | 105 | 2.3 | | 150 | A | 10 | |
| Comparative Example 2 | (13) | Comparative Polymer C-1 | 110 | 1.5 | | 200 | B | 10 | |
| Comparative Example 3 | (14) | Comparative Polymer C-2 | 115 | 1.4 | | 200 | B | 10 | |

Comparative Polymer C-2: PVA-205 (polyvinyl alcohol, produced by Kuraray Co., Ltd.)

Example 12 and 13 and Comparative Example 4 and 5

I. Preparation of Lithographic printing plate precursors (15) to (18)

(1) Preparation of Support 3

An aluminum plate (material: JIS A 1050, refining: H16) having a thickness of 0.24 mm was immersed in an aqueous 5% by weight sodium hydroxide solution maintained at 65° C. to conduct a degreasing treatment for one minute, followed by washed with water. The degreased aluminum plate was immersed in an aqueous 10% by weight hydrochloric acid solution maintained at 25° C. for one minute to neutralize, followed by washed with water. Subsequently, the aluminum plate was subjected to an electrolytic surface-roughening treatment with alternating current under condition of current density of 100 A/dm$^2$ in an aqueous 0.3% by weight hydrochloric acid solution at 25° C. for 60 seconds and then subjected to a desmut treatment in an aqueous 5% by weight sodium hydroxide solution maintained at 60° C. for 10 seconds. The surface-roughened and desmuted alu-

| -continued | |
|---|---|
| Dispersion (1) of e-phthalocyanine pigment shown above | 0.40 g |
| Thermal polymerization inhibitor | 0.01 g |
| N-Nitrosophenylhydroxylamine aluminum salt | |
| Fluorine-based surfactant (1) shown above | 0.001 g |
| 1-Methoxy-2-propanol | 3.5 g |
| Methyl ethyl ketone | 8.0 g |

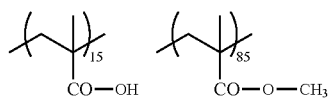

(acid value: 85 mg KOH/g)

Binder (2)

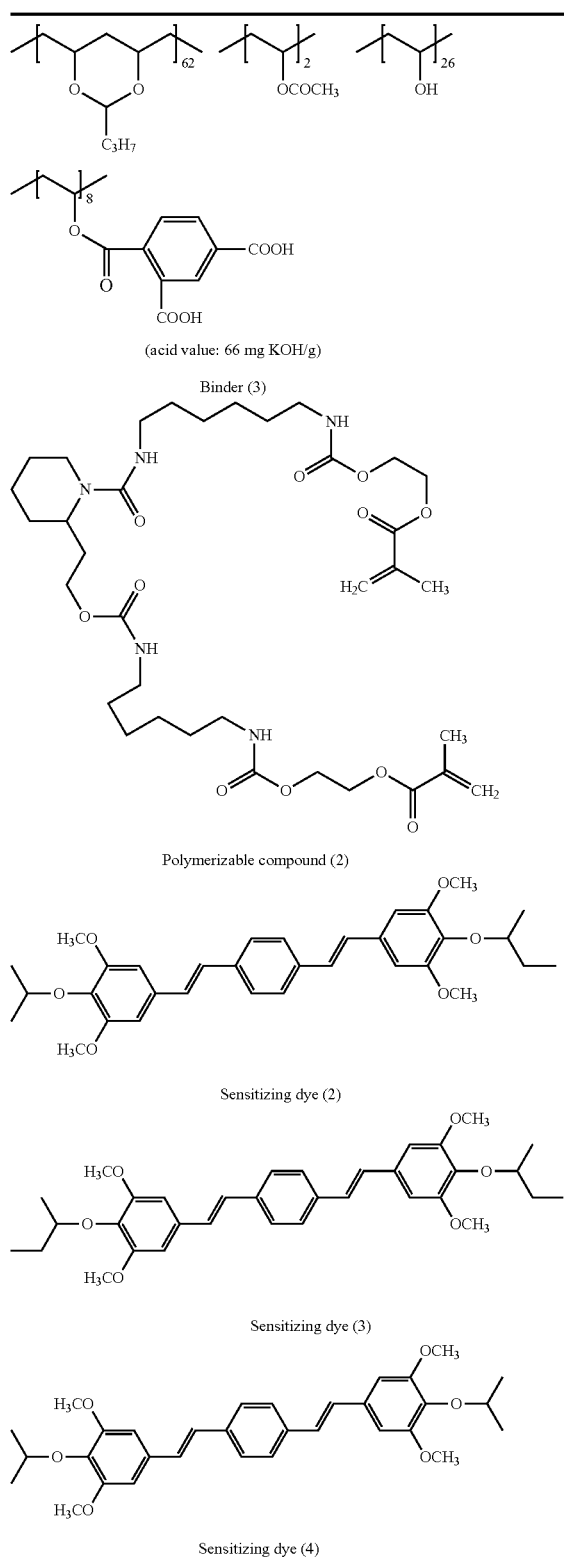

Binder (3) (acid value: 66 mg KOH/g)

Polymerizable compound (2)

Sensitizing dye (2)

Sensitizing dye (3)

Sensitizing dye (4)

(3) Formation of Protective Layer

Coating solution (3) for protective layer having the composition shown below was coated on the image-recording layer described above using a bar so as to have a dry coating amount of 1.2 g/m² and dried at 125° C. for 70 seconds to form a protective layer, thereby preparing Lithographic printing plate precursors (15) to (18), respectively.

| <Coating solution (3) for protective layer> | |
|---|---|
| Star polymer shown in Table 14 | 0.800 g |
| Vinyl pyrrolidone/vinyl acetate (1/1) copolymer (Mw: 70,000) | 0.001 g |
| Surfactant (EMALEX 710, produced by Nihon Emulsion Co., Ltd.) | 0.002 g |
| Water | 13 g |

(4) Exposure, Development and Printing

The lithographic printing plate precursor was subjected to image exposure by Violet semiconductor laser plate setter Vx9600 (equipped with InGaN semiconductor laser; emission: 405 nm±10 nm/output: 30 mW) produced by FUJIFILM Electronic Imaging, Ltd. The image drawing was conducted at a resolution of 2,438 dpi with halftone dots of 50% using an FM screen (TAFFETA 20, produced by FUJIFILM Corp.) under condition of a plate surface exposure amount of 0.05 mJ/cm².

Figure 3:
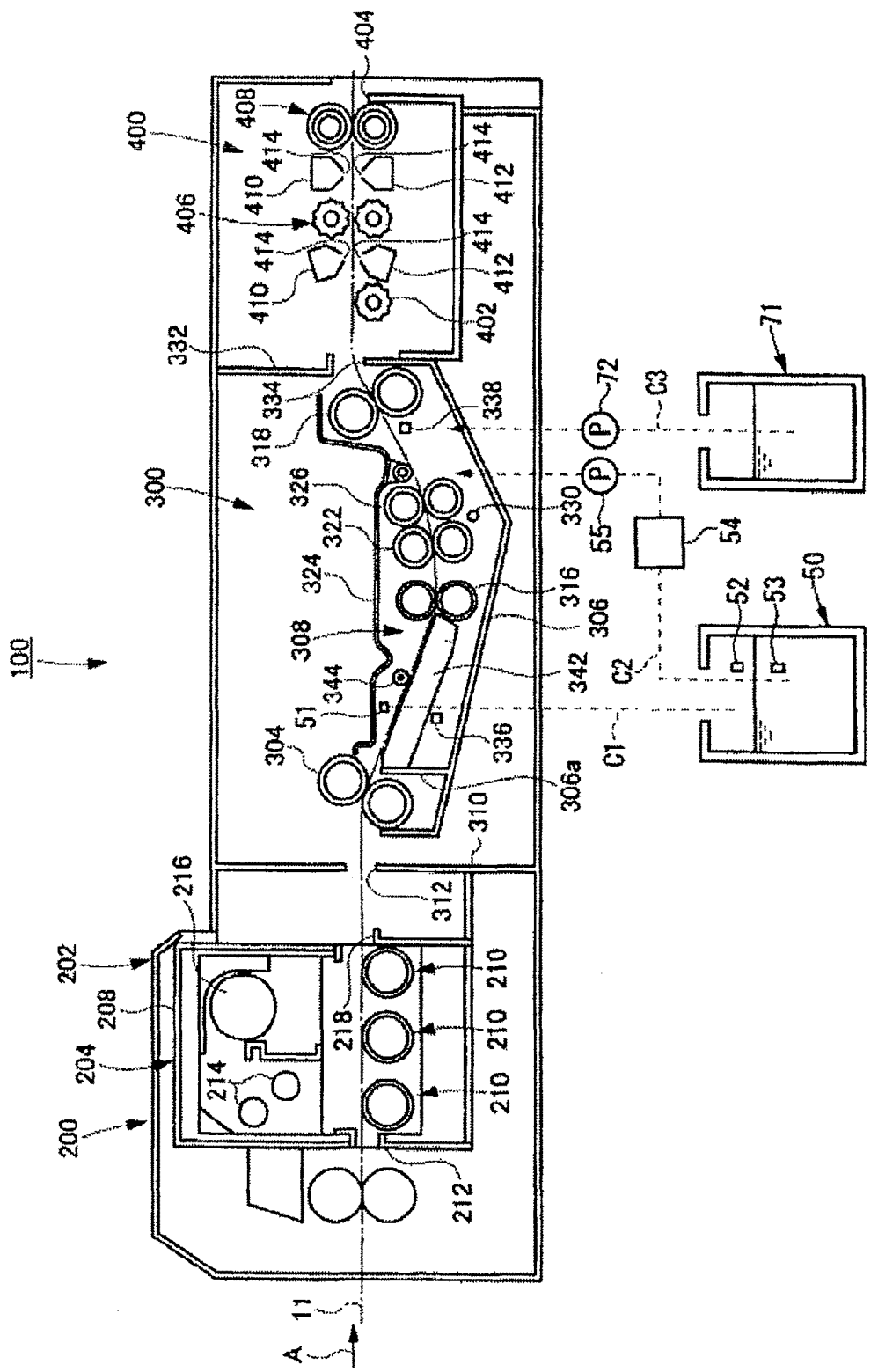
FIG. 3 is a view explaining a structure of an automatic development processor (B).

Then, the exposed lithographic printing plate precursor was subjected to development processing by Automatic development processor (B) having a structure shown in FIG. 3 using Developer (2) having the composition shown below at a transporting speed so as to regulate preheating time of 10 seconds at 100° C. and immersion time (developing time) of 20 seconds in the developer. Also, for the purpose of evaluating the development property, the development was conducted with variously changing the immersion time.

The lithographic printing plate thus-obtained was mounted on a printing machine (SOR-M, produced by Heidelberg) and printing was conducted at a printing speed of 6,000 sheets per hour using dampening water (EU-3 (etching solution, produced by FUJIFILM Corp.))/water/isopropyl alcohol=1/89/10 (by volume ratio)) and SPACE COLOR FUSION G (N) (produced by DIC Graphics Corp.).

| <Developer (2)> | |
|---|---|
| Water | 88.6 g |
| Nonionic surfactant (W-1) having structure shown below | 2.4 g |
| Nonionic surfactant (W-2) having structure shown below | 2.4 g |
| Nonionic surfactant (EMALEX 710, produced by Nihon Emulsion Co., Ltd.) | 1.0 g |
| Phenoxypropanol | 1.0 g |
| Octanol | 0.6 g |
| N-(2-Hydroxyethyl)morpholine | 1.0 g |
| Triethanolamine | 0.5 g |
| Sodium gluconate | 1.0 g |
| Trisodium citrate | 0.5 g |
| Tetrasodium ethylenediaminetetraacetate | 0.05 g |
| Polystyrenesulfonic acid (VERSA TL77 (30% solution) produced by Alco Chemical Inc.) | 1.0 g |
| (pH was adjusted to 7.0 by adding phosphoric acid) | |

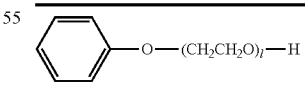

l = 13-28

(W-1)

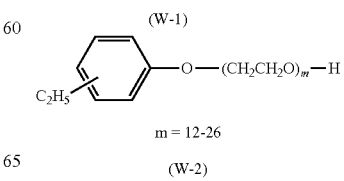

m = 12-26

(W-2)

II. Evaluation of Lithographic Printing Plate Precursor

<Sensitivity>

Using each of Lithographic printing plates obtained by changing the exposure amount on the surface of lithographic printing plate precursor, the printing of 100 sheets was conducted under the condition described above to confirm to obtain a printed material having no stain in the non-image area and the printing was continued further 500 sheets. On the 600th sheet of the printed material, the exposure amount ($\mu J/cm^2$) in which unevenness was not observed in the ink density of the image area was determined to evaluate the sensitivity.

<Development Property>

The lithographic printing plate precursor was subjected to the exposure and development processing in the same manner as described above. After the development processing, the non-image area of the lithographic printing plate was visually observed and the immersion time in developer at which the image-recording layer did not remain to achieve good development property was determined to evaluate the development property.

<Processing Property>

After the development processing of 500 $m^2$ of each lithographic printing plate precursor using the automatic development processor as described above, the generation of scum adhered on the tank wall of the automatic development processor was observed and evaluated according to the criteria described below.

A: The generation of scum was not observed.
B: The generation of scum was observed, but it was in an acceptable level.
C: The generation of scum was severe.

<Printing Durability>

As increase in the number of printed materials, the image of the image-recording layer formed on the lithographic printing plate was gradually abraded to cause decrease in the ink receptivity, resulting in decrease in ink density of the image on a printing paper. A number of printed materials obtained until the ink density (reflection density) decreased by 0.1 from that at the initiation of printing was determined to evaluate the printing durability.

roughness (Ra) of the support was measured using a stylus having a diameter of 2 μm and found to be 0.51 μm.

(2) Formation of Undercoat layer

Coating solution (3) for undercoat layer shown below was coated on Support 4 described above so as to have a dry coating amount of 20 $mg/m^2$ to prepare a support having an undercoat layer.

| <Coating solution (3) for undercoat layer> | |
|---|---|
| Compound (3) for undercoating having the following structure | 0.18 g |
| Hydroxyethyliminodiacetic acid | 0.10 g |
| Methanol | 55.24 g |
| Water | 6.15 g |

Compound (3) for undercoating:

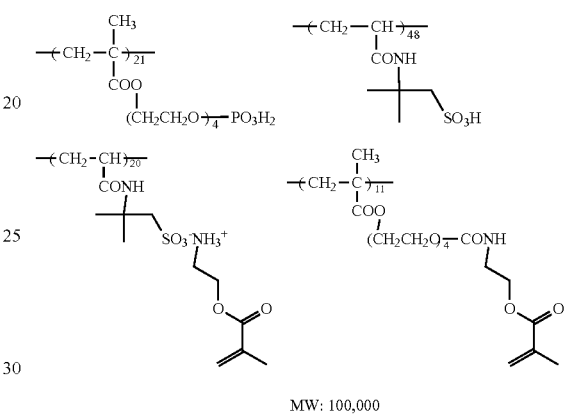

MW: 100,000

(3) Formation of Image-Recording Layer

Coating solution (4) for image-recording layer having the composition shown below was coated on the undercoat layer formed as described above by a bar and dried in an oven at 100° C. for 60 seconds to form an image-recording layer having a dry coating amount of 1.0 $g/m^2$.

TABLE 14

Examples 12 and 13 and Comparative Examples 4 and 5

| | Lithographic Printing Plate Precursor | Star Polymer | Sensitivity | Printing Durability | | Development Property | Processing Property | Stain Resistance | |
|---|---|---|---|---|---|---|---|---|---|
| | | | | Standard ($\times 10^4$) | Post-heated ($\times 10^4$) | | | Standard | Post-heated |
| Example 12 | (15) | P-4 | 100 | 9.0 | | 120 | A | 10 | |
| Example 13 | (16) | P-8 | 100 | 9.0 | | 130 | A | 10 | |
| Comparative Example 4 | (17) | Comparative Polymer C-1 | 110 | 7 | | 100 | B | 10 | |
| Comparative Example 5 | (18) | Comparative Polymer C-2 | 110 | 7 | | 100 | B | 10 | |

Examples 14 to 35 and Comparative Examples 6 to 7

I. Preparation of Lithographic Printing Plate Precursors (19) to (42)

(1) Preparation of Support 4

In order to ensure the hydrophilicity of the non-image area, Support 1 described above was subjected to silicate treatment using a 2.5% by weight aqueous sodium silicate No. 3 solution at 60° C. for 10 seconds and subsequently washed with water to obtain Support 4. The adhesion amount of Si was 10 $mg/m^2$. The center line average Coating solution (4) for image-recording layer was prepared by mixing Photosensitive solution (1) shown below with Microgel solution (1) shown below just before the coating, followed by stirring.

| <Photosensitive solution (1)> | |
|---|---|
| Binder (4) shown below | 0.240 g |
| Infrared absorbing dye (1) having structure shown above | 0.030 g |
| Radical polymerization initiator (2) having structure shown above | 0.162 g |

-continued

| <Photosensitive solution (1)> | |
|---|---|
| Radical polymerizable compound (Tris(acryloyloxyethyl) isocyanurate (NK ESTER A-9300, produced by Shin-Nakamura Chemical Co., Ltd.)) | 0.192 g |
| Hydrophilic low molecular weight compound (Tris(2-hydroxyethyl) isocyanurate) | 0.062 g |
| Hydrophilic low molecular weight compound (1) having structure shown below | 0.050 g |
| Oil-sensitizing agent (Phosphonium compound (1) having structure shown below) | 0.055 g |
| Oil-sensitizing agent (Benzyl dimethyl octyl ammonium $PF_6$ salt) | 0.018 g |
| Oil-sensitizing agent (Ammonium group-containing polymer having structure shown below (reduced specific viscosity: 44 ml/g) | 0.035 g |
| Fluorine-based surfactant (1) described above | 0.008 g |
| Methyl ethyl ketone | 1.091 g |
| 1-Methoxy-2-propanol | 8.609 g |

| <Microgel solution (1)> | |
|---|---|
| Microgel (1) shown below | 2.640 g |
| Distilled water | 2.425 g |

The structures of Binder (4), Infrared absorbing dye (1), Radical polymerization initiator (2), Phosphonium compound (1), Hydrophilic low molecular weight compound (1) and Oil-sensitizing agent (ammonium group-containing polymer) are shown below.

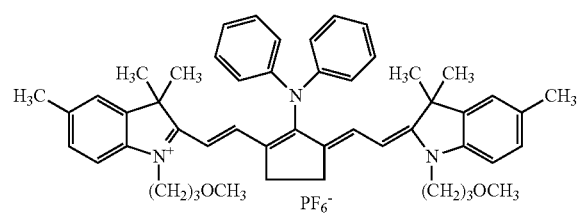

Infrared absorbing agent (1)

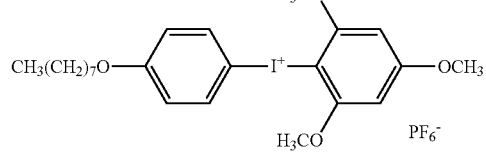

Radical polymerization initiator (2)

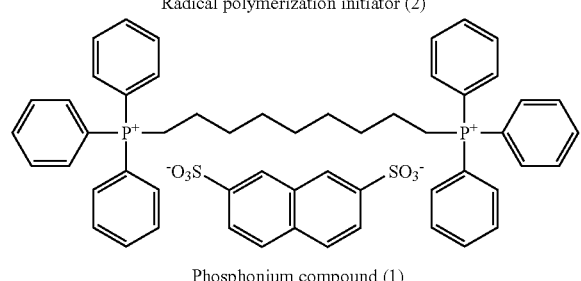

Phosphonium compound (1)

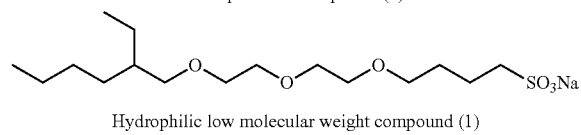

Hydrophilic low molecular weight compound (1)

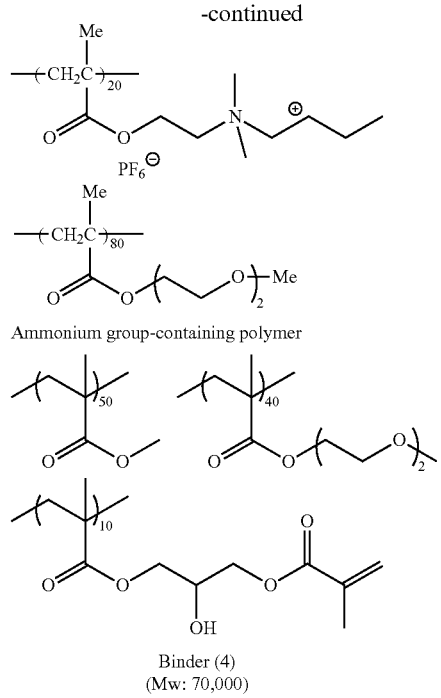

Ammonium group-containing polymer

Binder (4)
(Mw: 70,000)

<Preparation of Microgel (1)>

An oil phase component was prepared by dissolving 10 g of adduct of trimethylol propane and xylene diisocyanate (TAKENATE D-110N, produced by Mitsui Chemicals, Inc.), 3.15 g of pentaerythritol triacrylate (SR444, produced by Nippon Kayaku Co., Ltd.) and 0.1 g of PIONIN A-41C (produced by Takemoto Oil & Fat Co., Ltd.) in 17 g of ethyl acetate. As an aqueous phase component, 40 g of a 4% by weight aqueous solution of polyvinyl alcohol (PVA-205, produced by Kuraray Co., Ltd.) was prepared. The oil phase component and the aqueous phase component were mixed and emulsified using a homogenizer at 12,000 rpm for 10 minutes. The resulting emulsion was added to 25 g of distilled water and stirred at room temperature for 30 minutes and then at 50° C. for 3 hours. The microgel liquid thus-obtained was diluted using distilled water so as to have the solid content concentration of 15% by weight to prepare Microgel (1). The average particle size of the microgel was measured by a light scattering method and found to be 0.2 μm.

(4) Formation of Protective Layer

Coating solution (4) for protective layer having the composition shown below was coated on the image-recording layer described above by a bar and dried in an oven at 120° C. for 60 seconds to form a protective layer having a dry coating amount of 0.15 g/m², thereby preparing Lithographic printing plate precursors (19) to (72), respectively.

| <Coating solution (4) for protective layer> | |
|---|---|
| Dispersion of inorganic stratiform compound (1) shown below | 1.5 g |
| Star polymer shown in Table 15 (Aqueous 8% by weight solution) | 0.58 g |

-continued

<Coating solution (4) for protective layer>

| | |
|---|---|
| Aqueous 1% by weight solution of surfactant (EMALEX 710, produced by Nihon Emulsion Co., Ltd.) | 0.86 g |
| Ion-exchanged water | 6.0 g |

<Preparation of Dispersion of Inorganic Stratiform Compound (1)>

To 193.6 g of ion-exchanged water was added 6.4 g of synthetic mica (SOMASIF ME-100, produced by CO-OP Chemical Co., Ltd.) and the mixture was dispersed using a homogenizer until an average particle size (according to a laser scattering method) became 3 μm to prepare Dispersion of inorganic stratiform compound (1). The aspect ratio of the inorganic particle thus-dispersed was 100 or more.

II. Evaluation of Lithographic Printing Plate Precursor

<On-Press Development Property>

The lithographic printing plate precursor thus-obtained was exposed by LUXEL PLATESETTER T-6000III equipped with an infrared semiconductor laser produced by FUJIFILM Corp. under the conditions of a rotational number of an external drum of 1,000 rpm, laser output of 70% and resolution of 2,400 dpi. The exposed image contained a solid image and a 50% halftone dot chart of a 20 μm-dot FM screen.

The exposed lithographic printing plate precursor was mounted without undergoing development processing on a plate cylinder of a printing machine (LITHRONE 26, produced by Komori Corp.). Using dampening water (ECOLITY-2 (produced by FUJIFILM Corp.)/tap water=2/98 (volume ratio)) and SPACE COLOR FUSION G (N) (produced by DIC Graphics Corp.), the dampening water and ink were supplied according to the standard automatic printing start method of LITHRONE 26 to conduct printing on 100 sheets of TOKUBISHI ART paper (76.5 kg) at a printing speed of 10,000 sheets per hour.

A number of the printing papers required until the on-press development of the unexposed area of the image-recording layer on the printing machine was completed to reach a state where the ink was not transferred to the printing paper in the non-image area was measured to evaluate the on-press development property. The results obtained are shown in Table 15.

<Printing Durability>

After performing the evaluation for the on-press development property described above, the printing was continued. As the increase in a number of printing papers, the image-recording layer was gradually abraded to cause decrease in the ink density on a printed material. A number of printed materials wherein a value obtained by measuring a halftone dot area rate of the 50% halftone dot of FM screen on the printed material using a Gretag densitometer decreased by 5% from the value measured on the 100th printed material of the printing was determined to evaluate the printing durability. The results obtained are shown in Table 15.

TABLE 15

Examples 14 to 35 and Comparative Examples 6 and 7

| | Lithographic Printing Plate Precursor | Star Polymer | | | On-press Development Property | Printing Durability ($\times 10^4$) |
|---|---|---|---|---|---|---|
| | | a | b | a/b | | |
| Example 14 | (19) | Comparative Polymer C-3 | P-9 | 95/5 | 12 | 5.1 |
| Example 15 | (20) | P-11 | Comparative Polymer C-4 | 95/5 | 10 | 5.5 |
| Example 16 | (21) | P-11 | P-9 | 95/5 | 7 | 5.6 |
| Example 17 | (22) | P-13 | P-9 | 95/5 | 8 | 5.6 |
| Example 18 | (23) | P-14 | P-9 | 95/5 | 8 | 5.8 |
| Example 19 | (24) | P-15 | P-9 | 95/5 | 8 | 5.8 |
| Example 20 | (25) | P-16 | P-9 | 95/5 | 9 | 5.6 |
| Example 21 | (26) | P-17 | P-9 | 95/5 | 9 | 5.6 |
| Example 22 | (27) | P-20 | P-9 | 95/5 | 8 | 5.6 |
| Example 23 | (28) | P-23 | P-9 | 95/5 | 8 | 5.6 |
| Example 24 | (29) | P-31 | | | 8 | 5.6 |
| Example 25 | (30) | P-32 | | | 9 | 5.5 |
| Example 26 | (31) | P-33 | | | 10 | 5.3 |
| Example 27 | (32) | P-34 | | | 11 | 5.3 |
| Example 28 | (33) | P-35 | | | 9 | 5.5 |
| Example 29 | (34) | P-36 | | | 11 | 5.3 |
| Example 30 | (35) | P-37 | | | 9 | 5.5 |
| Example 31 | (36) | P-38 | | | 8 | 5.6 |
| Example 32 | (37) | P-39 | | | 8 | 5.6 |
| Example 33 | (38) | P-40 | | | 8 | 5.6 |
| Example 34 | (39) | P-41 | | | 8 | 5.6 |
| Example 35 | (40) | P-42 | | | 8 | 5.6 |
| Comparative Example 6 | (41) | Comparative Polymer C-3 | Comparative Polymer C-4 | 95/5 | 14 | 5.0 |

TABLE 15-continued

Examples 14 to 35 and Comparative Examples 6 and 7

| | Lithographic Printing Plate Precursor | Star Polymer a | b | a/b | On-press Development Property | Printing Durability (×10⁴) |
|---|---|---|---|---|---|---|
| Comparative Example 7 | (42) | Comparative Polymer C-5 | | | 16 | 5.0 |

Comparative Polymer C-3: Polyvinyl alcohol (CKS 50, sulfonic acid-modified, saponification degree: 99% by mole or more, polymerization degree: 300, produced by Nippon Synthetic Chemical Industry Co., Ltd.)
Comparative Polymer C-4: Polyvinyl alcohol (PVA-405, saponification degree: 81.5% by mole, polymerization degree: 500, produced by Kuraray Co., Ltd.)
Comparative Polymer C-5: Poly(acrylamide-co-tert-butyl acrylate) (molar ratio = 80/20, Mw = 18,000)
In Table 15, a/b indicates a weight ratio.

Examples 36 to 51 and Comparative Example 8

I. Preparation of Lithographic Printing Plate Precursors (43) and (59)

Coating solution (5) for image-recording layer shown below was applied to an aluminum substrate subjected to brush graining, anodizing with phosphoric acid and after treatment with polyacrylic acid (PAA) using a wire wound rod and dried in a Ranar conveyor oven set at 90° C. for about 90 seconds. The dry coating amount of the image-recording layer obtained was 1.5 g/m².

| <Coating solution (5) for image-recording layer> | |
|---|---|
| Urethane acrylate | 2.48 g |
| Copolymer 1 | 13.53 g |
| Copolymer 2 | 3.97 g |
| Infrared absorbing dye (2) having structure shown below | 0.13 g |
| Polymerization initiator (IRGACURE 250, produced by Ciba Specialty Chemicals, Inc.) | 0.42 g |
| Mercapto-3-triazole | 0.18 g |
| BYK 336 (produced by BYK-Chemie GmbH) | 0.60 g |
| KLUCEL M (produced by Hercules Chemical Co., Inc.) | 3.31 g |
| n-Propanol | 61.97 g |
| Ion-exchanged water | 13.41 g |

The compounds in the coating solution for image-recording layer above are shown below.

*Urethane acrylate: 80% by weight 2-butanone solution of urethane acrylate obtained by a reaction of DESMODUR N100 with hydroxyethyl acrylate and pentaerythritol triacrylate

*Copolymer 1: A mixture of 54 g of n-propanol and 16 g of deionized water was set in a 250-ml flask and heated to 70° C. while purging with continuous nitrogen gas flow and stirring with a mechanical stirrer. A mixture of 54 g of n-propanol, 16 g of deionized water, 10 g of PEGMA, 4.5 g of styrene, 40.5 g of acrylonitrile and 0.32 g of VAZO-64 was prepared in a separate beaker and then added dropwise to the 250-ml flask over a period of 30 minutes. After 2.5 hours, 0.16 g of VAZO-64 was added to the reaction mixture. The polymerization reaction was further continued for 2 hours. The polymer solution thus-obtained contained 21% by weight (solid content) of Copolymer 1.

*Copolymer 2: In 1-liter four-necked flask was set 384.1 g of 2-butanone and 8.5 g of PEGMA under nitrogen atmosphere, followed by heating to 80° C. A pre-mixture of 38.0 g of allyl methacrylate and 0.3 g of VAZO-64 was added thereto at 80° C. over a period of 90 minutes. After the completion of the addition, 0.13 g of VAZO-64 was further added to the reaction mixture. Then, 0.13 g of VAZO-64 was further added twice. The polymer conversion rate based on nonvolatile component percent was more than 98%.

*PEGMA: Poly(ethylene glycol) methyl ether methacrylate as an aqueous 50% by weight solution, Mn 2080, available from Sigma-Aldrich Corp. (St. Louis, Mo.)

*VAZO-64: 2,2'-Azobisisobutyronitrile, available from E. I. du Pont de Nemours and Co. (Wilmington, Del.)

*Infrared absorbing dye (2): structure shown below

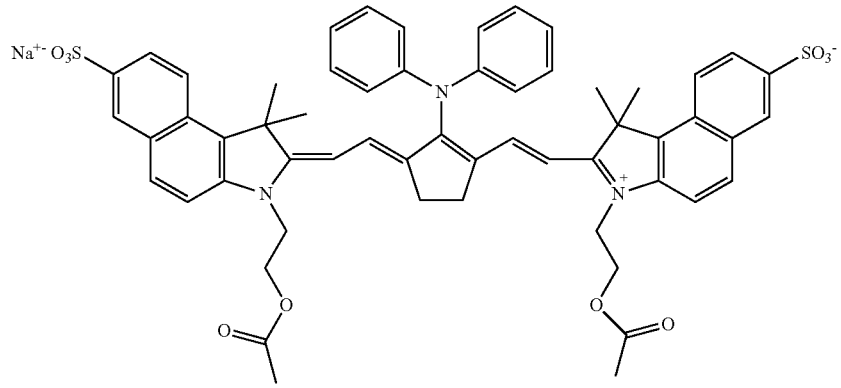

Infrared absorbing dye (2)

*IRGACURE 250: 75% by weight propylene carbonate solution of (4-Methylphenyl)[4-(2-methylpropyl)phenyl]iodonium hexafluorophosphate, available from Ciba Specialty Chemicals (Tarrytown, N.Y.)

*BYK 336: 25% by weight xylene/methoxypropyl acetate solution of modified dimethylpolysiloxane copolymer, available from Byk-Chemie USA Inc. (Wallingford, Conn.)
*KLUCEL M: 2% by weight aqueous solution of hydroxypropyl cellulose (viscosity: 5,000 mPa·s) available from Hercules Inc., Aqualon Division (Wilmington, Del.)

Coating solution (5) for protective layer having the composition shown below was coated on the image-recording layer described above by a bar and dried in an oven at 120° C. for 60 seconds to form a protective layer having a dry coating amount of 0.35 g/m², thereby preparing Lithographic printing plate precursors.

| <Coating solution (5) for protective layer> | |
|---|---|
| Dispersion of inorganic stratiform compound (1) shown above | 1.5 g |
| Star polymer shown in Table 16 (Aqueous 8% by weight solution) | 0.58 g |
| Aqueous 1% by weight solution of surfactant (EMALEX 710, produced by Nihon Emulsion Co., Ltd.) | 0.86 g |
| Ion-exchanged water | 6.0 g |

II. Evaluation of Lithographic Printing Plate Precursor

With the lithographic printing plate precursor thus-obtained, the on-press development property, printing durability and stain resistance were evaluated in the manner shown below. The results obtained are shown in Table 16.

<On-Press Development Property>

The lithographic printing plate precursor was subjected to exposure by TRENDSETTER 3244VX, produced by Creo Co., equipped with a water-cooled 40 W infrared semiconductor laser under the conditions of output of 9 W, a rotational number of an external drum of 210 rpm and resolution of 2,400 dpi. The exposed lithographic printing plate precursor was mounted without undergoing development processing on a plate cylinder of a printing machine (SOR-M, produced by Heidelberg). Using dampening water (a solution prepared by diluting CDS803 (produced by Tokyo Printing Ink Mfg. Co., Ltd.) 50 times with tap water) and SPACE COLOR FUSION G (N) (produced by DIC Graphics Corp.), after supplying the dampening water and ink printing was initiated at a printing speed of 6,000 sheets per hour.

A number of the printing papers required until the on-press development of the unexposed area of the image-recording layer on the printing machine was completed to reach a state where the ink was not transferred to the printing paper was measured to evaluate the on-press development property.

<Printing Durability>

After ink reception on the image-recording layer in the image area, the printing was further continued so that the image-recording layer was gradually abraded. With the progress of abrasion of the image-recording layer, the ink receptivity degraded to initiate decrease of ink density on printing paper. A number of printed materials obtained until the ink density (reflection density) decreased by 0.1 from that at the initiation of printing was determined to evaluate the printing durability.

TABLE 16

Examples 36 to 51 and Comparative Example 8

| | Lithographic Printing Plate Precursor | Star Polymer | | | On-press Development Property | Printing Durability ($\times 10^4$) |
|---|---|---|---|---|---|---|
| | | a | b | a/b | | |
| Example 36 | (43) | Comparative Polymer C-3 | P-9 | 95/5 | 20 | 3.1 |
| Example 37 | (44) | P-11 | Comparative Polymer C-4 | 95/5 | 17 | 3.3 |
| Example 38 | (45) | P-24 | | | 18 | 3.3 |
| Example 39 | (46) | P-25 | | | 16 | 3.5 |
| Example 40 | (47) | P-26 | | | 17 | 3.4 |
| Example 41 | (48) | P-27 | | | 16 | 3.5 |
| Example 42 | (49) | P-28 | | | 16 | 3.5 |
| Example 43 | (50) | P-29 | | | 16 | 3.5 |
| Example 44 | (51) | P-30 | | | 19 | 3.2 |
| Example 45 | (52) | P-45 | | | 17 | 3.5 |
| Example 46 | (53) | P-49 | | | 19 | 3.4 |
| Example 47 | (54) | P-51 | | | 16 | 3.3 |
| Example 48 | (55) | P-52 | | | 18 | 3.4 |
| Example 49 | (56) | P-53 | | | 19 | 3.5 |
| Example 50 | (57) | P-55 | | | 17 | 3.3 |
| Example 51 | (58) | P-56 | | | 17 | 3.4 |
| Comparative Example 8 | (59) | Comparative Polymer C-3 | Comparative Polymer C-4 | 95/5 | 22 | 3.0 |

What is claimed is:

1. A lithographic printing plate precursor comprising, in the following order: a support; an image-recording layer containing a radical polymerizable compound and a radical polymerization initiator; and a protective layer containing a star polymer;
   wherein the image-recording layer does not contain the star polymer.

2. The lithographic printing plate precursor as claimed in claim 1, wherein the star polymer is a polymer in which from 3 to 10 polymer chains are branched from a central skeleton.

3. The lithographic printing plate precursor as claimed in claim 1, wherein the star polymer is a polymer in which from 3 to 10 polymer chains are branched from a central skeleton via sulfide bonds respectively.

4. The lithographic printing plate precursor as claimed in claim 1, wherein the star polymer has a hydrophilic group in the polymer chain thereof.

5. The lithographic printing plate precursor as claimed in claim 1, wherein the protective layer contains an inorganic stratiform compound.

6. The lithographic printing plate precursor as claimed in claim 1, which is capable of printing after image exposure with a laser, by supplying at least one of printing ink and dampening water on a printing machine to remove an unexposed area of the image-recording layer.

7. The lithographic printing plate precursor as claimed in claim 1, which is capable of removing after image exposure with a laser, an unexposed area of the image-recording layer with a developer having pH from 2 to 14.

* * * * *